(12) United States Patent
Liu et al.

(10) Patent No.: US 11,837,631 B2
(45) Date of Patent: Dec. 5, 2023

(54) SOURCE/DRAIN SPACER WITH AIR GAP IN SEMICONDUCTOR DEVICES AND METHODS OF FABRICATING THE SAME

(71) Applicant: Taiwan Semiconductor Manufacturing Company, Ltd., Hsin-Chu (TW)

(72) Inventors: Ko-Cheng Liu, Hsinchu (TW); Ming-Lung Cheng, Kaohsiung County (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 21 days.

(21) Appl. No.: 17/226,896

(22) Filed: Apr. 9, 2021

(65) Prior Publication Data

US 2022/0328623 A1 Oct. 13, 2022

(51) Int. Cl.
*H01L 29/423* (2006.01)
*H01L 29/06* (2006.01)
*H01L 29/78* (2006.01)
*H01L 21/8234* (2006.01)
*H01L 29/66* (2006.01)

(52) U.S. Cl.
CPC .. *H01L 29/0653* (2013.01); *H01L 21/823418* (2013.01); *H01L 21/823431* (2013.01); *H01L 21/823481* (2013.01); *H01L 29/66795* (2013.01); *H01L 29/7851* (2013.01)

(58) Field of Classification Search
None
See application file for complete search history.

(56) References Cited

U.S. PATENT DOCUMENTS

2020/0091345 A1\* 3/2020 Chiu ................... H01L 29/7851
2020/0357920 A1\* 11/2020 Song ................. H01L 29/42364

\* cited by examiner

*Primary Examiner* — Joseph C. Nicely
*Assistant Examiner* — Lamont B Koo
(74) *Attorney, Agent, or Firm* — HAYNES AND BOONE, LLP

(57) ABSTRACT

A semiconductor structure includes a semiconductor fin protruding from a substrate, a dielectric fin disposed adjacent and substantially parallel to the semiconductor fin, an epitaxial source/drain (S/D) feature disposed in the semiconductor fin, a dielectric layer disposed between a sidewall of the epitaxial S/D feature and a sidewall of the dielectric fin, and an air gap disposed in the dielectric layer.

20 Claims, 53 Drawing Sheets

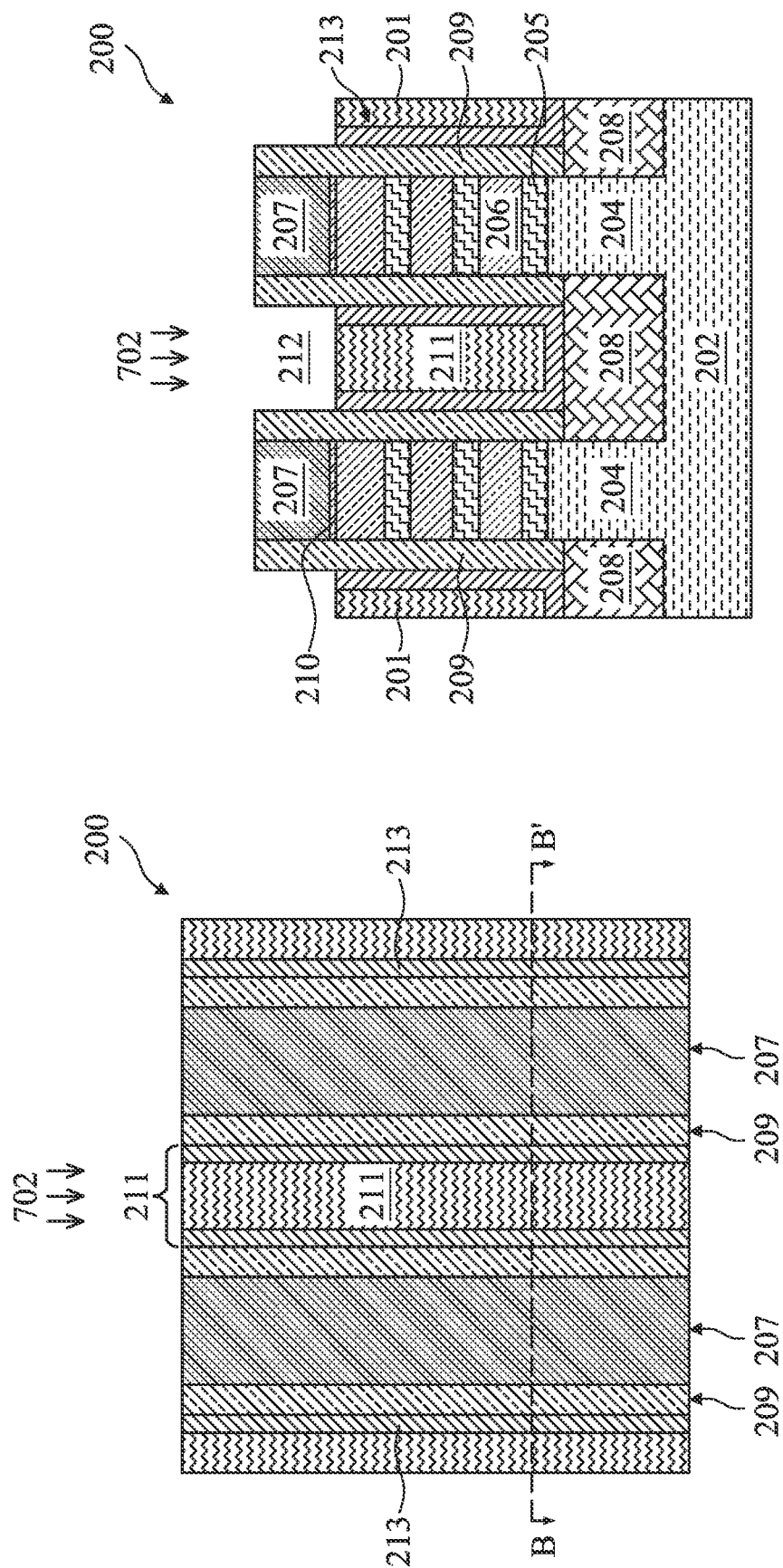

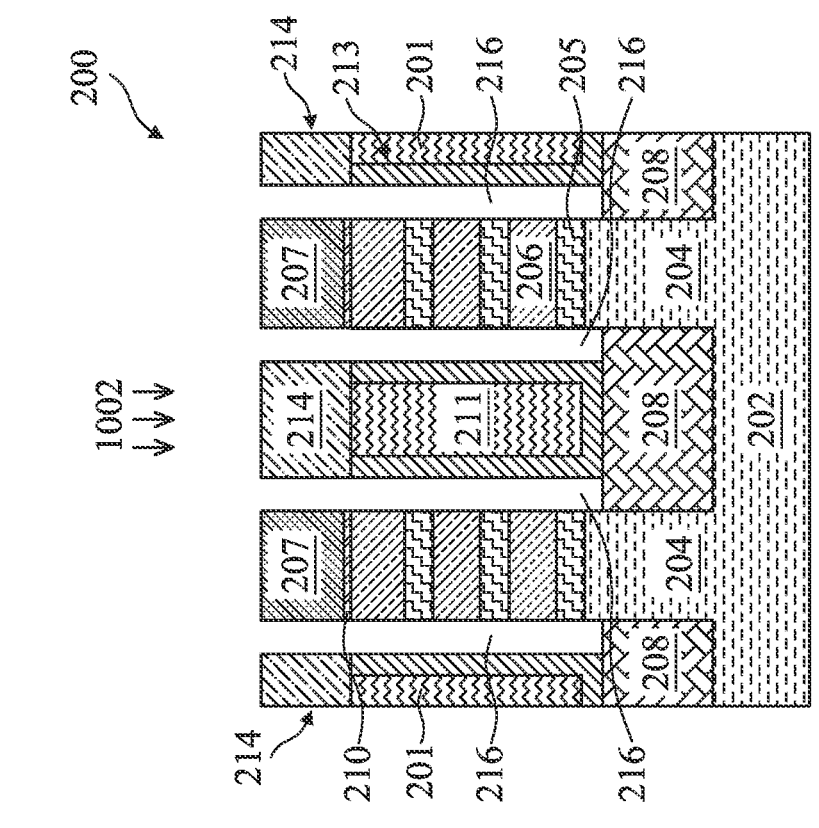
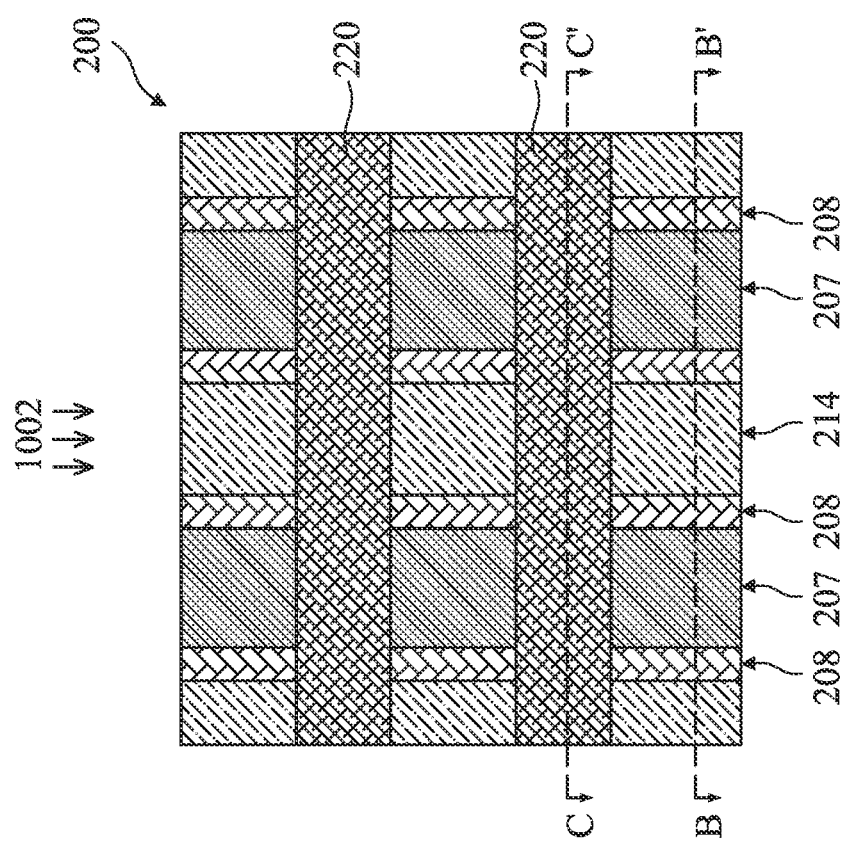
FIG. 10B
FIG. 10A

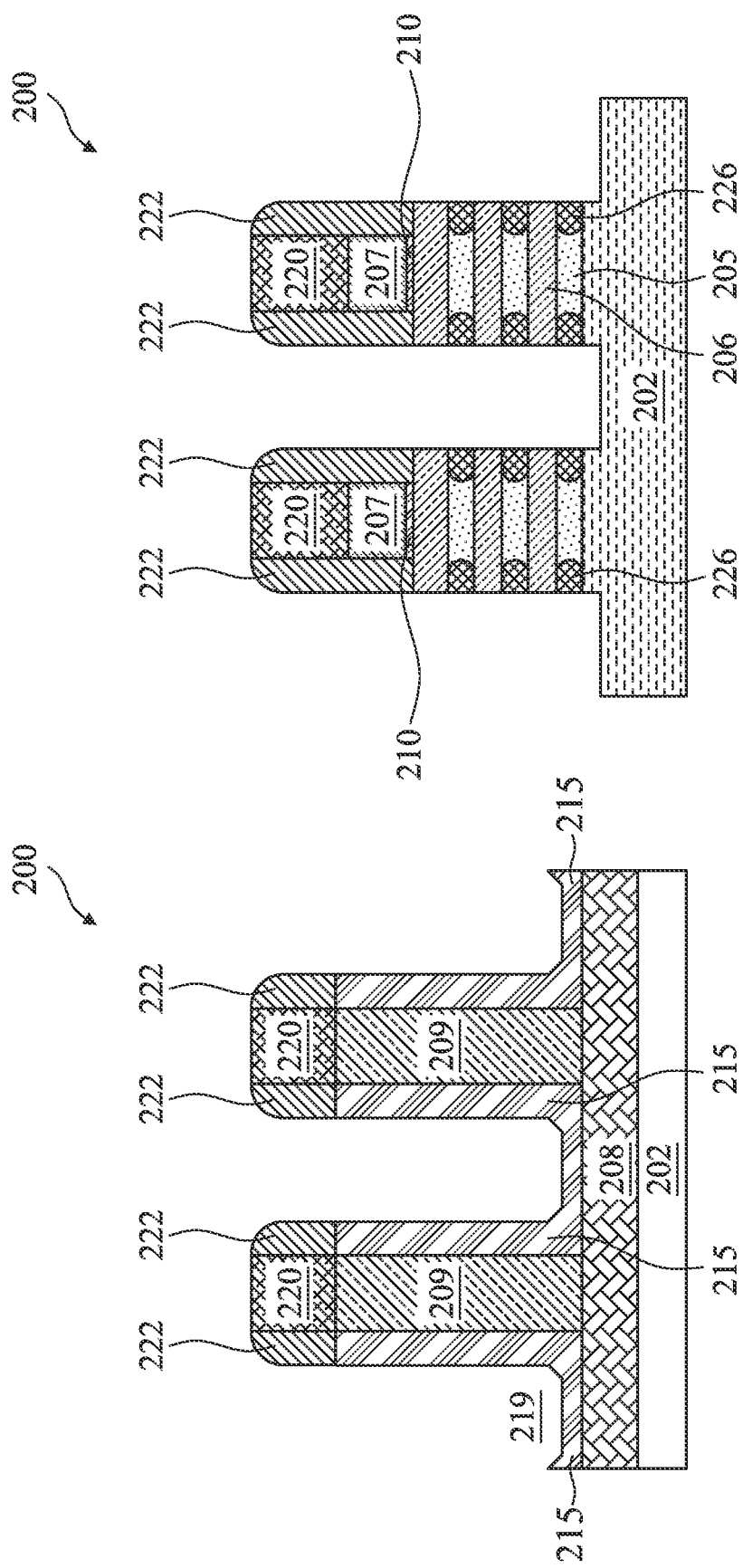

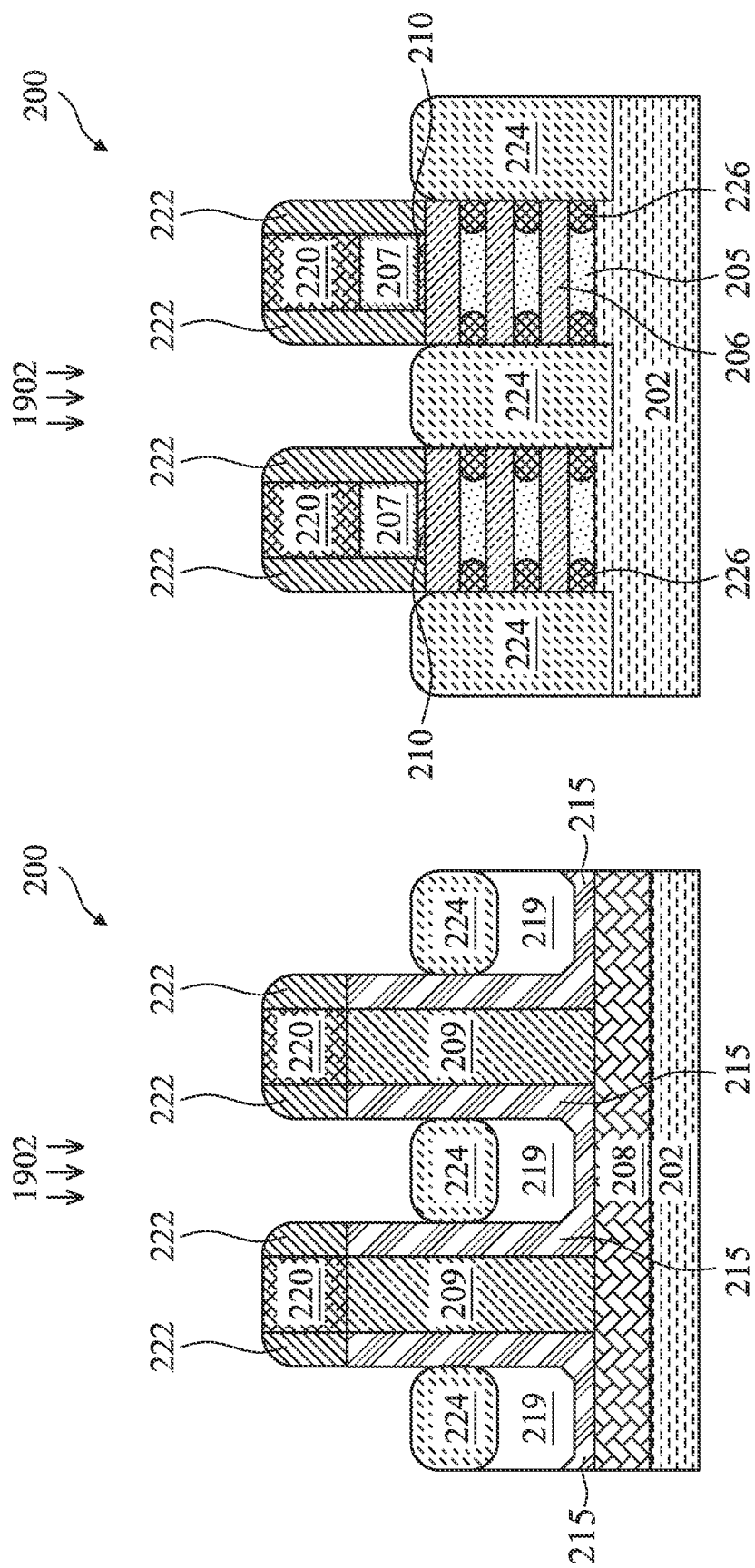

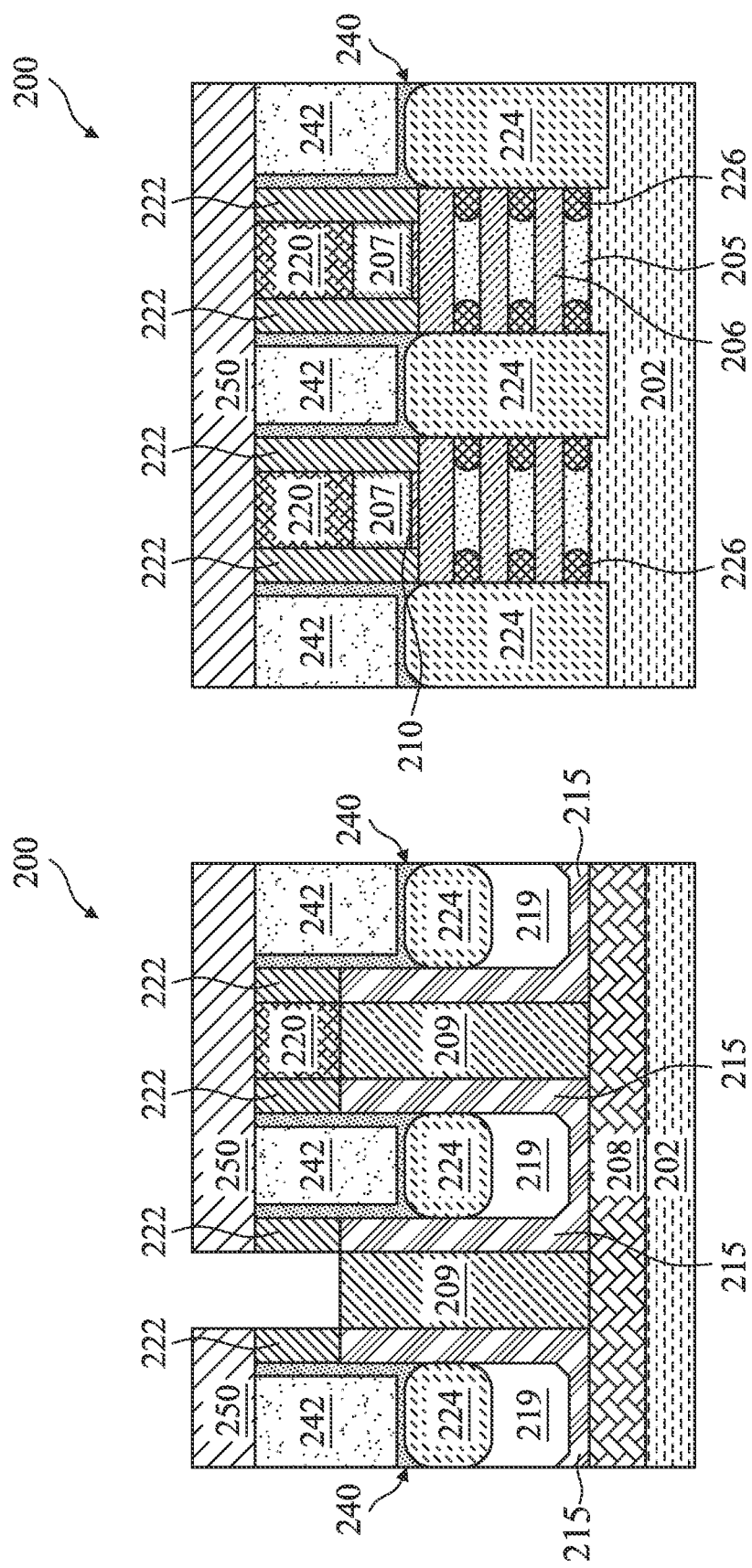

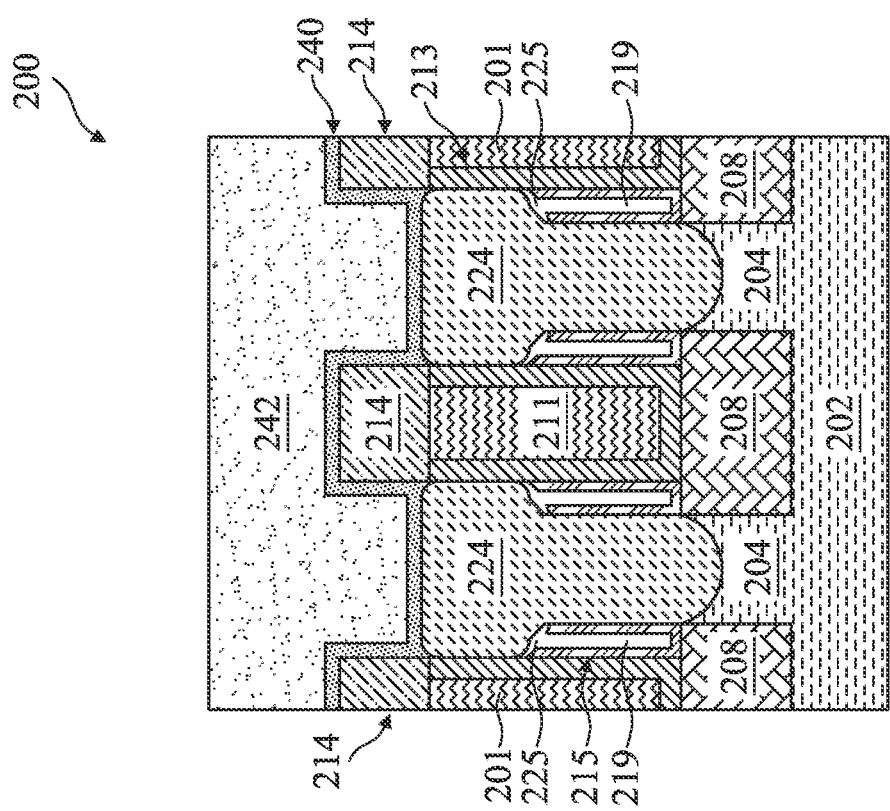
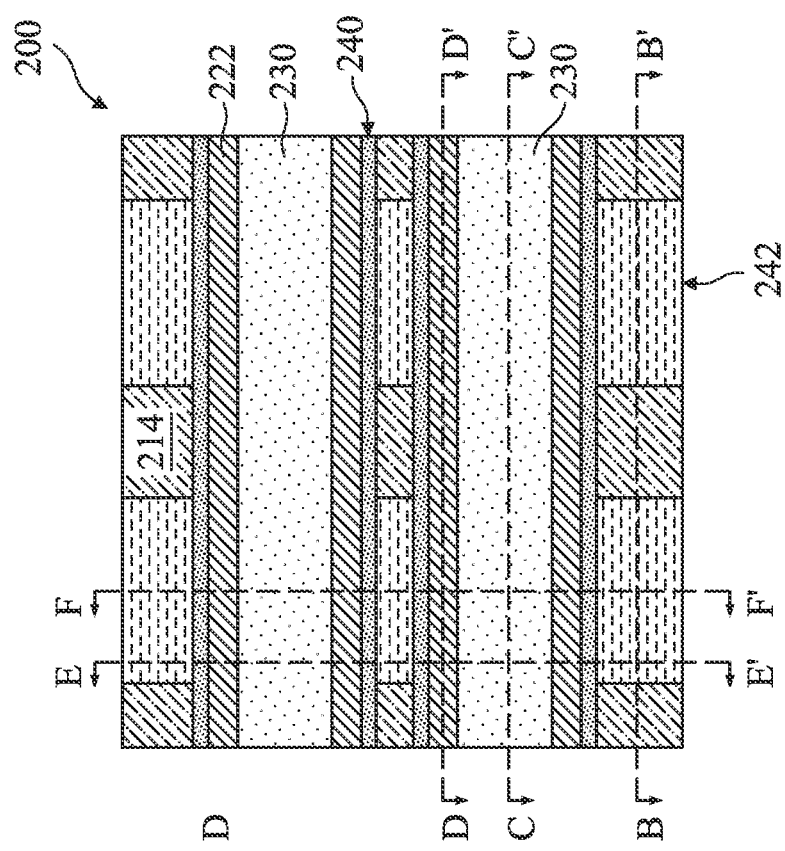
FIG. 22B
FIG. 22A

SOURCE/DRAIN SPACER WITH AIR GAP IN SEMICONDUCTOR DEVICES AND METHODS OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, parasitic capacitance of dielectric components disposed between active device regions may have serious bearings on the overall performance of an IC device. In some examples, higher parasitic capacitance may lead to lower device speed (e.g., RC delays) when separation distances between the active device regions are reduced to meet design requirements of smaller technology nodes. While methods of reducing parasitic capacitance in IC devices have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, and 25A are planar top views of the semiconductor device as shown in FIGS. 2A and/or 2B during intermediate stages of the method shown in FIGS. 1A and/or 1B according to various embodiments of the present disclosure.

FIGS. 3B, 4B, 5B, 6B, 7B, 8B, 9B, 10B, 11B, 12B, 13B, 14B, 15B, 16B, 17B, 18B, 19B, 19B-1, 19B-2, 20B, 21B, 22B, 23B, 24B, and 25B are cross-sectional views of the semiconductor device taken along line BB' as shown in FIGS. 2A and/or 2B during intermediate stages of the method shown in FIGS. 1A and/or 1B according to various embodiments of the present disclosure.

FIGS. 18E, 19E, 20E, 21E, 22E, 23E, 24E, and 25E are cross-sectional views of the semiconductor device taken along line EE' as shown in FIG. 19A during intermediate stages of the method shown in FIGS. 1A and/or 1B according to various embodiments of the present disclosure.

FIGS. 18F, 19F, 20F, 21F, 22F, 23F, 24F, and 25F are cross-sectional views of the semiconductor device taken along line FF' as shown in FIG. 19A during intermediate stages of the method shown in FIGS. 1A and/or 1B according to various embodiments of the present disclosure.

DETAILED DESCRIPTION

Figure 1A:
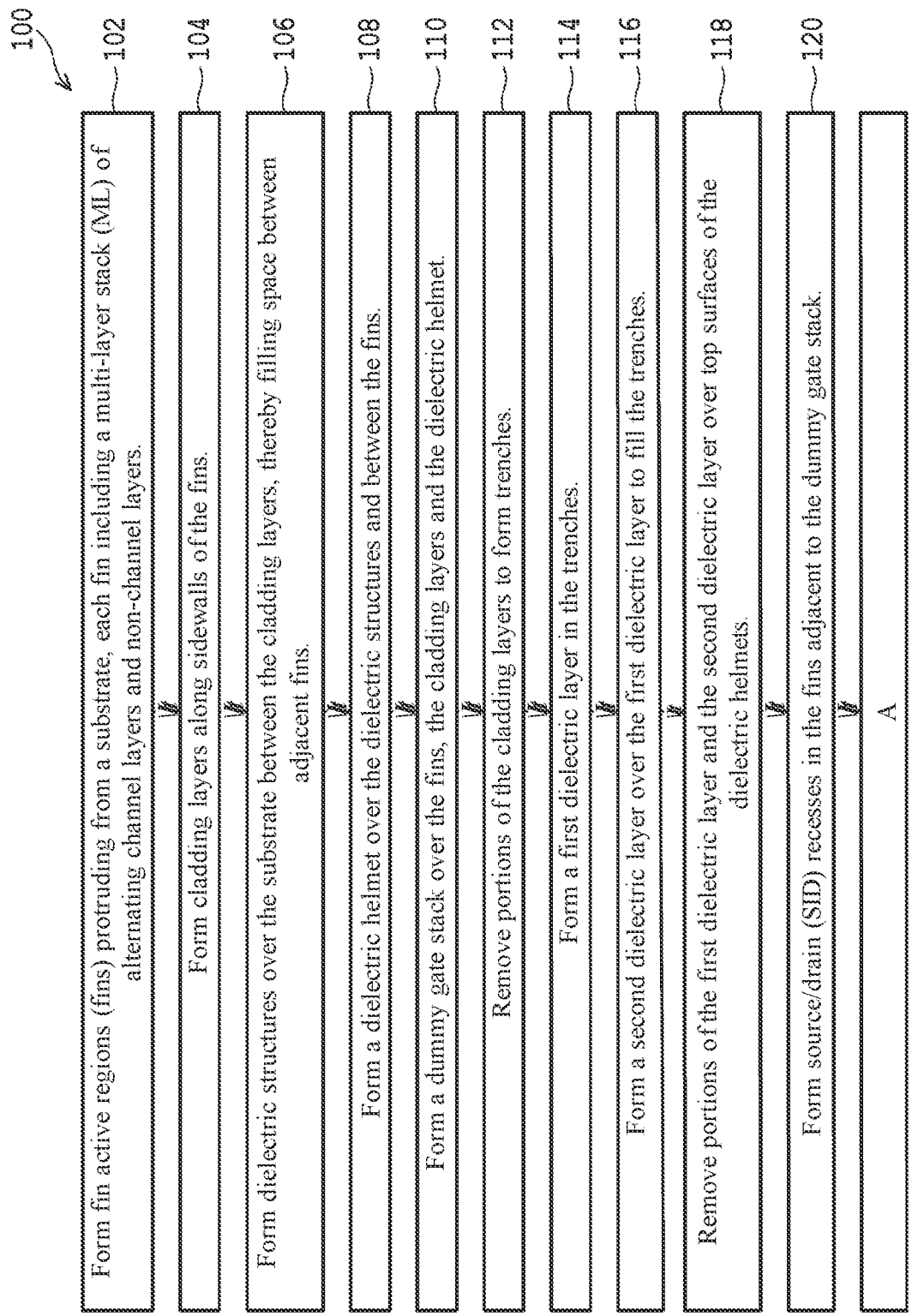
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within ±10% of the number described or other values as understood by person skilled in the art. For example, the term "about 5 nanometers" encompasses the dimension range from 4.5 nanometers to 5.5 nanometers. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional nanostructure (NS) FETs (alternatively referred to as gate-all-around, or GAA, FETs), in memory and/or standard logic cells of an integrated circuit (IC) structure. Generally, an NS FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. NS FETs have demonstrated attractive qualities over single-gate devices in terms of control over short-channel effects (SCEs) and driving ability. However, in some instances, NS FETs may suffer parasitic capacitances existing between its dielectric components disposed between active regions. While many design choices have been utilized to reduce the parasitic capacitance, they are not entirely satisfactory in all aspects. In this regard, improvements in methods of forming NS FETs with reduced parasitic capacitance are desired. The present embodiments are directed to methods of forming a source/drain spacer including an air gap to reduce the parasitic capacitance of the source and drain (S/D) feature without compromising other aspects of the design requirements, such as resistance. The present disclosure includes multiple embodiments. Different embodiments may have different advantages, and no particular advantage is necessarily required of any embodiment.

Figure 1B:
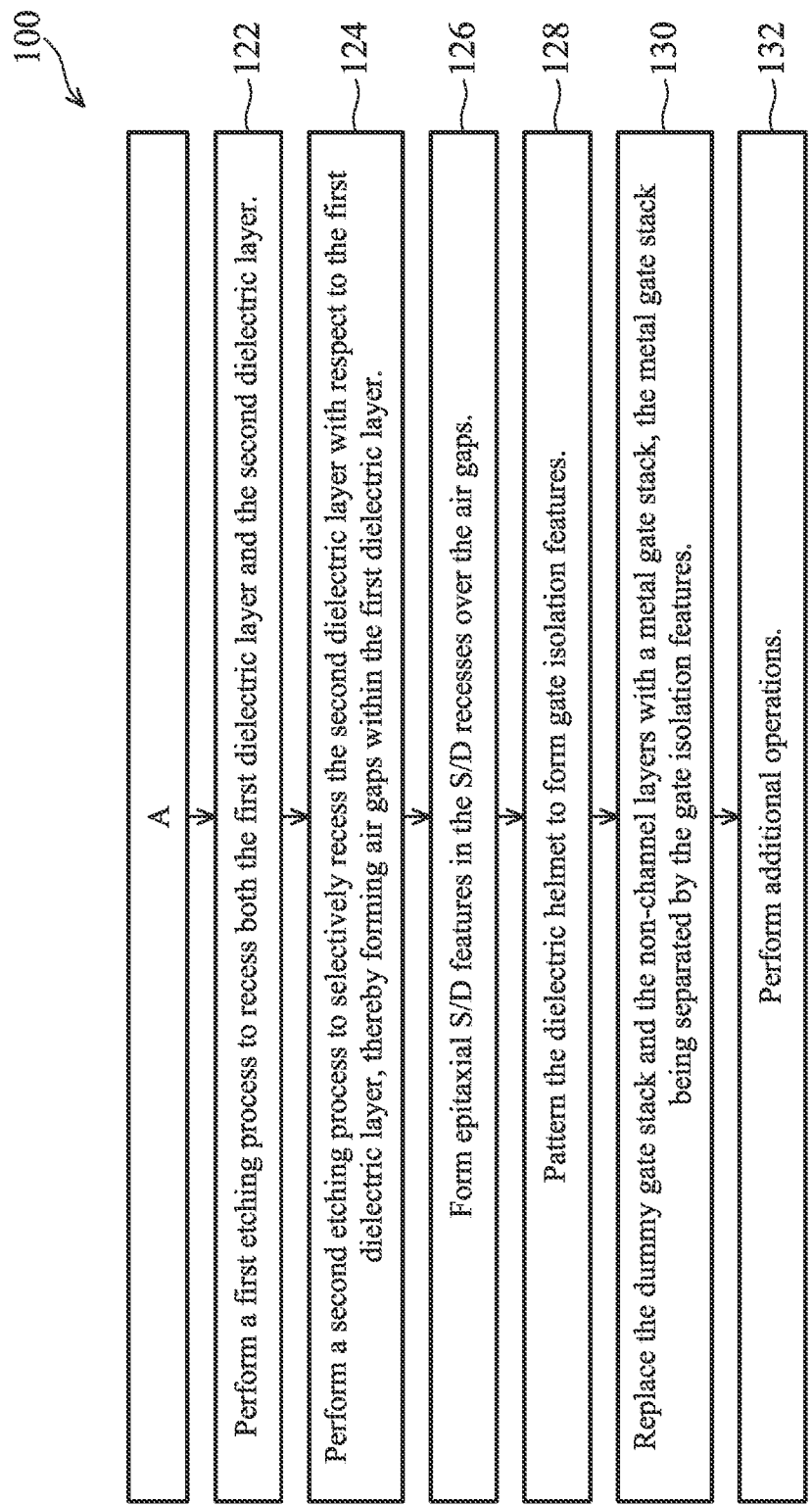
Figure 2B:
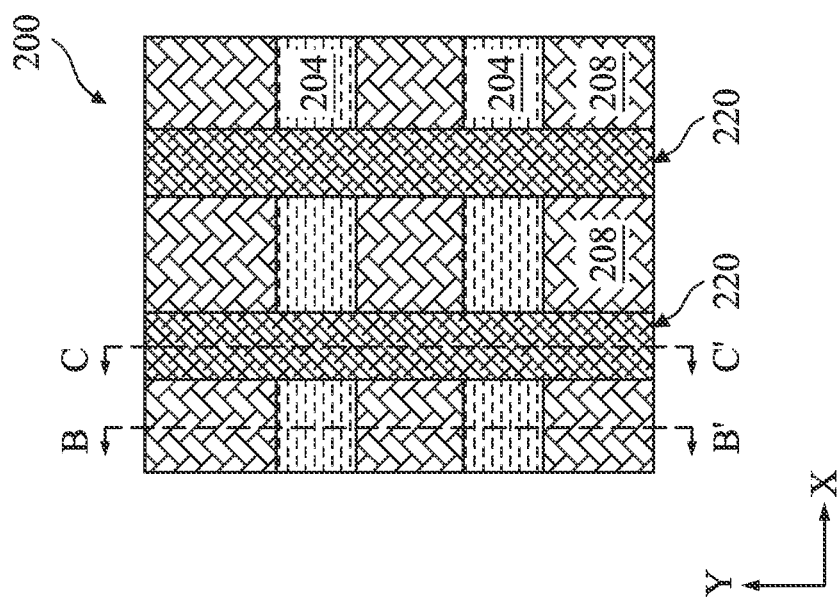
FIG. 2B is a planar top view of the semiconductor device shown in FIG. 2A according to various embodiments of the present disclosure.
Figure 2A:
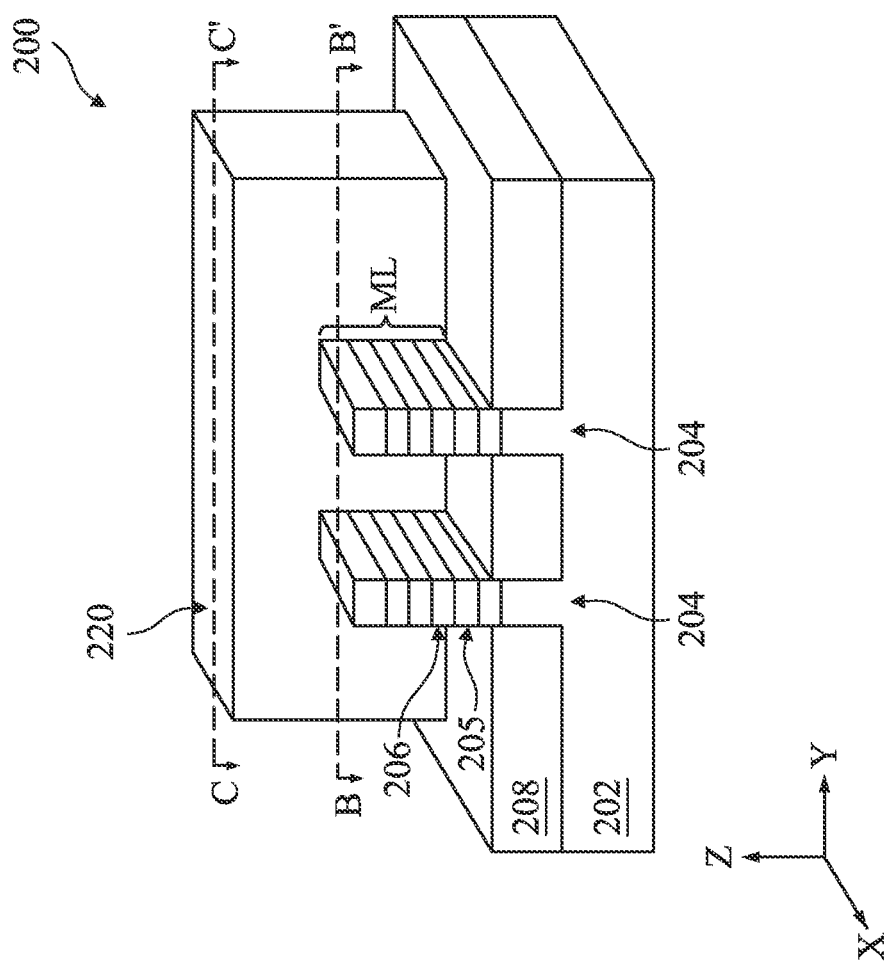
FIG. 2A is a three-dimensional perspective view of a portion of an example semiconductor device according to various embodiments of the present disclosure.
Figures 18A, 18B:
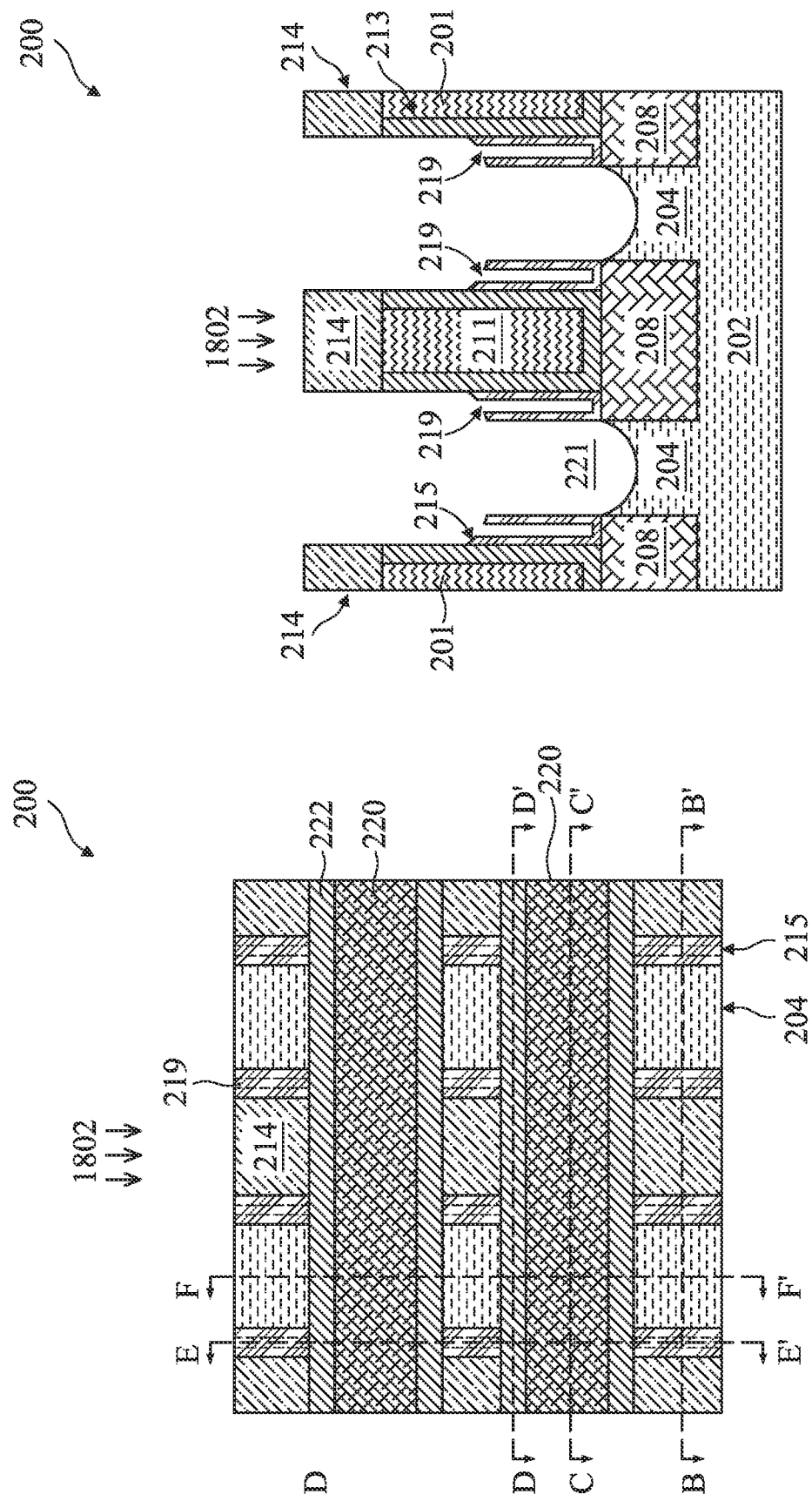
Figure 18D:
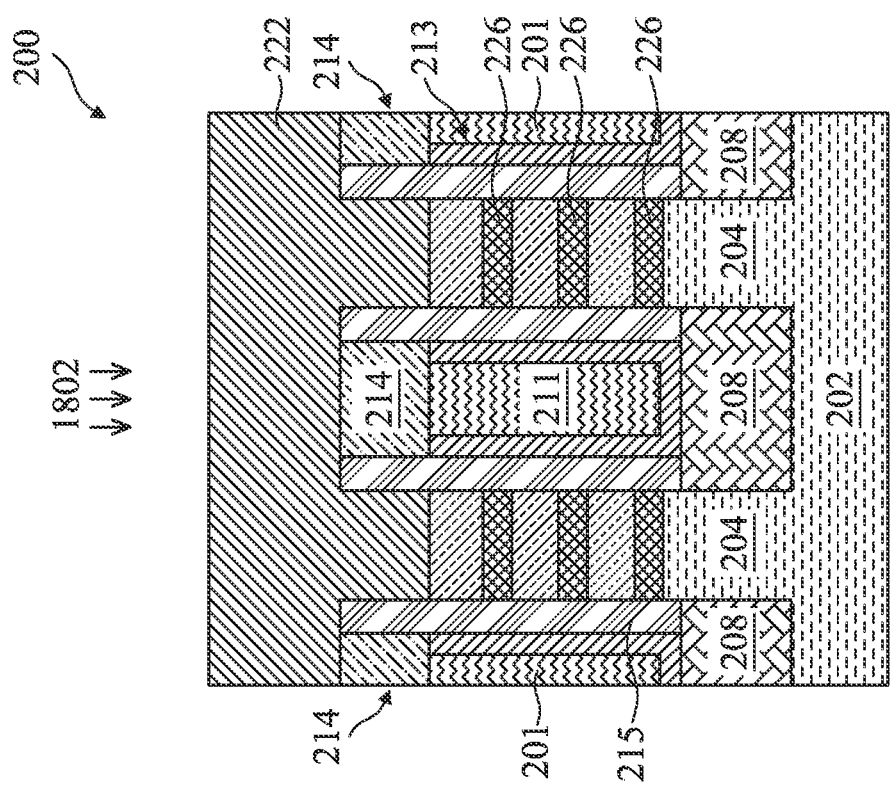
Figure 18C:
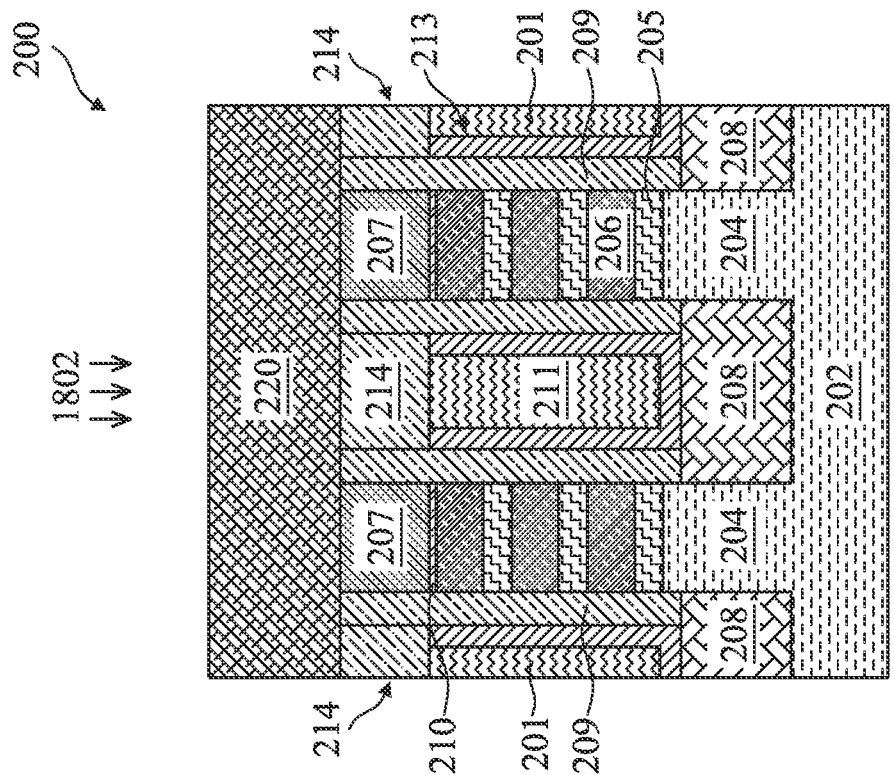
Figures 19A, 19B:
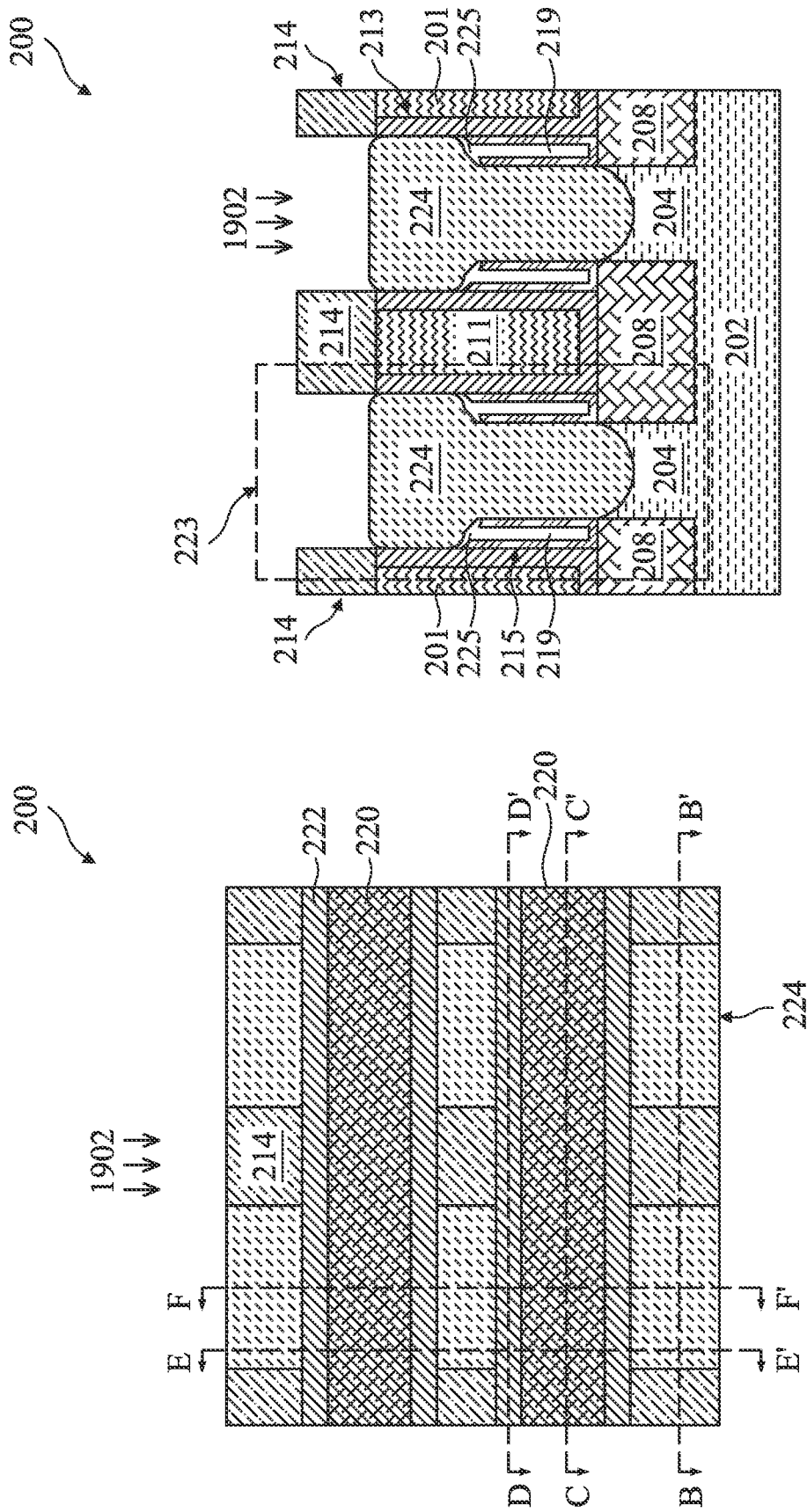
Figure 19D:
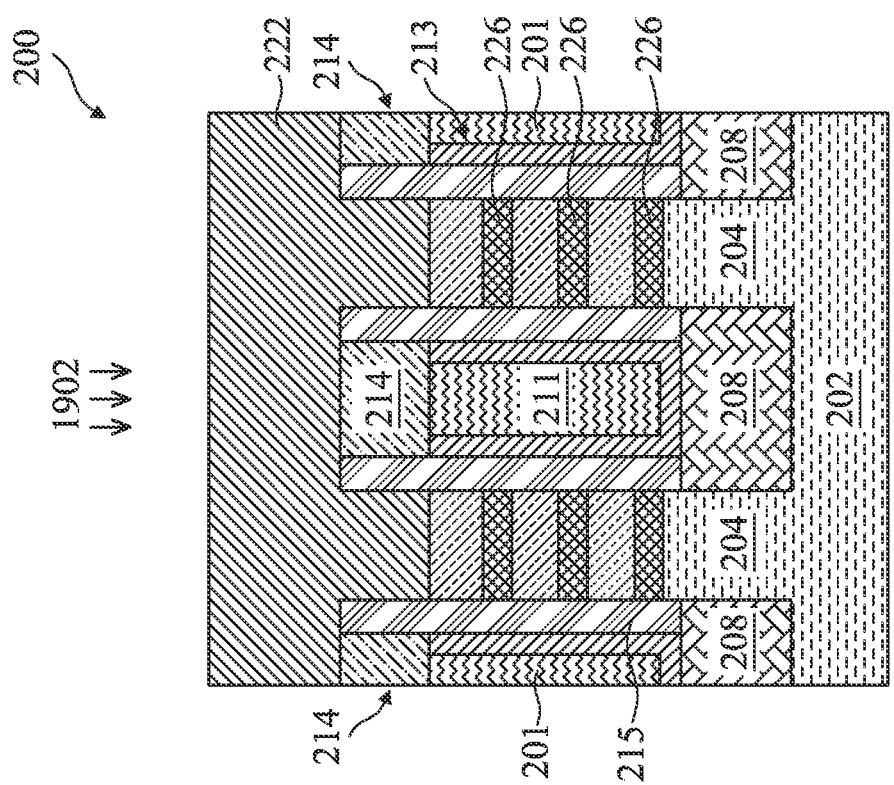
Figure 19C:
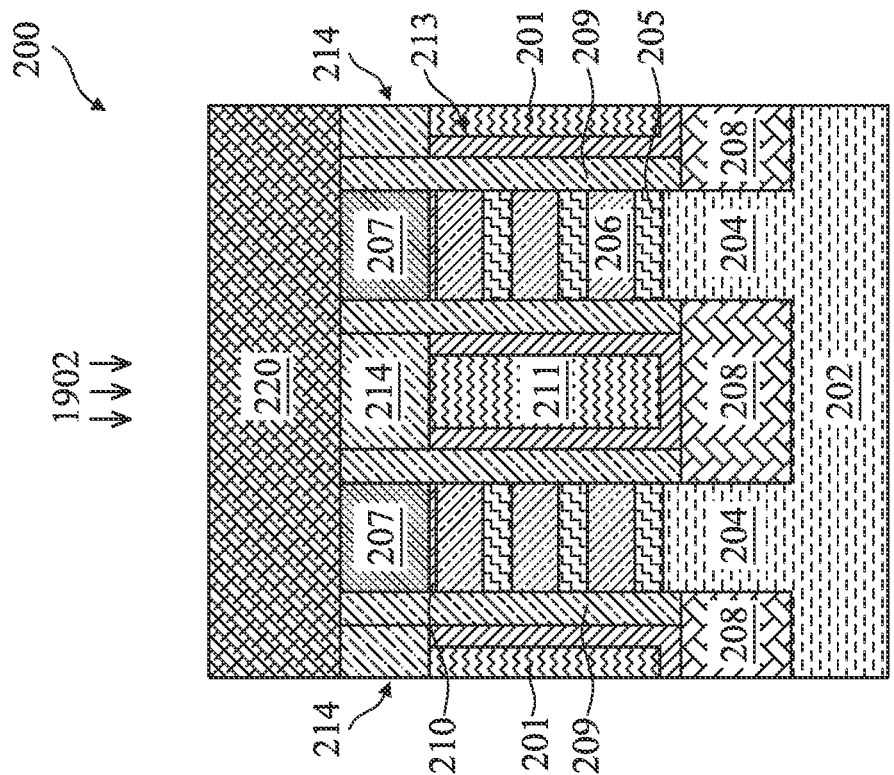

Referring now to FIGS. 1A and 1B collectively, a flowchart of a method 100 of forming a semiconductor device 200 (hereafter simply referred to as the device 200) is illustrated according to various aspects of the present disclosure. Methods 100 is merely an example and are not intended to limit the present disclosure beyond what is explicitly recited in the claims. Additional operations can be provided before, during, and after methods 100, and some operations described can be replaced, eliminated, or moved around for additional embodiments of the method. Methods 100 is described below in conjunction with FIGS. 3A-25F, which are various cross-sectional and top planar views of the device 200 as shown in FIGS. 2A and 2B at intermediate steps of method 100. For examples, 3A, 4A, 5A, 6A, 7A, 8A, 9A, 10A, 11A, 12A, 13A, 14A, 15A, 16A, 17A, 18A, 19A, 20A, 21A, 22A, 23A, 24A, and 25A are planar top views of the device 200 as shown in FIGS. 2A and/or 2B; FIGS. 3B, 4B, 5B, 6B, 7B, 8B, 9B, 10B, 11B, 12B, 13B, 14B, 15B, 16B, 17B, 18B, 19B, 19B-1, 19B-2, 20B, 21B, 22B, 23B, 24B and 25B are cross-sectional views of the device 200 taken along line BB' as shown in FIGS. 2A and/or 2B; FIGS. 9C, 10C, 11C, 12C, 13C, 14C, 15C, 16C, 17C, 18C, 19C, 20C, 21C, 22C, 23C, 24C, and 25C are cross-sectional views of the device 200 taken along line CC' as shown in FIGS. 2A and/or 2B; FIGS. 15D, 16D, 17D, 18D, 19D, 20D, 21D, 22D, 23D, 24D, and 25D are cross-sectional views of the device 200 taken along line DD' as shown in FIG. 15A; FIGS. 18E, 19E, 20E, 21E, 22E, 23E, 24E, and 25E are cross-sectional views of the device 200 taken along line EE' as shown in FIG. 18A; and FIGS. 18F, 19F, 20F, 21F, 22F, 23F, 24F, and 25F are cross-sectional views of the device 200 taken along line FF' as shown in FIG. 19A.

The device 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the device 200 includes one or more NS FETs. The present disclosure is not limited to any particular number of devices or device regions, or to any particular device configurations. Additional features can be added to the device 200, and some of the features described below can be replaced, modified, or eliminated in other embodiments of the device 200.

At operation 102, referring to FIGS. 2A-3B, method 100 forms the device 200 that includes multiple three-dimensional fin active regions (hereafter referred to as fins) 204 protruding from a semiconductor substrate (hereafter referred to as the substrate) 202, where the fins 204 are separated by isolation features 208.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In the present embodiments, still referring to FIGS. 2A-3B, each fin 204 includes a multi-layer structure (ML) of alternating non-channel layers (or sacrificial layers) 205 and channel layers 206 stacked vertically over protruding portions of the substrate 202, as well as a hard mask 207 over the ML. In some embodiments, the hard mask layer 207 has a composition the same as or similar to the non-channel layer 205. In some embodiments, an oxide layer 210 may be optionally formed between the hard mask 207 and the topmost channel layer 206.

In the present embodiments, the non-channel layers 205 are sacrificial layers configured to be removed at a subsequent processing step, thereby providing openings between the channel layers 206 for forming a metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, the channel layer 206 may include elemental Si and the non-channel layer 205 may include SiGe. In another example, the channel layers 206 may include elemental Si and the non-channel layers 205 may include elemental Ge. In the present embodiments, the channel layers 206 includes elemental Si and the non-channel layers 205 include SiGe. In some examples, each fin 204 may include a total of three to ten pairs of alternating non-channel layers 205 and channel layers 206; of course, other configurations may also be applicable depending upon specific design requirements.

In the present embodiments, forming the ML includes alternatingly growing the non-channel layers 205 and the channel layers 206 in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interact with the composition of the underlying substrate, e.g., the substrate 202. In some examples, the non-channel layers 205 and the channel layers 206 may be formed into nanosheets, nanowires, or nanorods. A sheet (or wire) release process may then be implemented to remove the non-channel layers 205 to form openings between the channel layers 206, and a metal gate stack is subsequently formed in the openings, thereby providing an NS FET.

In the present embodiments, the fins 204 are fabricated from the ML using a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving the fins 204 protruding the substrate 202 and separated by trenches 203. The etching process may include dry etching, wet etching, reactive ion etching (RIE), other suitable processes, or combinations thereof. The patterned masking element is subsequently removed from the ML using any suitable process, such as ashing and/or resist stripping.

In some embodiments, the hard mask 207 is configured to protect the fins 204 during subsequent processing steps and is later removed from the device 200. In some embodiments, the hard mask 207 has a composition similar to or the same as that of the non-channel layers 205 and includes, for example, SiGe. In some embodiments, the optional oxide layer 210 includes any suitable materials, such as silicon oxide ($SiO_x$, $1 \leq x \leq 2$). In some embodiments, the hard mask 207 and the oxide layer 210 are collectively patterned with the ML during the fin fabrication process.

Figures 3A, 3B:
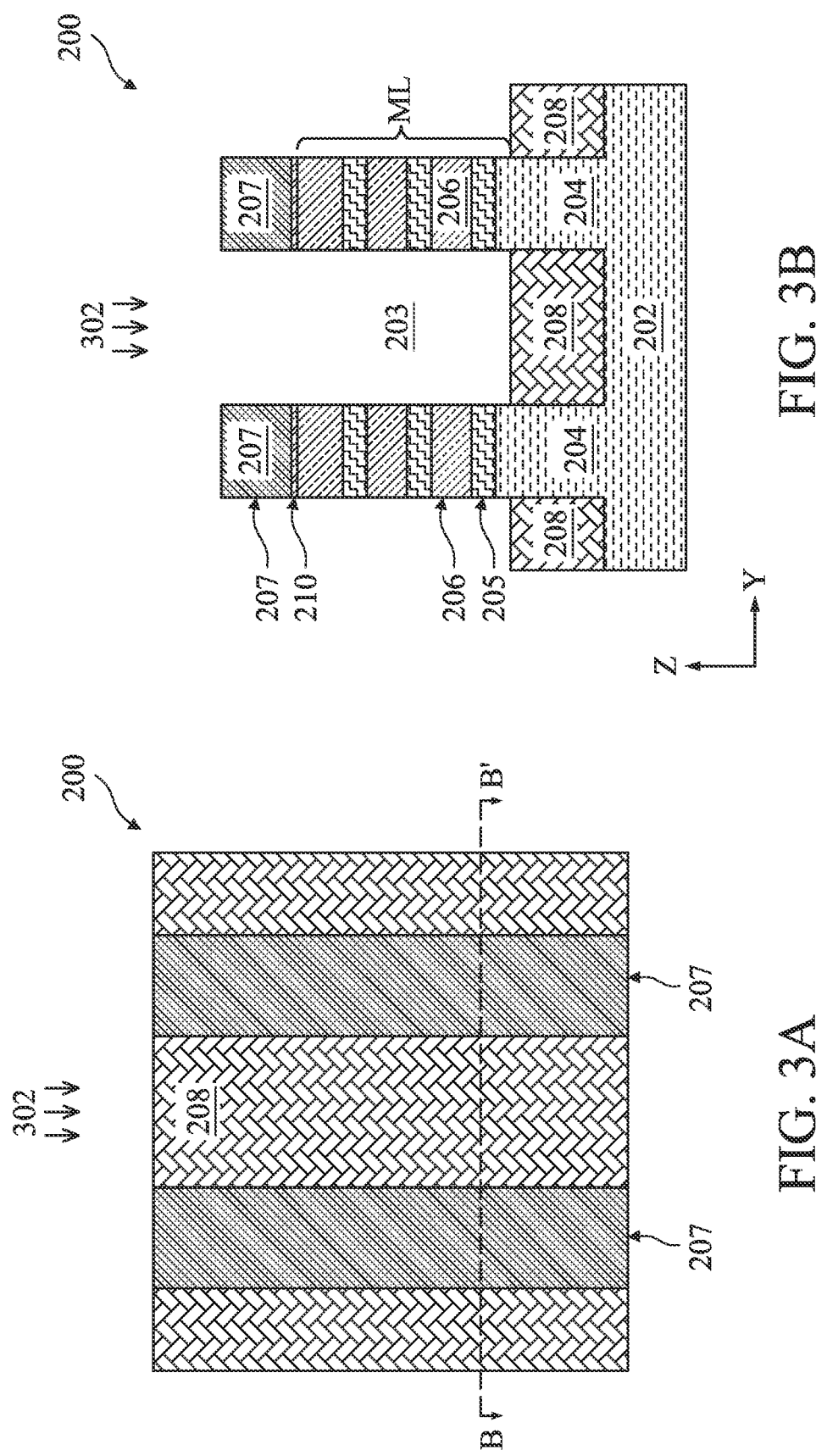
Figure 4B:
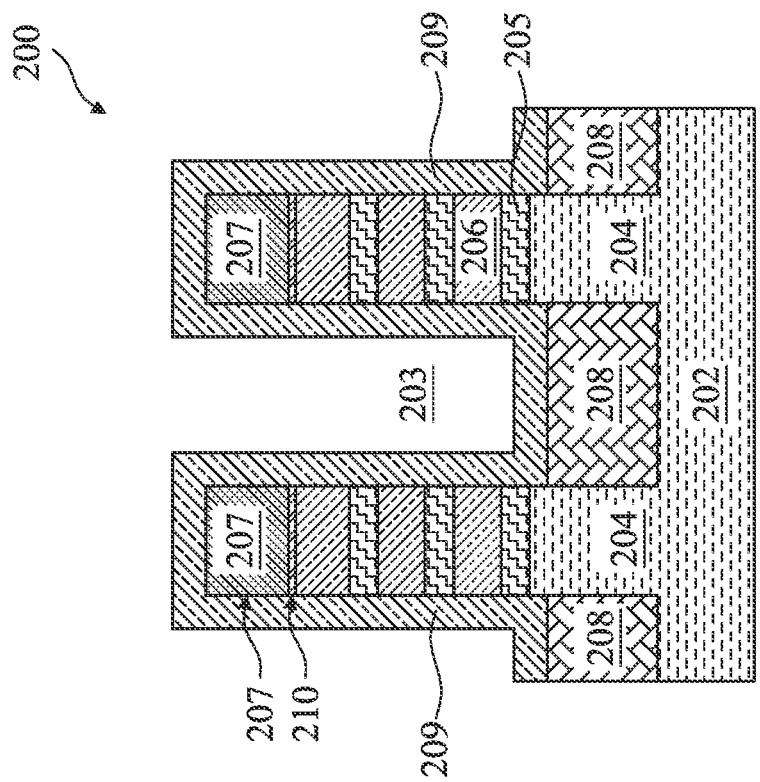
Figure 4A:
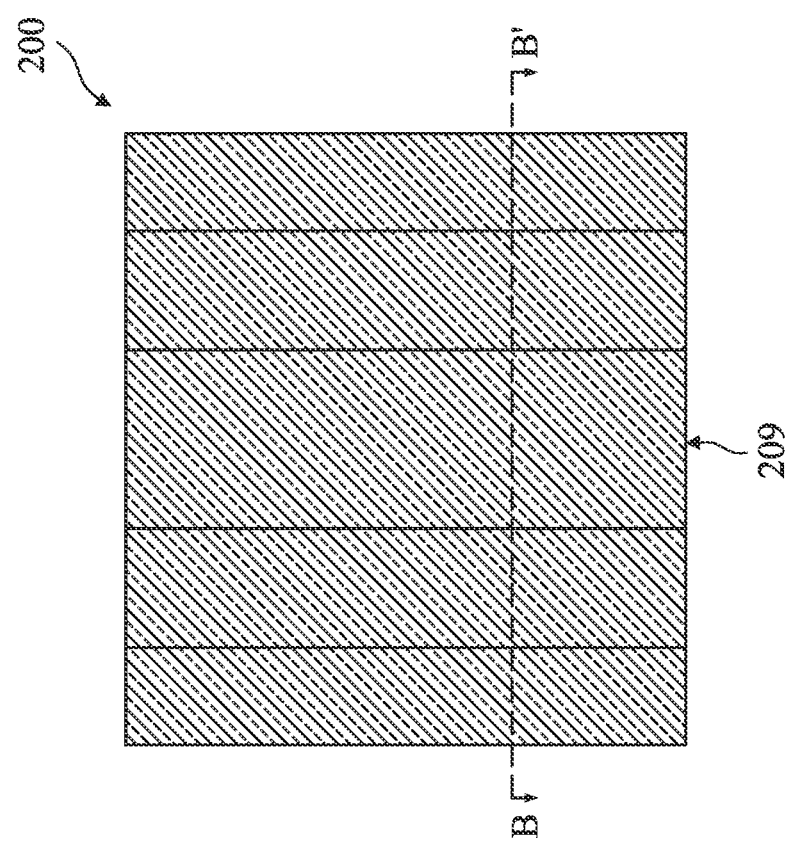
Figure 5B:
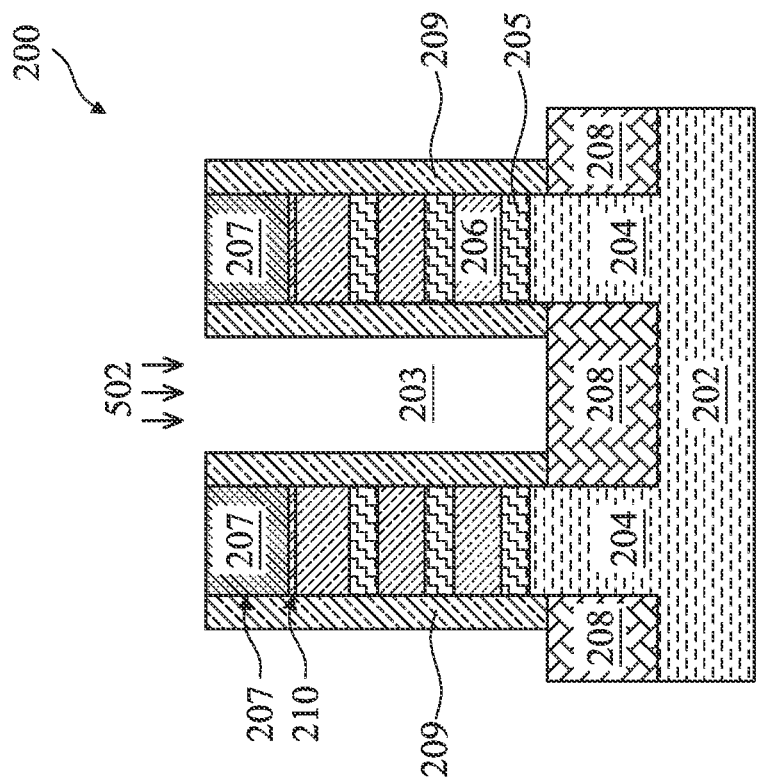
Figure 5A:
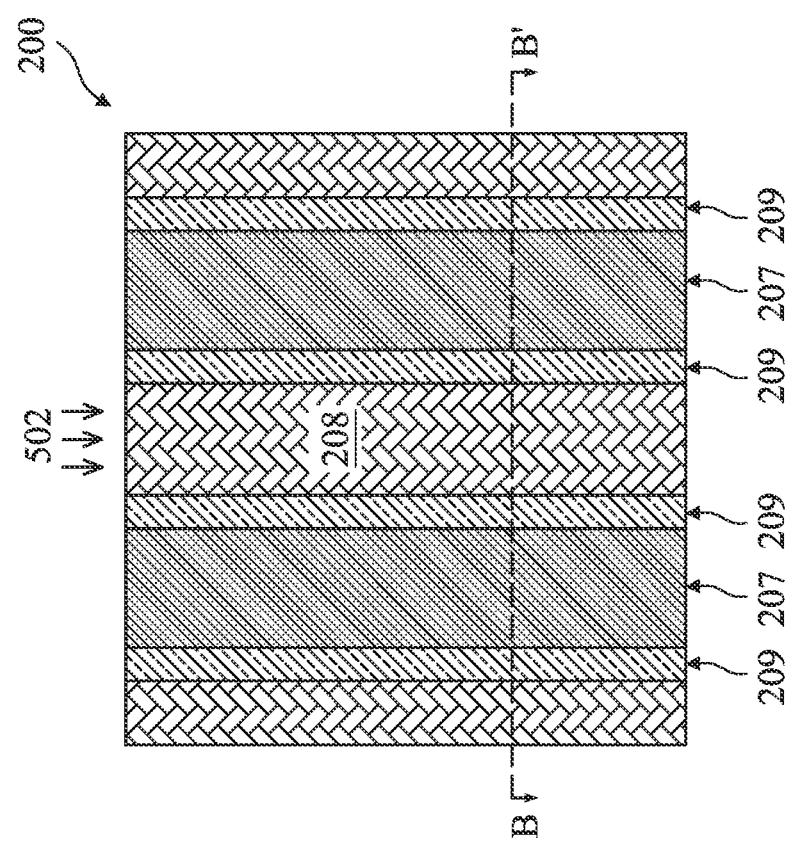

The isolation features 208 may include silicon oxide ($SiO_x$, $1 \leq x \leq 2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. In one embodiment, the isolation features 208 are formed by filling trenches 203 between the fins 204 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation features 208. In some embodiments, the isolation features 208 include shallow trench isolation (STI) features. In some embodiments, the isolation features 208 include a single-layer structure or a multi-layer structure. As depicted in FIG. 3B, top surfaces of the isolation features 208 are exposed in the trenches 203.

At operation 104, referring to FIGS. 4A-5B, method 100 forms a cladding layer 209 along sidewalls of the fins 204 and over the isolation features 208. In some embodiments, the cladding layer 209 has a composition that is similar to but different from that of the non-channel layers 205. In other words, the difference in composition may be within a suitable range to allow the cladding layer 209 and the non-channel layers 205 to be removed together in some instances using one type of etchant or removed separately in other instances by applying a different etchant. The difference in composition may be related to a difference in amount of Ge (Ge %) present (both the cladding layer 209 and the non-channel layers 205 include SiGe as discussed above) and/or degree of crystallinity (i.e., the amount of crystalline SiGe present). In some embodiments, the cladding layer 209 and the non-channel layers 205 each includes about 15% to about 30% of Ge, where the Ge % in the cladding layer 209 is lower (e.g., about 2% lower) than that in the non-channel layers 205. In some embodiments, both the cladding layer 209 and the non-channel layers 205 include the same Ge %, but depending on the method by which the cladding layer 209 is formed (see discussion below), the degree of crystallinity in cladding layer 209 is different from that of the non-channel layers 205, thereby presenting etching selectivity between the layers. In some embodiments, the cladding layer 209 includes more amorphous SiGe than the non-channel layers 205. In some embodiments, the cladding layer 209 is formed such that it consists entirely of amorphous SiGe. In some embodiments, the cladding layer 209 differs from the non-channel layers 205 in both the Ge % and the degree of crystallinity to accommodate various aspects of the subsequent operations.

In some embodiments, the cladding layer 209 is deposited epitaxially by a suitable method discussed above with respect to forming the ML. In some embodiments, referring to FIGS. 4A and 4B, the cladding layer 209 is deposited conformally, rather than grown epitaxially, over surfaces of the device 200 as an amorphous layer, such that the cladding layer 209 is also formed over the isolation features 208. In the present embodiments, portions of the cladding layer 209 partially fill the trenches 203. In some examples, the cladding layer 209 may be formed to a thickness of about 5 nanometers to about 10 nanometers. Subsequently, referring to FIGS. 5A and 5B, method 100 performs an etching process 502 to selectively remove portions of the cladding layer 209, thereby exposing portions of the isolation features 208 in the trenches 203 and a top surface of the hard mask 207. The etching process 502 may include a dry etching process, an RIE process, or combinations thereof. The etching process 502 selectively removes horizontal portions of the cladding layer 209 without removing, or substantially removing the isolation features 208 or vertical portions of the cladding layer 209.

Figure 6B:
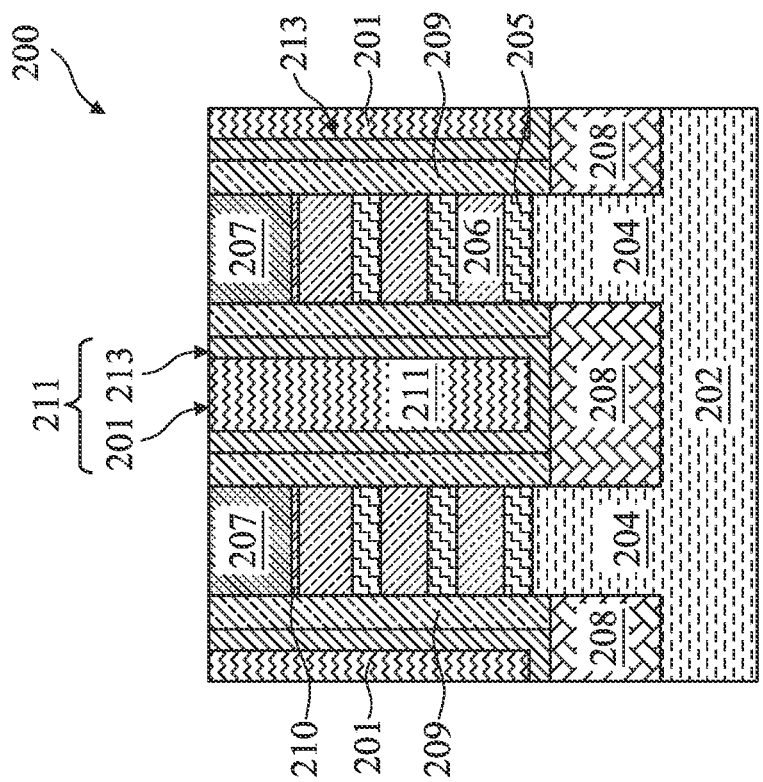
Figure 6A:
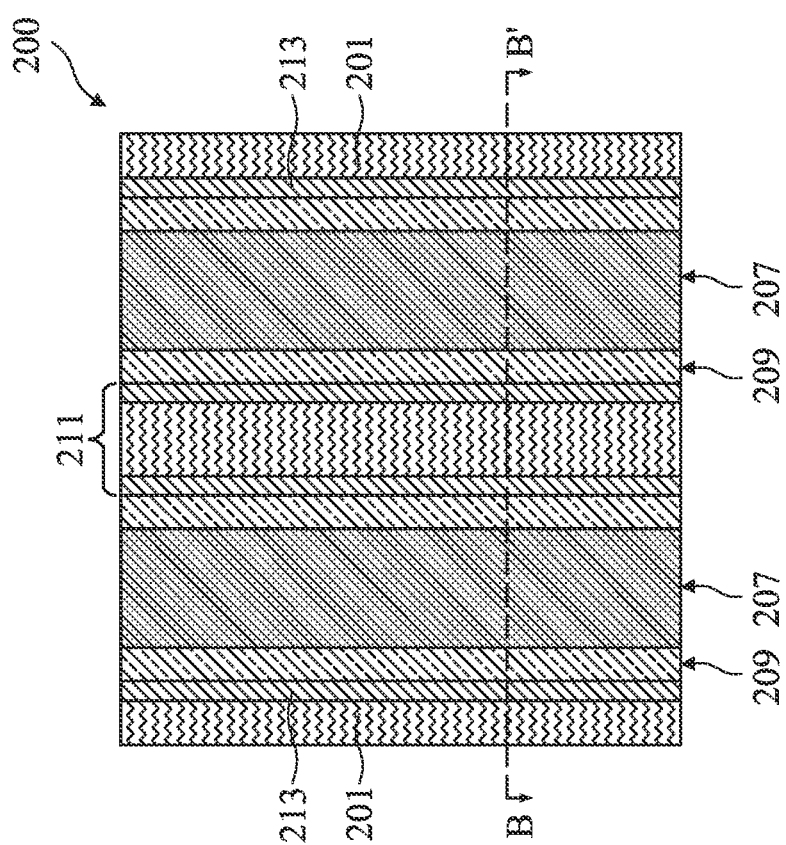

At operation 106, referring to FIGS. 6A-6B, method 100 forms dielectric structures (or dielectric fins) 211 over the isolation features 208 and between portions of the cladding layer 209, thereby completely filling the trenches 203. The dielectric structures 211 are configured to isolate adjacent fins 204 and to provide a substrate over which dielectric helmets 214 are formed before forming any gate stacks. The dielectric structures 211 may include any suitable material, such as silicon oxide ($SiO_x$, $1 \leq x \leq 2$), silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. The dielectric structures 211 may be single-layered or multi-layered. In the present embodiments, the dielectric structures 211 each include a lining layer 213 and a filling layer 201 different from the lining layer 213 in composition. In some embodiments, the lining layer 213 has a higher density than that of the filling layer 201. In some embodiments, the filing layer 201 has a lower dielectric constant than the lining layer 213. In some embodiments, the lining layer 213 is formed conformally along sidewalls of the cladding layer 209 and over the isolation features 208 prior to the deposition of the filling layer 201. The lining layer 213 may be formed by any suitable method, such as ALD, CVD, other suitable methods, or combinations thereof. The filling layer 201 is subsequently formed over the lining layer 213 by any suitable method, such as CVD, FCVD, other suitable methods, or combinations thereof. In some embodiments, the device 200 is subsequently planarized by one or more CMP process to expose a top surface of the hard mask 207. As depicted herein, the dielectric structures 211 are separated from each sidewall of the fins 204 by the cladding layer 209.

Referring to FIGS. 7A and 7B, method 100 recesses a top portion of the dielectric structures 211 in an etching process 702 to form trenches 212. The etching process 702 may include any suitable process, such as a dry etching process, a wet etching process, an RIE process, other suitable processes, or combinations thereof.

Figure 8B:
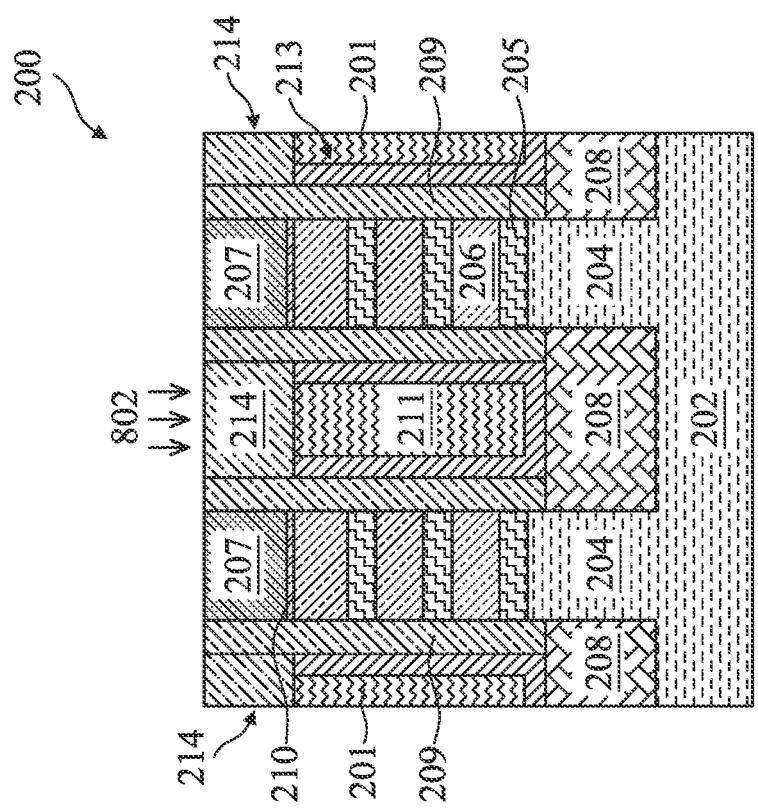
Figure 8A:
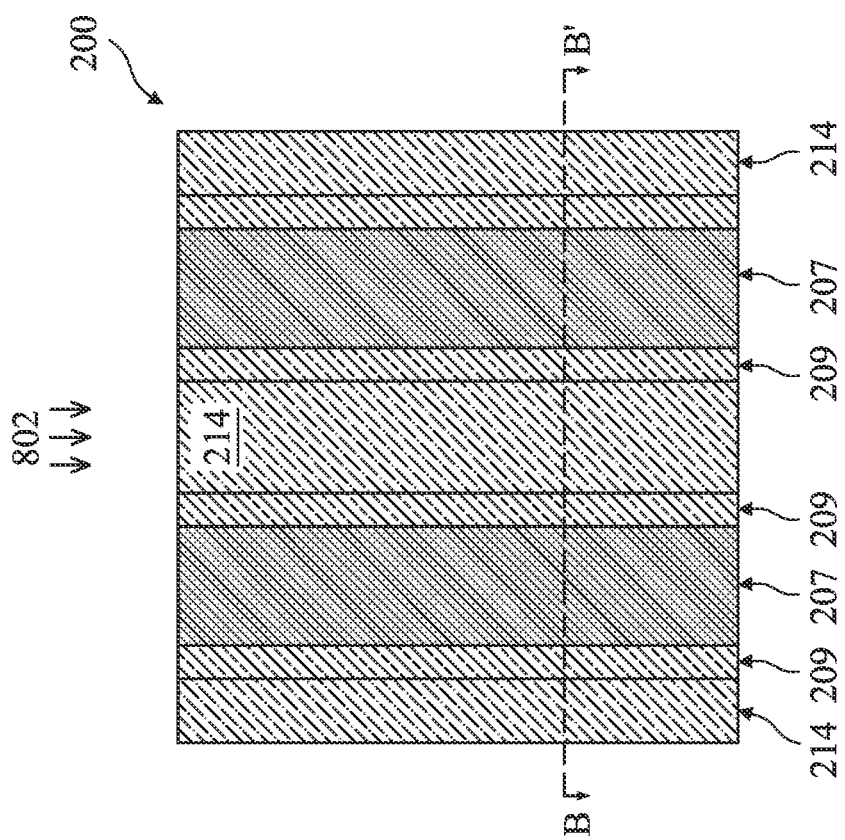

At operation 108, referring to FIGS. 8A and 8B, method 100 forms the dielectric helmets 214 over the dielectric structures 211 in process 802, thereby filling the trenches 212. In the present embodiments, at least a portion of the dielectric helmets 214 is configured to provide isolation for a subsequently-formed metal gate stack over the fins 204. In other words, at least a portion of the dielectric helmets 214 is configured to truncate (or cut) the metal gate stack into multiple portions. In some embodiments, while portions of the dielectric helmets 214 are removed (by etching, for example) before forming the metal gate stacks, remaining portions of the dielectric helmets 214 are kept intact in the device 200 and serve as isolation features for the later formed metal gate stack. The remaining portions of the dielectric helmets 214 are referred to as gate isolation features (or gate cut features).

In the present embodiments, the dielectric helmets 214 have an etching selectivity with respect to the dielectric structures 211 and the cladding layer 209. In some embodiments, the dielectric helmets 214 include silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. The dielectric helmets 214 can be single layered or multi-layered. In the present embodiments, the dielectric helmets 214 are each a single layer structure with uniform composition. Furthermore, referring to FIG. 8A, the dielectric helmets 214 are oriented lengthwise parallel to the lengthwise direction of the fins 204 and are separated from the sidewalls of the fins 204 by the cladding layer 209.

Figure 9B:
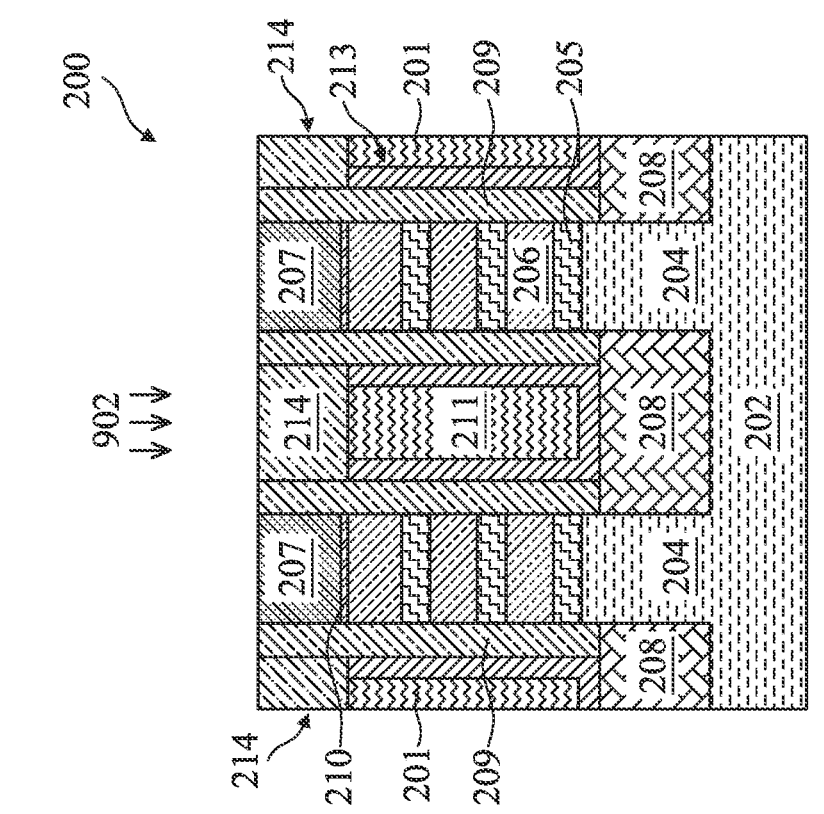
Figure 9A:
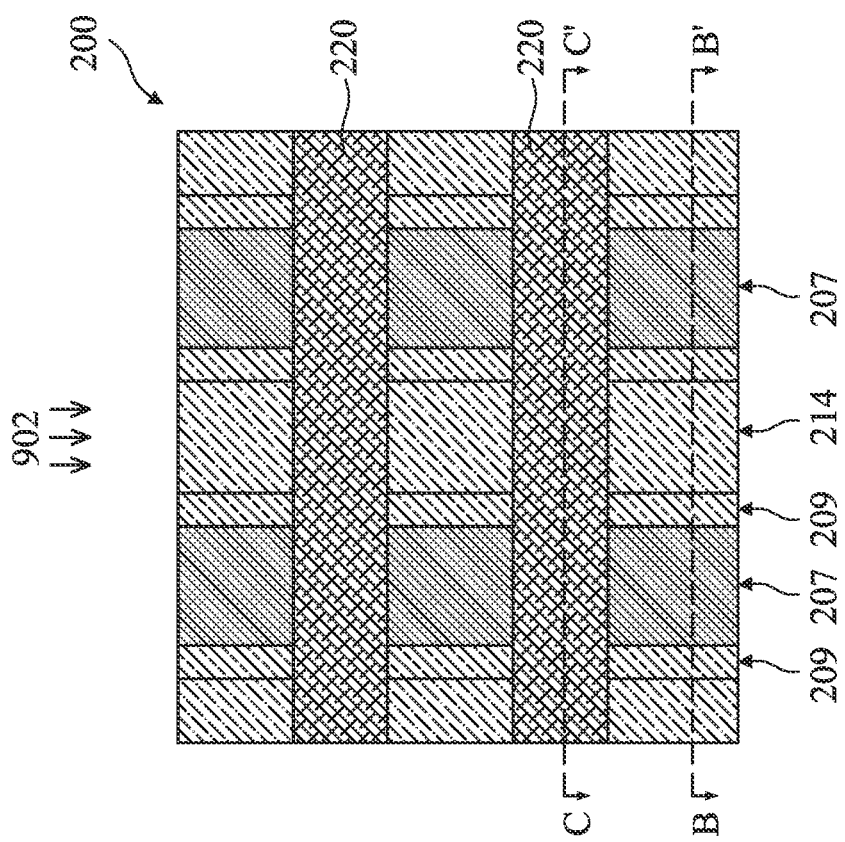
Figure 9C:
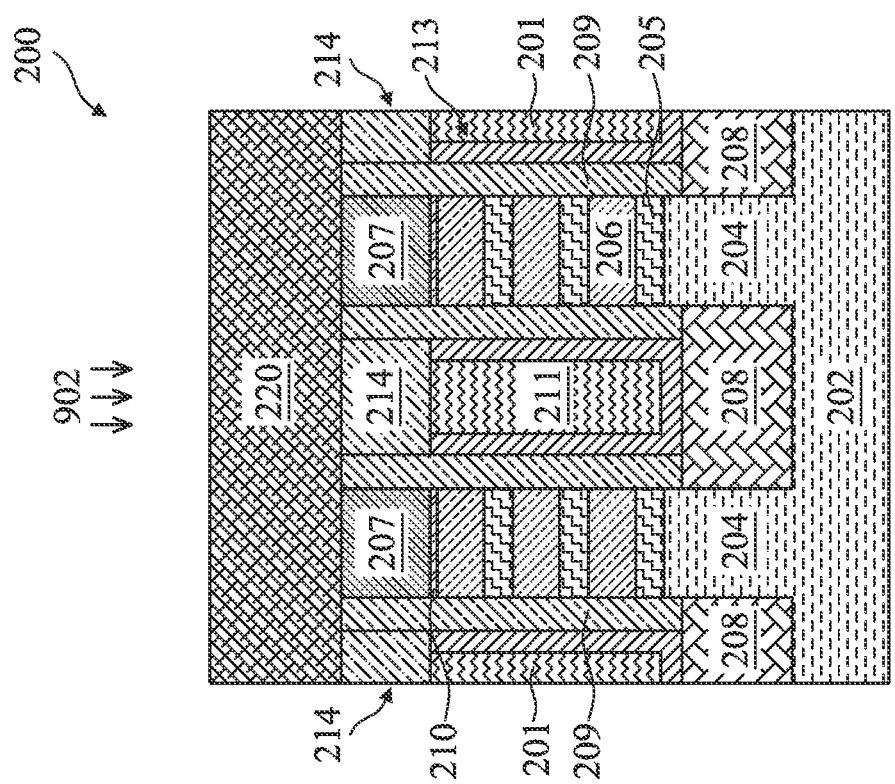
FIGS. 9C, 10C, 11C, 12C, 13C, 14C, 15C, 16C, 17C, 18C, 19C, 20C, 21C, 22C, 23C, 24C, and 25C are cross-sectional views of the semiconductor device taken along line CC' as shown in FIGS. 2A and/or 2B during intermediate stages of the method shown in FIGS. 1A and/or 1B according to various embodiments of the present disclosure.

At operation 110, referring to FIGS. 9A-9C, method 100 forms one or more dummy gate stacks 220 over channel regions of the fins 204, the dielectric helmets 214, and the cladding layer 209 in a process 902. Each dummy gate stack 220 may include a dummy gate electrode (not depicted separately) disposed over an optional dummy gate dielectric layer and/or an interfacial layer. In the present embodiments, the dummy gate stacks 220 are replaced with metal gate stacks, which are truncated (or cut) by one or more of the dielectric helmets 214. The dummy gate stacks 220 may be formed by a series of deposition and patterning processes. For example, the dummy gate stacks 220 may be formed by depositing a polysilicon (poly-Si) layer over the substrate 202, and subsequently patterning the poly-Si layer via a series of photolithography and etching processes. To accommodate the patterning process and protect the dummy gate stacks 220 during subsequent fabrication processes, a hard mask layer (not depicted) may be formed over the dummy gate stacks 220.

Figure 10C:
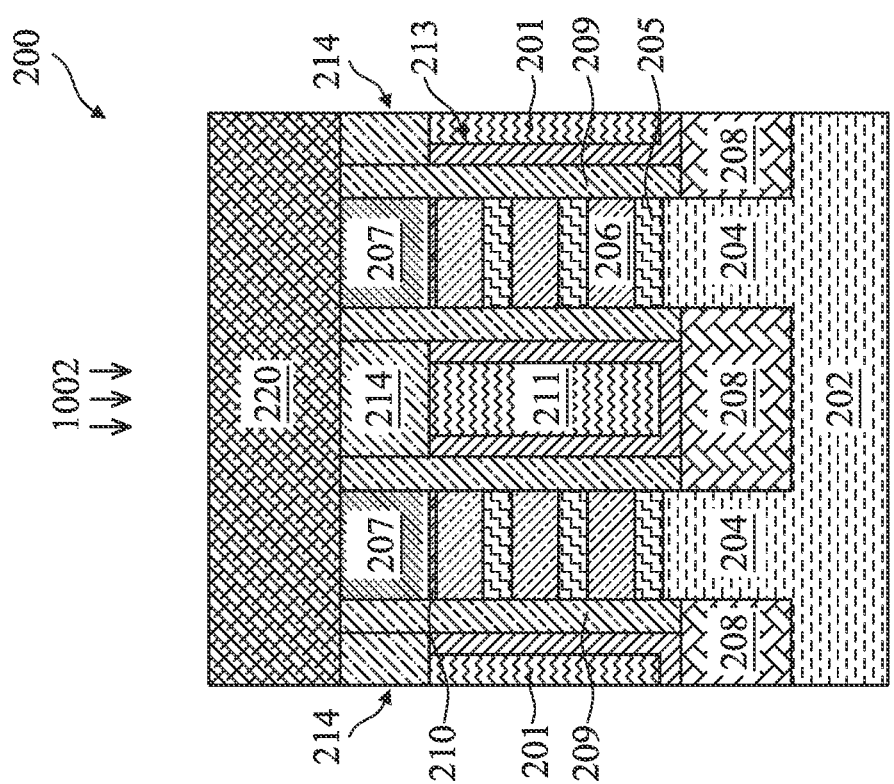

At operation 112, referring to FIGS. 10A-10C, method 100 removes portions of the cladding layer 209 between the fins 204 and the dielectric structures 211 in process 1002, thereby forming trenches 216 that expose the isolation features 208s. In the present embodiments, the portions of the cladding layer 209 in the S/D regions are removed as shown in FIG. 10B, while the cladding layer 209 under the dummy gate stacks 220 remain intact as shown in FIG. 10C. In some embodiments, the portions of the cladding layer 209 is removed by a selective etching process, in which the selected portions of the cladding layer 209 are removed without removing, or substantially removing, the surrounding components, such as the dielectric structures 211, the dielectric helmets 214, the hard mask 207, the channel layers 206 and the non-channel layers 205. In some embodiments, the etchant utilized during the process 1002 provides sufficient selectivity between the cladding layer 209, the hard mask 207 and the non-channel layers 205 that have the same elements but different element percentages and/or crystallinity as explained above. In some embodiments, process 1002 is the same as or similar to the etching process 502. In some embodiments, the trenches 216 are each have a width ranging from about 5 nanometers to about 10 nanometers. In the present embodiments, the width is about 10 nanometers.

Figure 11B:
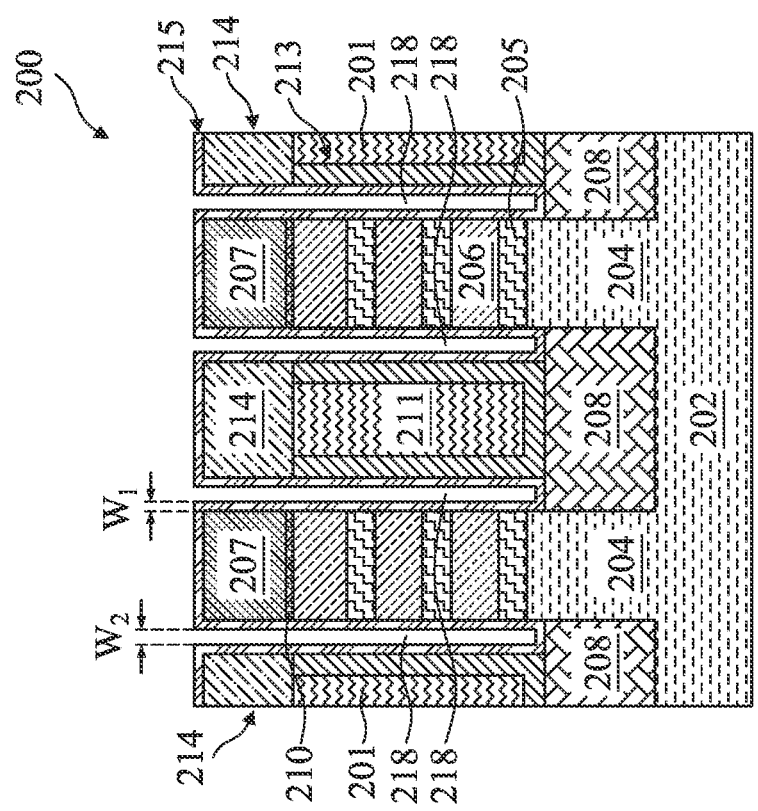
Figure 11A:
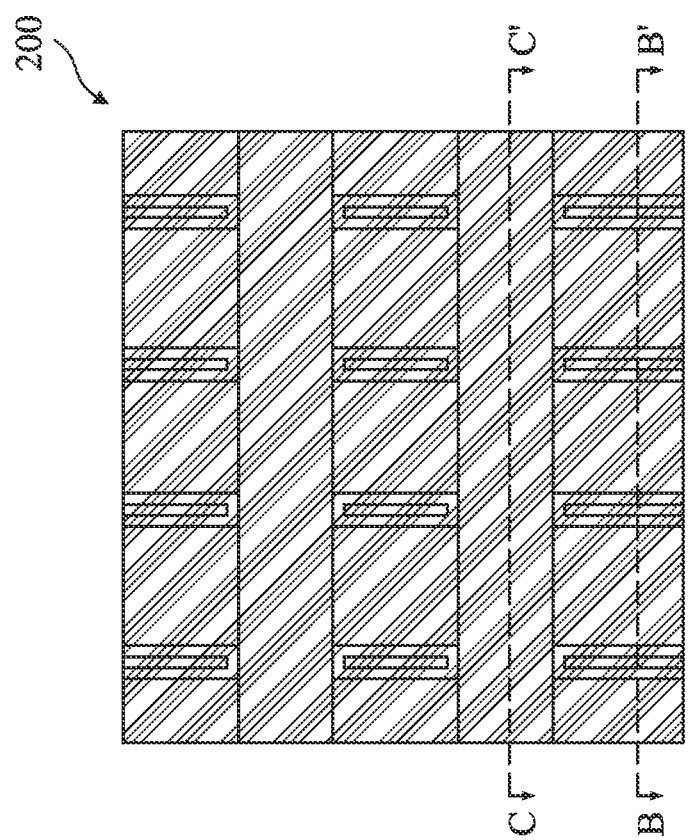
Figure 11C:
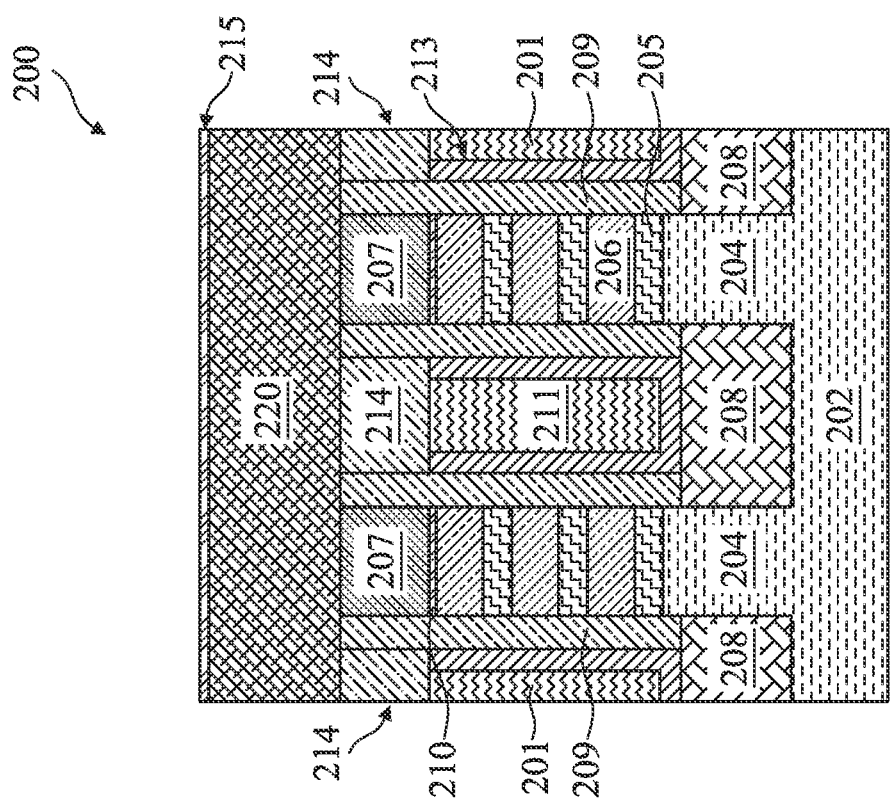

At operation 114, referring to FIGS. 11A-11C, method 100 forms a spacer layer 215 over the device 200, where the spacer layer 215 is formed conformally in the trenches 216 and over top surfaces of the dielectric helmets 214. The spacer layer 215 partially fills the trenches 216 to form a U-shaped layer that includes a trench 218 disposed between two sidewalls (or "arms"). In the present embodiments, each of the two sidewalls of the spacer layer 215 in the trench 216 has a thickness $w_1$ that is about 3 nanometers. In some embodiments, the trenches 218 each have a width $w_2$ ranging from about 2 nanometers to about 4 nanometers and a height $h_0$ ranging from about 65 nanometers to about 80 nanometers. In the present embodiments, the width $w_2$ is about 3 nanometers. In some embodiments, the width $w_2$ is about the same as a thickness of each sidewalls of the S/D spacer layer 215.

In some embodiments, the spacer layer 215 is formed by performing a conformal deposition process, such as atomic layer deposition (ALD) and/or CVD. In the present embodiments, the spacer layer 215 is formed conformally over the device 200 using ALD. In some embodiments, the spacer layer 215 includes $SiO_x$ ($1 \leq x \leq 2$), SiN, other suitable materials, or combinations thereof.

Figure 12B:
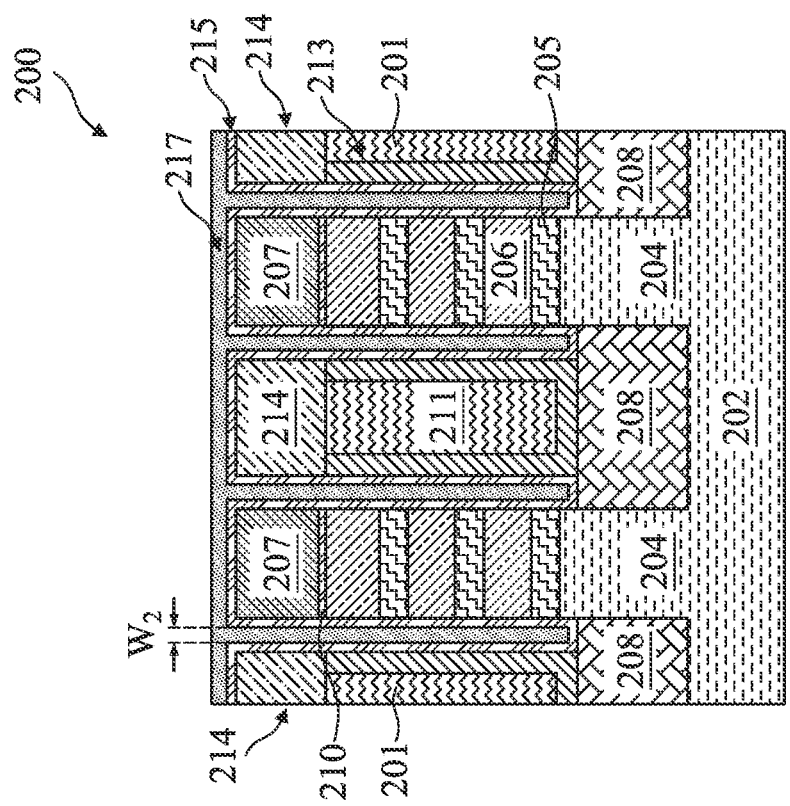
Figure 12A:
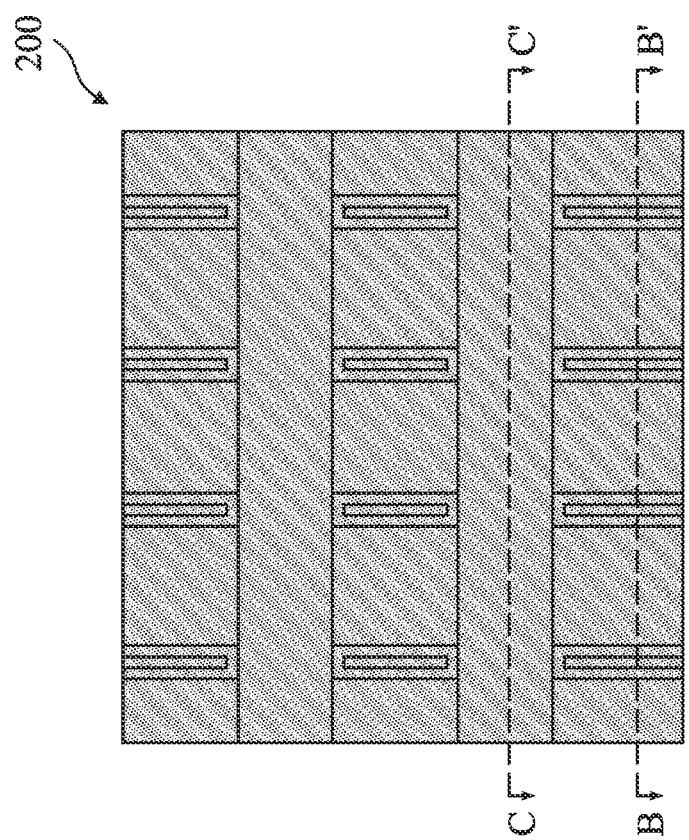
Figure 12C:
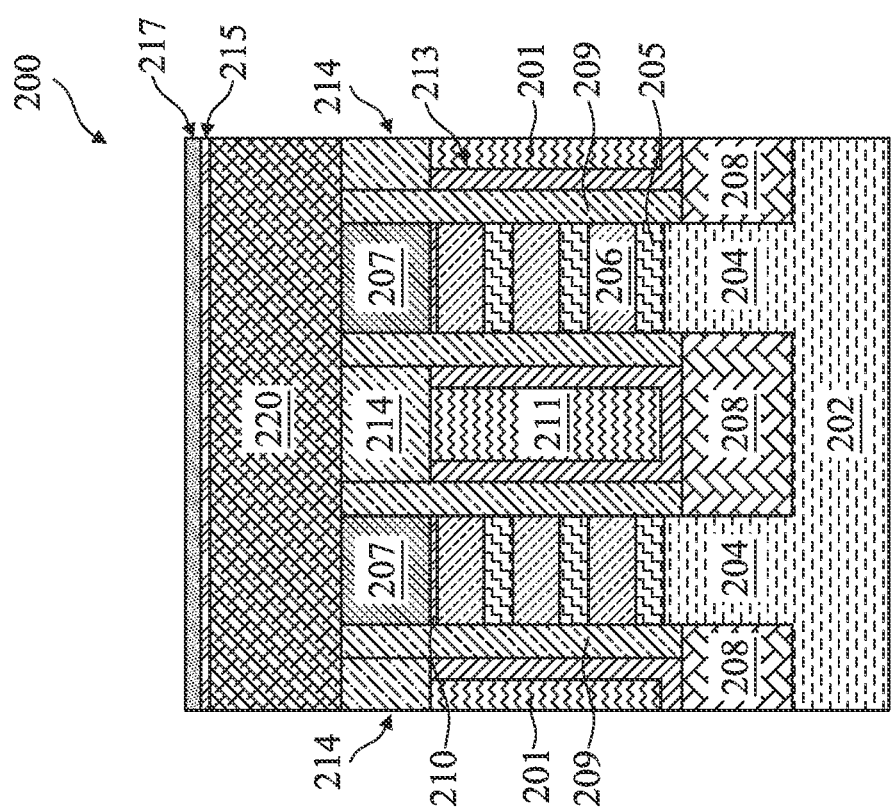

At operation 116, referring to FIGS. 12A-12C, method 100 forms a sacrificial layer 217 over the spacer layer 215, thereby filling the trenches 218. In the present embodiments, the sacrificial layer 217 includes a material different from that included in the spacer layer 215. In the present embodiments, the sacrificial layer 217 includes a material that is easy to fill the trenches 218 and is more flowable than the spacer layer 215. In some embodiments, the sacrificial layer 217 exhibits high etching selectivity, e.g., about 5 to about 10, with respect to each of the spacer layer 215, the dielectric helmets 214, and the fins 204. In the present embodiments, the sacrificial layer 217 includes an oxide, a low-k material, an organic material, other suitable materials, or combinations thereof. In some examples, the oxide includes $SiO_x$ (where $1 \le x \le 2$) or flowable oxides (e.g., tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.). In some examples, the organic material includes an anti-reflective coating (ARC) material, which generally includes a carbon-based polymer. In some embodiments, the sacrificial layer 217 includes an oxide and the spacer layer 215 includes SiN. In some embodiments, the sacrificial layer 217 includes an ARC material and the spacer layer 215 includes $SiO_x$ (where $1 \le x \le 2$). In some embodiments, the sacrificial layer 217 includes ARC and the spacer layer 215 includes silicon oxide (SiO and/or $SiO_2$) and/or silicon nitride (SiN). In some embodiments, the sacrificial layer 217 is formed by performing a conformal deposition process. In some embodiments, the sacrificial layer 217 is formed by ALD, CVD, FCVD, SOG, other suitable methods, or combinations thereof. In the present embodiments, a thickness of the sacrificial layer 217 is defined by $w_2$.

Figures 13A, 13B:
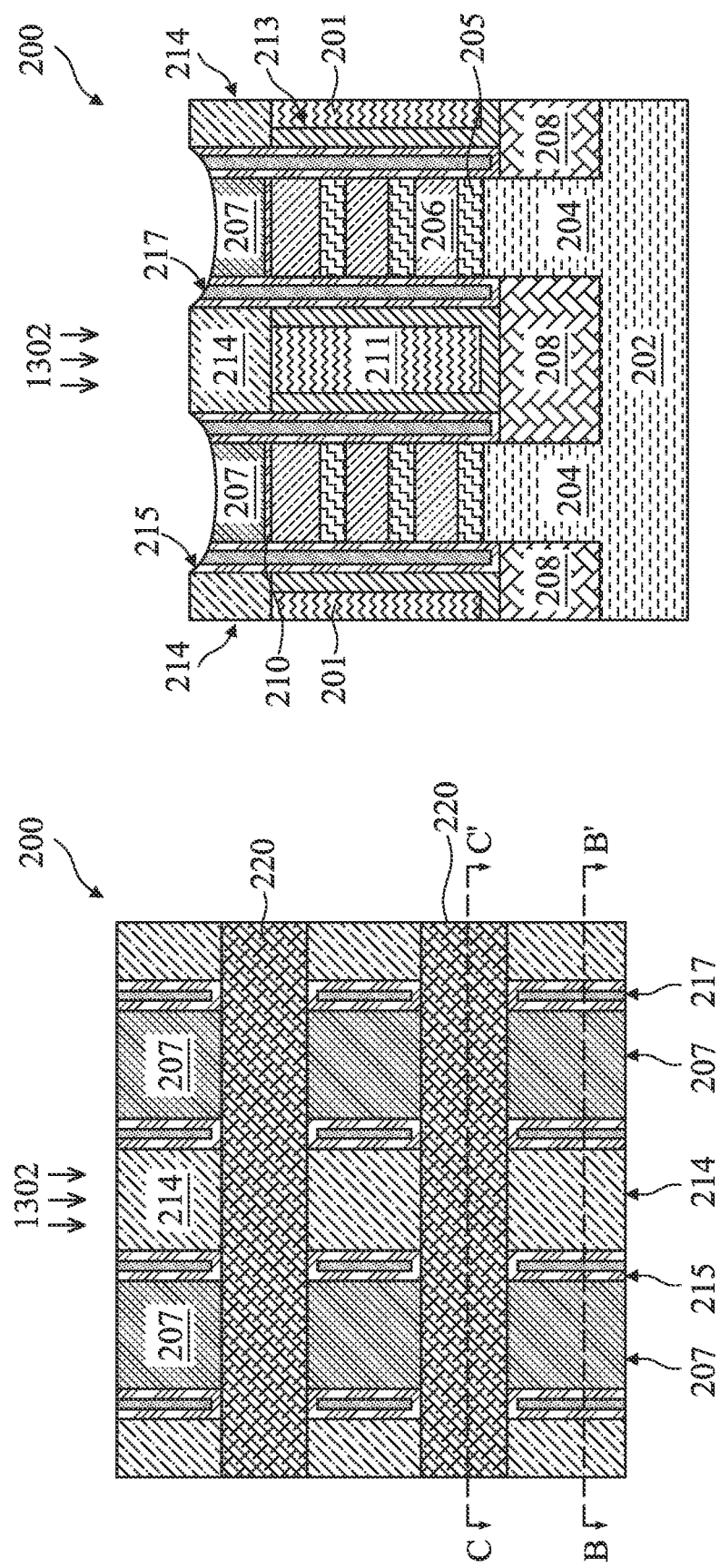
Figure 13C:
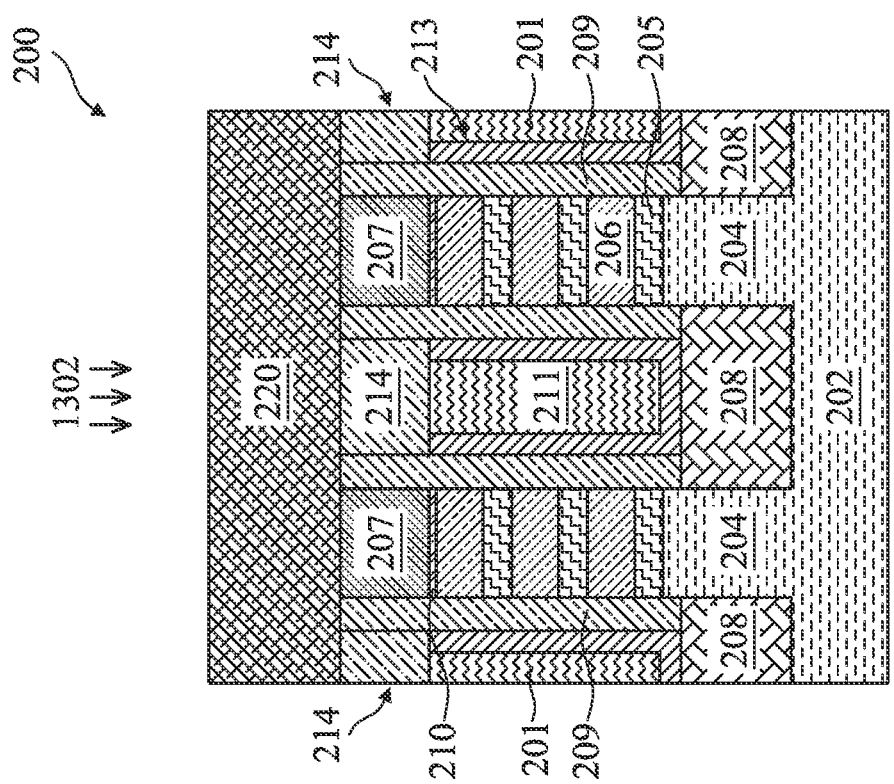

At operation 118, referring to FIGS. 13A-13C, method 100 removes portions of the spacer layer 215 and the sacrificial layer 217 in process 1302, thereby exposing top surfaces of the dielectric helmets 214 and top surfaces of the hard mask 207. In some embodiments, the process 1302 is an etching back process to selectively remove portions of the spacer layer 215 and the sacrificial layer 217 with respect to the dielectric helmets 214 and the hard masks 207. In some instances, though the process 1302 inadvertently over-etches portions of the hard mask 207, the spacer layer 215, and the sacrificial layer 217, such that the top surfaces of these components are below the top surfaces of the dielectric helmets 214, the components still remain substantially intact. In some embodiments, the process 1302 includes dry etching, wet etching, and/or a combination thereof.

Figure 14B:
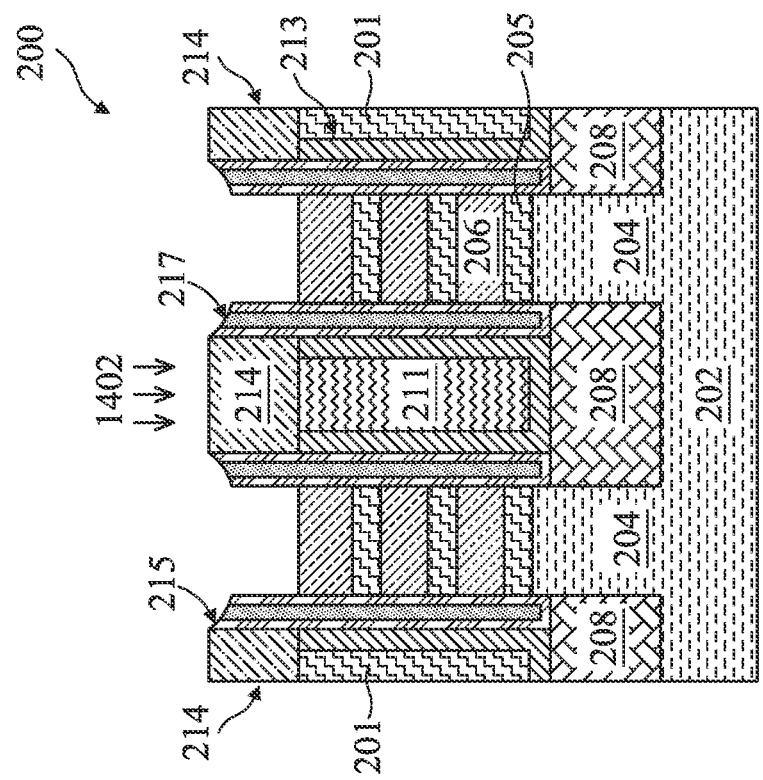
Figure 14A:
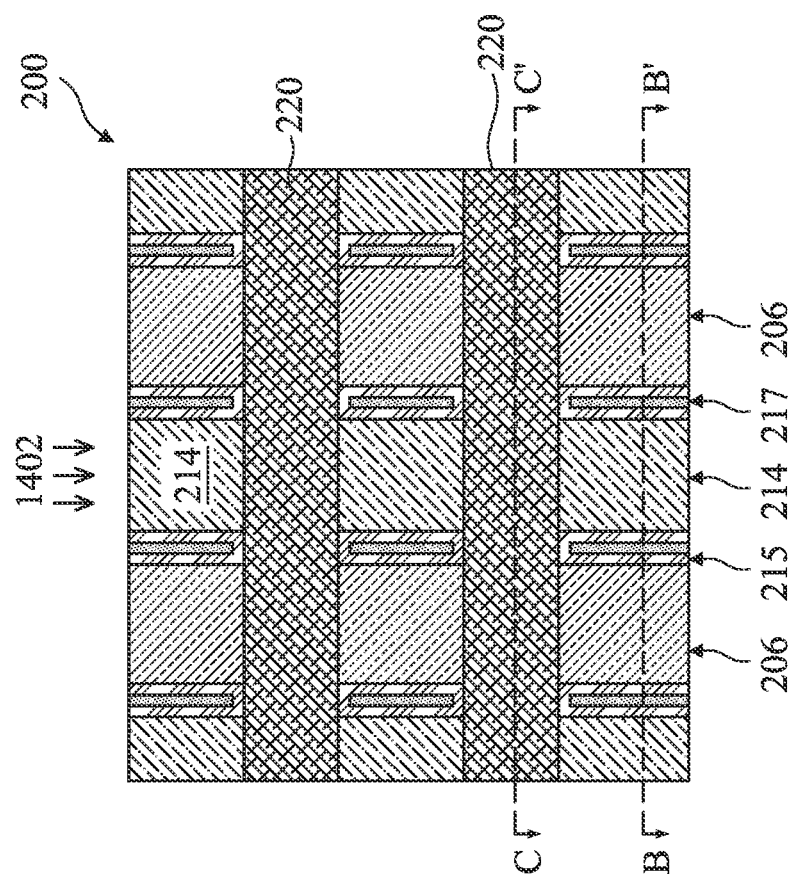
Figure 14C:
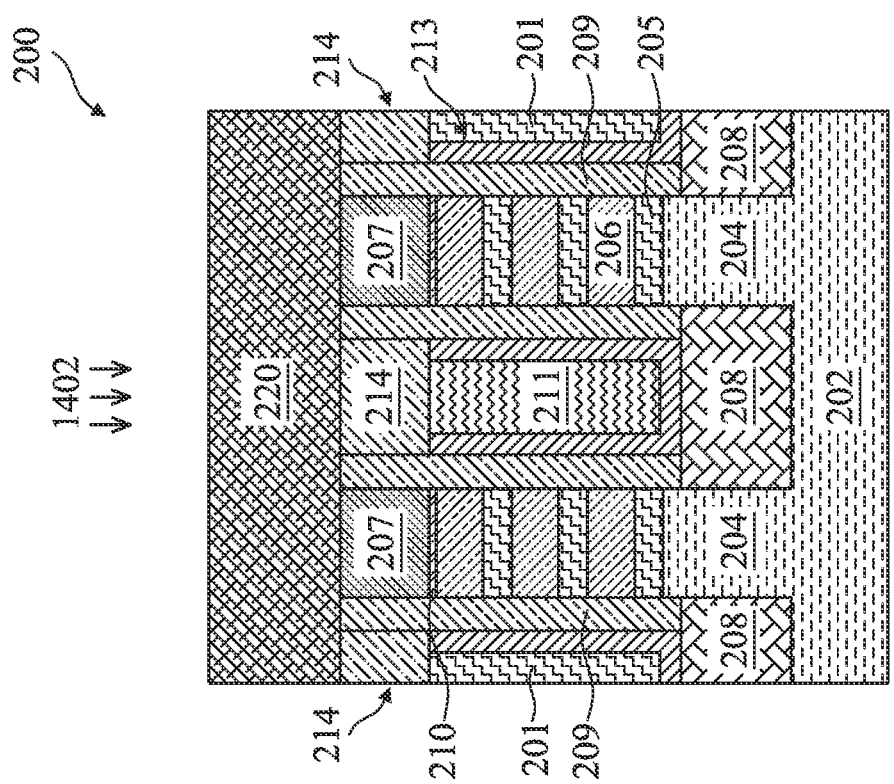
Figure 15B:
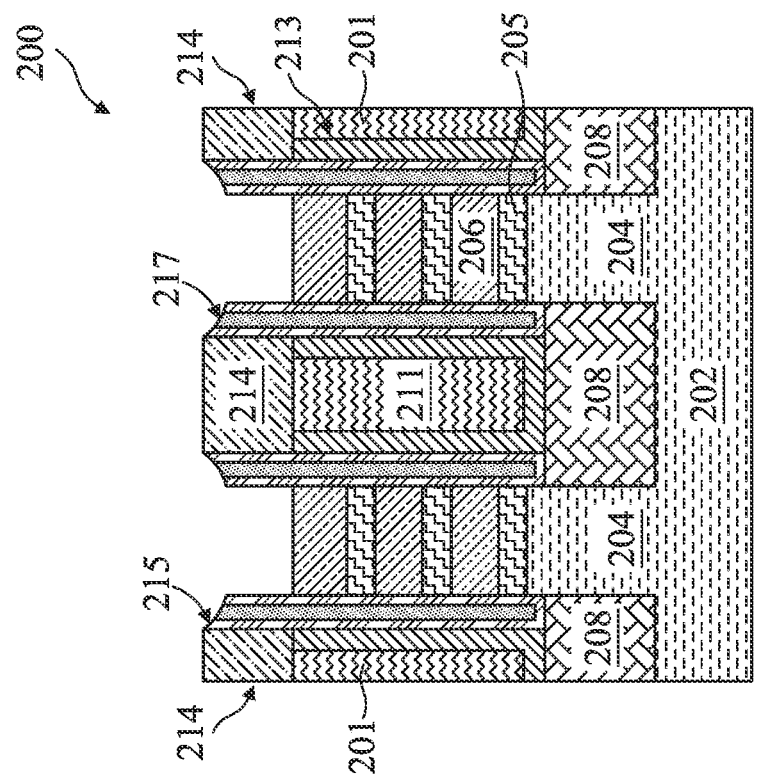
Figure 15A:
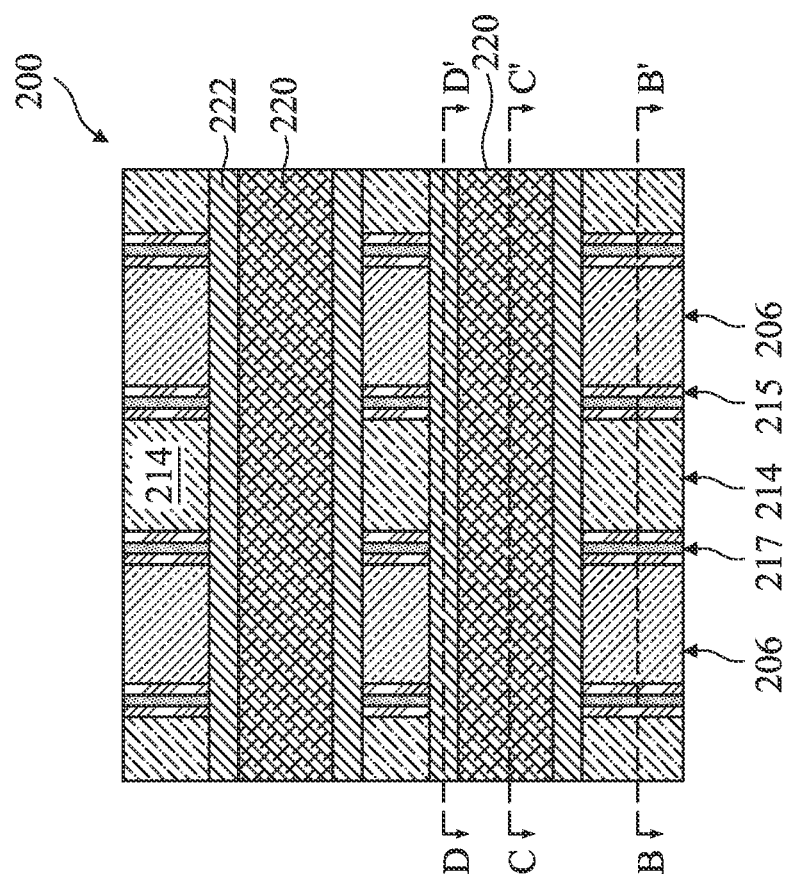

Referring to FIGS. 14A-14C, method 100 removes portions of the hard mask 207 and the oxide layer 210 in the S/D regions of the fins 204 in a process 1402 to expose the topmost channel layer 206 as shown in FIG. 14B, while the portions of the hard mask 207 and the oxide layer 210 under the dummy gate stacks 220 remain intact as shown in FIG. 14C. In some embodiments, the removing of the hard mask 207 utilizes a method the same as or similar to the process 1002 as shown in FIGS. 10A-10C.

Figure 15D:
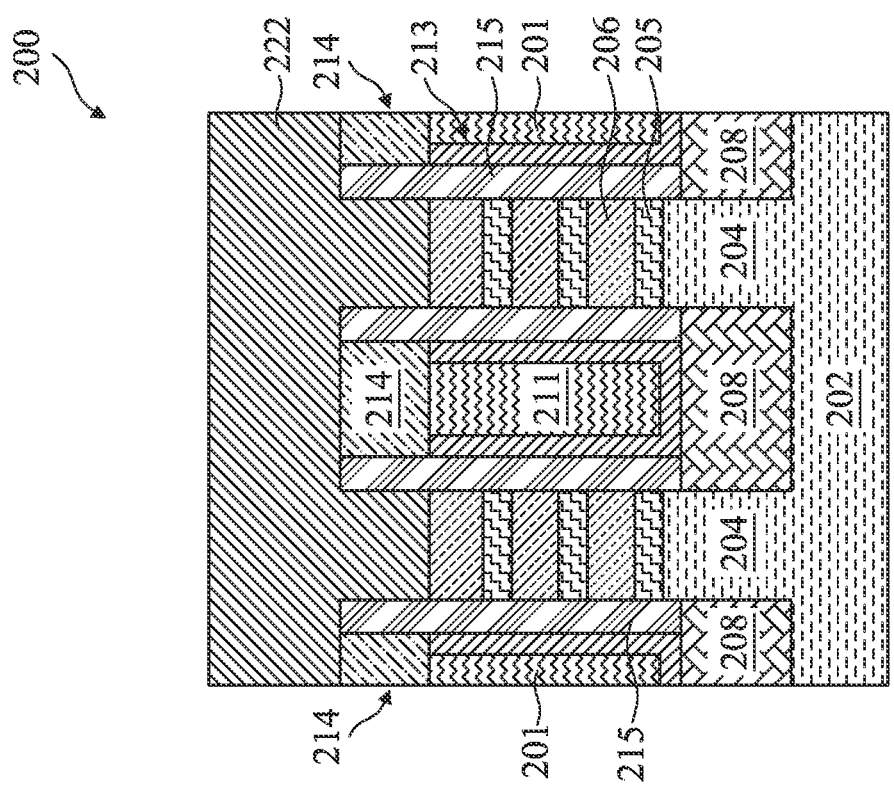
FIGS. 15D, 16D, 17D, 18D, 19D, 20D, 21D, 22D, 23D, 24D, and 25D are cross-sectional views of the semiconductor device taken along line DD' as shown in FIG. 15A during intermediate stages of the method shown in FIGS. 1A and/or 1B according to various embodiments of the present disclosure.
Figure 15C:
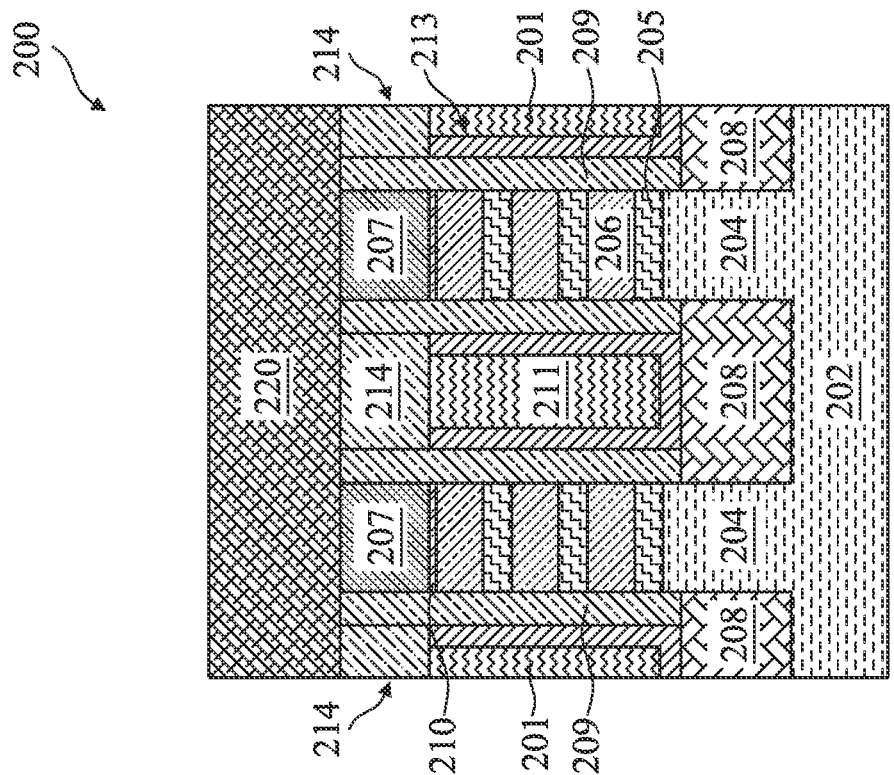

Referring to FIGS. 15A and 15D, method 100 forms top gate spacers 222 over sidewalls of the dummy gate stack 220. In the present embodiments, the top gate spacers 222 are disposed over and in contact with the dielectric helmets 214, the topmost channel layer 206, and portions of the spacer layer 215 on the sidewalls of the channel region of the fins 204 as depicted in FIG. 15D. In the present embodiments, the top gate spacers 222 contact the remaining portions of the hard mask 207 and the oxide layer 210 under the dummy gate stacks 220. The top gate spacers 222 may be a single-layer structure or a multi-layer structure and may include silicon oxide, SiN, SiC, SiON, SiOC, SiCN, air, a low-k dielectric material, a high-k dielectric material (e.g., hafnium oxide ($HfO_2$), lanthanum oxide ($La_2O_3$), etc.), other suitable materials, or combinations thereof. The top gate spacers 222 may be formed by first depositing a dielectric layer over the dummy gate stacks 220 via a suitable deposition method (e.g., CVD and/or ALD) and subsequently removing portions of the dielectric layer in an anisotropic (e.g., directional) etching process (e.g., a dry etching process), leaving the top gate spacers 222 on the sidewalls of the dummy gate stacks 220.

Figure 16B:
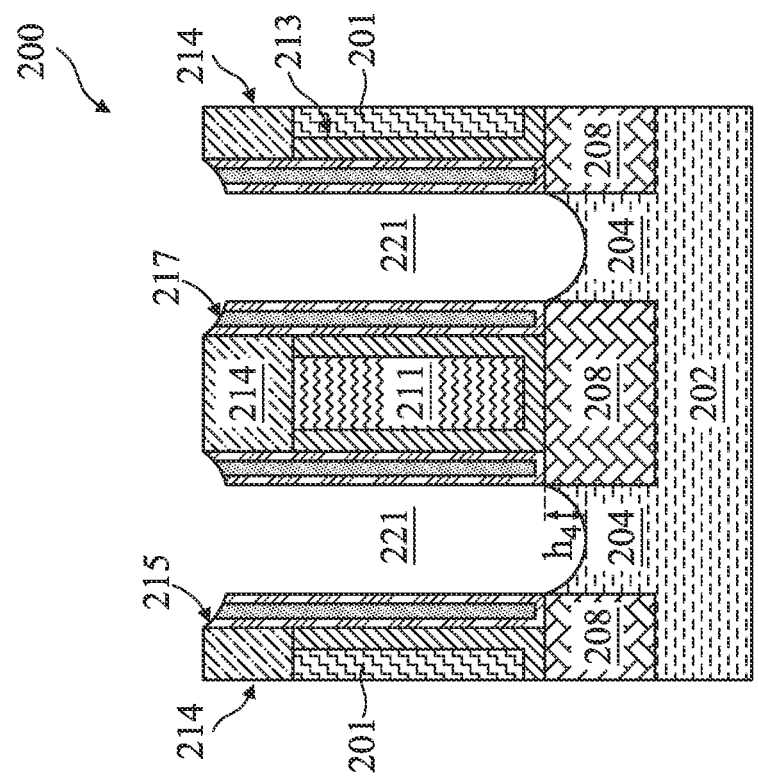
Figure 16A:
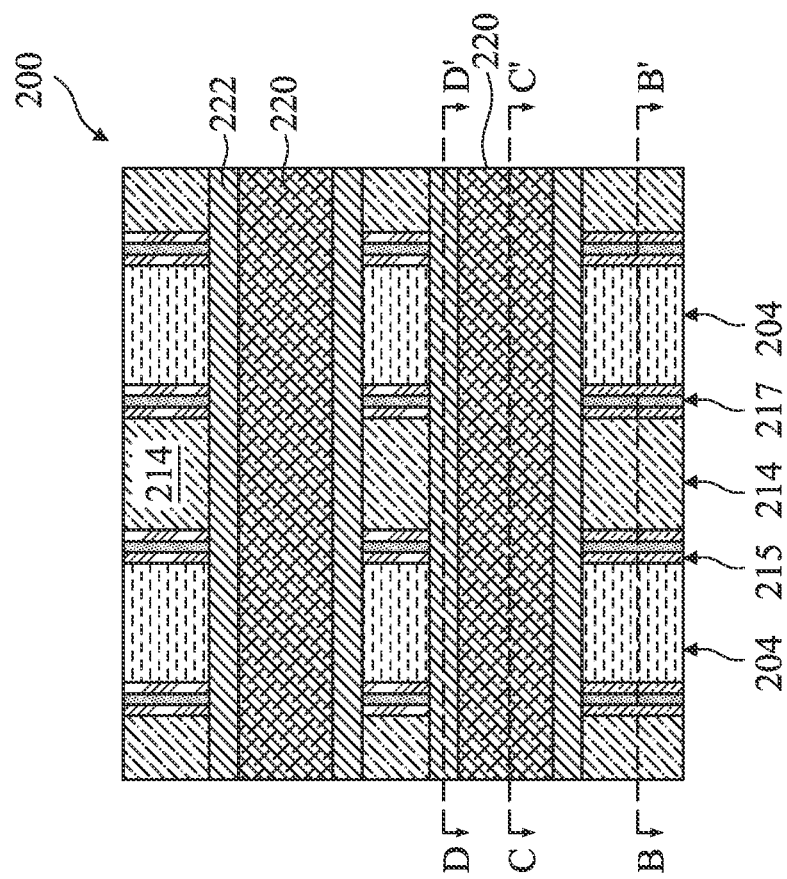
Figure 16C:
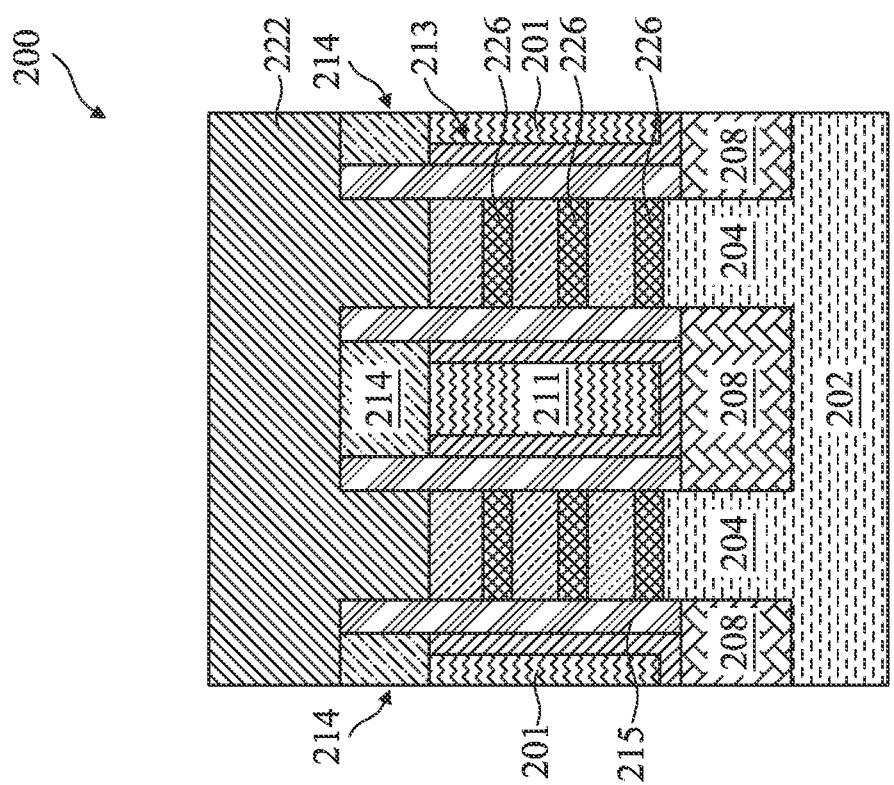

At operation 120, referring to FIGS. 16A-16D, method 100 forms S/D recesses 221 in the fins 204 adjacent to the dummy gate stacks 220. In the present embodiments, method 100 implements an etching process that selectively removes portions of the fins 204 in the S/D regions without removing, or substantially removing, the dummy gate stacks 220, the dielectric helmets 214, the spacer layer 215 and the sacrificial layer 217. In the present embodiments, as depicted in FIG. 16B, sidewalls of the spacer layer 215 and top surfaces of remaining bottom portions of the fins 204 are exposed in each of the S/D recesses 221. In some embodiments, the remaining bottom portions of the fins 204 are free of the ML and have a curved top surface, where a height $h_4$ between the lowest point of the curved surface and a bottom surface of the spacer layer 215 is about 5 nanometers to about 10 nanometers. In some embodiments, the etching process is a dry or wet etching process employing a suitable etchant capable of removing Si (i.e., the channel layers 206) and SiGe (i.e., the non-channel layers 205) of the ML. In some non-limiting examples, a dry etchant may be a chlorine-containing etchant including $Cl_2$, $SiCl_4$, $BCl_3$, other chlorine-containing gas, or combinations thereof. A cleaning process may subsequently be performed to clean the S/D recesses with a hydrofluoric acid (HF) solution or other suitable solution.

Figure 16D:
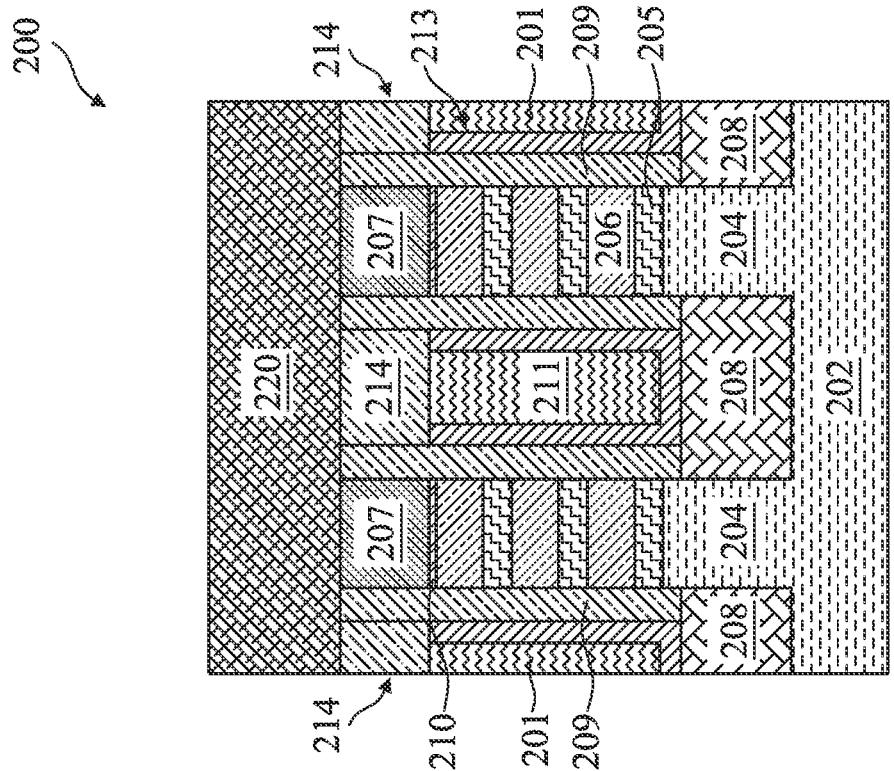

Thereafter, referring to FIG. 16D, the method 100 forms inner gate spacers 226 on sidewalls of the non-channel layers 205 that are exposed in the S/D recesses 221. The inner gate spacers 226 may be a single-layer structure or a multi-layer structure and may include silicon oxide, SiN, SiCN, SiOC, SiON, SiOCN, a low-k dielectric material, air, a high-k dielectric material, hafnium oxide ($HfO_2$), lanthanum oxide ($La_2O_3$), other suitable dielectric material, or combination thereof. In some embodiments, the inner gate spacers 226 have a composition different from that of the top gate spacers 222. Forming the inner gate spacers 226 includes performing a series of etching and deposition processes. For example, forming the inner gate spacers 226 may begin with selectively removing portions of the non-channel layers 205 without removing, or substantially removing, portions of the channel layers 206 to form trenches (not depicted). The non-channel layers 205 may be etched by a dry etching process. Subsequently, one or more dielectric layers are deposited in the trenches by any suitable method, such as ALD, CVD, PVD, other suitable methods, or combinations thereof, followed by one or more etching processes to remove (i.e., etch back) excess dielectric layer(s) deposited on surfaces of the channel layers 206 that are exposed in the S/D recesses, thereby forming the inner gate spacers 226 as depicted in FIG. 16D.

Figures 17A, 17B:
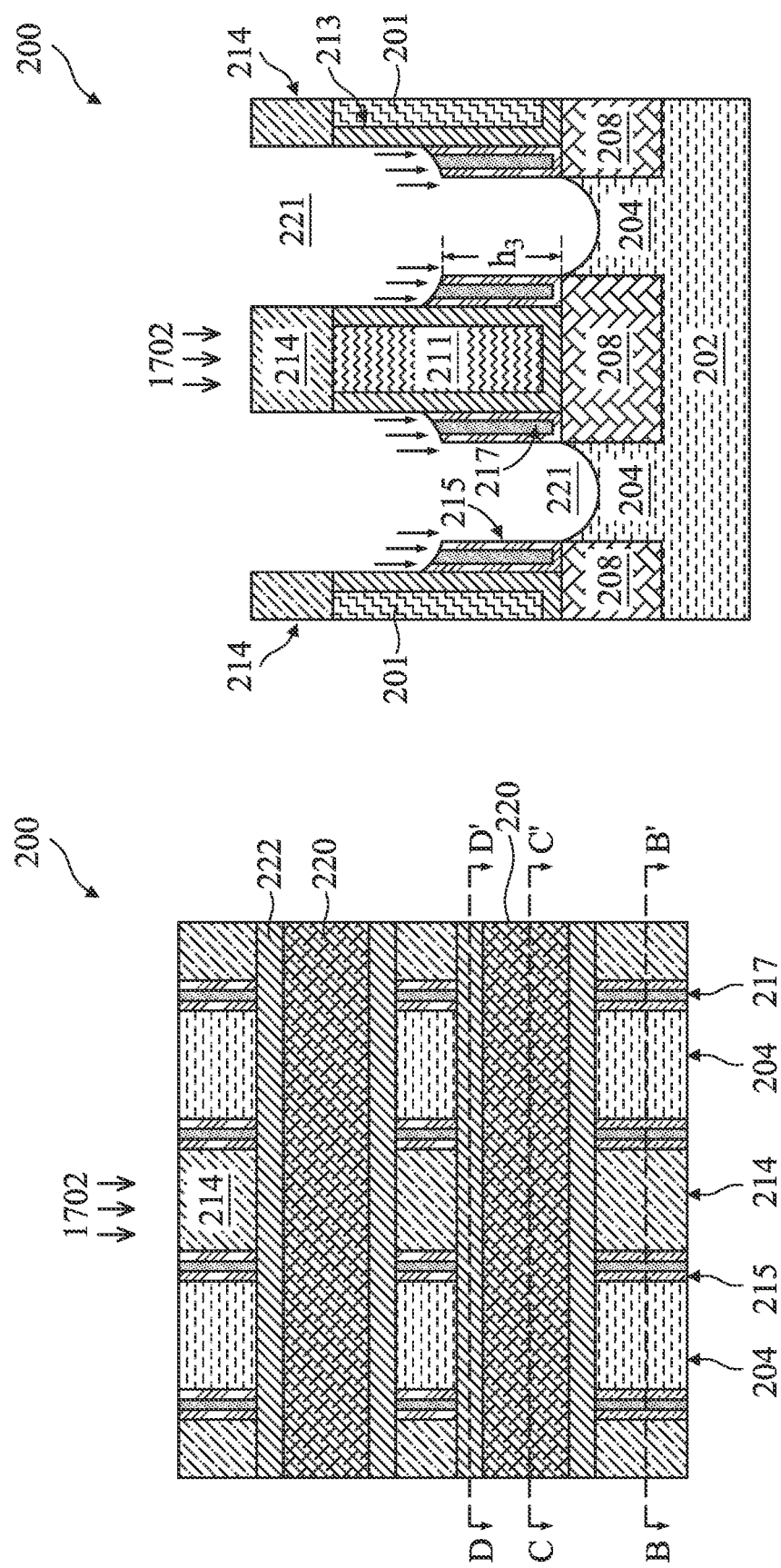
Figure 17D:
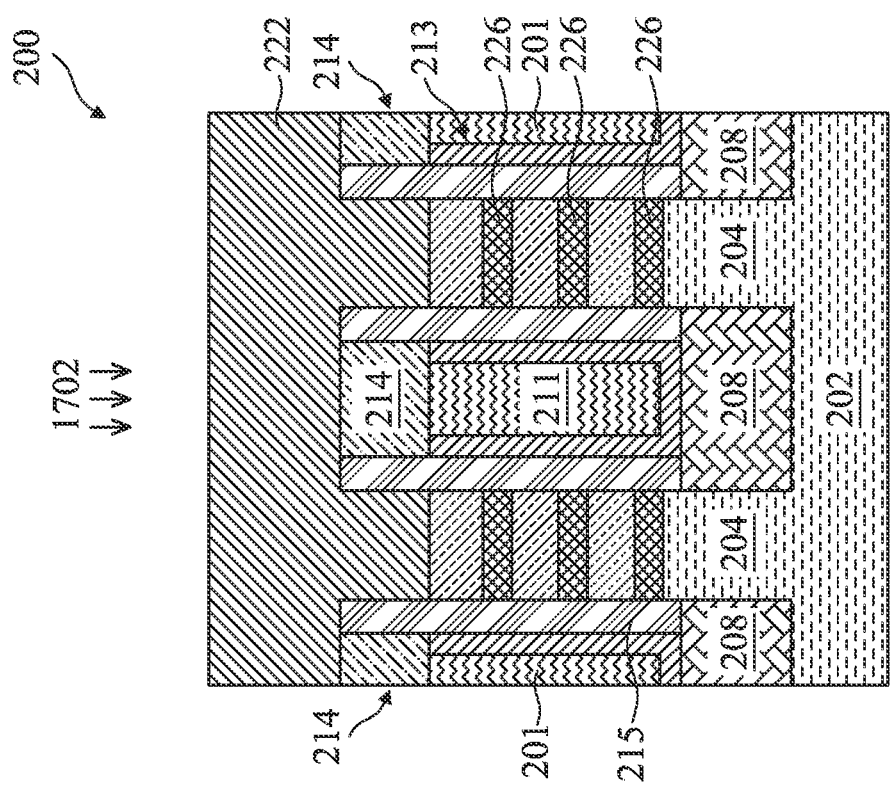
Figure 17C:
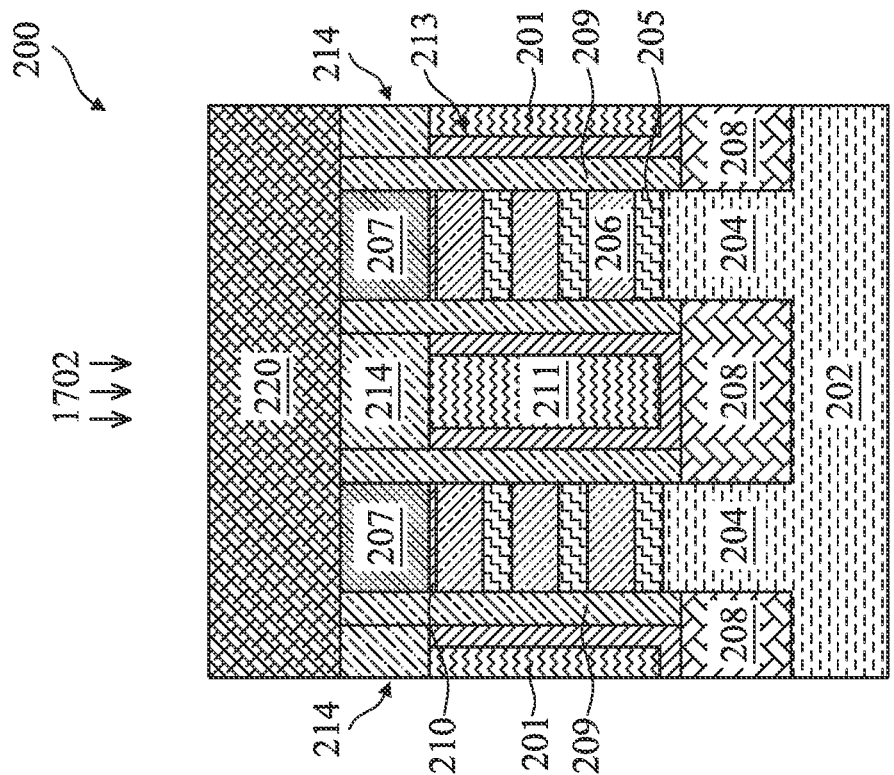

At operation 122, referring to FIGS. 17A-17D, method 100 performs a first etching process 1702 to recess both the spacer layer 215 and the sacrificial layer 217 in the S/D recesses 221. The first etching process 1702 selectively removes top portions of the spacer layer 215 and the sacrificial layer 217, thereby forming the shortened spacer layer 215 and the shortened sacrificial layer 217 along sidewalls of the dielectric structures 211. In some embodiments, the first etching process 1702 utilizes an etchant effective in removing both the spacer layer 215 and the sacrificial layer 217 at about the same etching rate. In other words, the selectivity between the spacer layer 215 and the sacrificial layer 217 in the first etching process 1702 is very small and therefore negligible. In some embodiments, a top surface of the shortened spacer layer 215 is below a bottom surface of the dielectric helmets 214, and therefore free of contact with the dielectric helmets 214 as depicted in FIG. 17B. In the present embodiments, the etching selectivity of each of the spacer layer 215 and the sacrificial layer 217 with respect to the surrounding components (e.g., the dielectric helmets 214, the fin 204, and the dielectric structures 211) is about 5 to about 10. In some embodiments, the first etching process 1702 includes wet etching, dry etching, or a combination thereof. In some embodiments, the first etching process 1702 includes plasma bombardment. In the present embodiments, the first etching process 1702 includes an anisotropic dry etching process. The shortened spacer layer 215 along each of the sidewalls of the dielectric structures 211 is referred as S/D spacer 215 hereafter for convenience.

In some embodiments, the S/D spacer 215 maintains the U-shape after the first etching process 1702, where the concave portion of the U-shape is filled by the shortened sacrificial layer 217. In the present embodiments, the S/D spacer 215 has a first sidewall disposed along a sidewall of the dielectric structures 211 and a second sidewall that is opposite to and further away from the first sidewall. In some examples, the first sidewall and the second sidewall have the same height. In the present embodiments, the first sidewall is greater in height than the second sidewall, i.e., portions of the spacer layer 215 away from the dielectric structures 211 are etched more than those near the dielectric structures 211. In the present embodiments, the shortened sacrificial layer 217 has a height less than that of the first sidewall of the S/D spacer 215 but greater than that of the second sidewall of the S/D spacer.

The height of the S/D spacer 215 and the shortened sacrificial layer 217 are controllable by adjusting the operation parameters of the first etching process 1702, such as process duration. By adjusting the height of the S/D spacer 215, a cross-sectional area of the subsequently formed S/D feature can be controlled to improve device performance (e.g., reducing parasitic capacitance) as explained in detail below. In some embodiments, a height $h_3$ measured from a bottom surface to a top surface of the second sidewall is about 10 nanometers to about 30 nanometers.

At operation 124, referring to FIGS. 18A-18F, method 100 performs a second etching process 1802 to selectively remove the sacrificial layer 217 with respect to the S/D spacer 215, thereby forming an air gap 219 within the S/D spacer 215 as depicted in FIG. 18B. The air gap 219 further reduced the dielectric constant of the S/D spacer 215, therefore, further reduced the parasitic capacitance of the device (e.g., reduced the parasitic capacitance along the sidewalls of the S/D feature 224). The air gap 219 is outlined in dotted lines in FIG. 18A. An etching selectivity of the shortened sacrificial layer 217 with respect to the S/D spacer 215 (and other surrounding components, such as the dielectric helmets 214 or the dielectric structure 211) is about 5 to about 10 during the second etching process 1802. In some embodiments, the second etching process 1802 includes dry etching, wet etching, RIE, and/or other suitable processes. In some embodiments, the second etching process 1802 includes solvent stripping (e.g., if the sacrificial layer 217 includes organic materials). In the present embodiments, the second etching process 1802 includes an isotropic wet etching process.

At operation 126, referring to FIGS. 19A-19F, method 100 forms an S/D feature 224 in each of the S/D recess 221 in a process 1902. The S/D feature 224 may be suitable for forming a p-type FET device (i.e., including a p-type epitaxial material) or, alternatively, an n-type FET device (i.e., including an n-type epitaxial material). The p-type epitaxial material may include one or more epitaxial layers of silicon germanium (epi SiGe) each doped with a p-type dopant such as boron, germanium, indium, gallium, other p-type dopants, or combinations thereof. The n-type epitaxial material may include one or more epitaxial layers of silicon (epi Si) or silicon carbon (epi SiC) each doped with an n-type dopant such as arsenic, phosphorus, other n-type dopants, or combinations thereof. In some embodiments, one or more epitaxy growth processes are performed to grow an epitaxial material in each S/D recess and over the inner gate spacers 226. For example, method 100 may implement an epitaxy growth process similar to that discussed above with respect to forming the ML. In some embodiments, the epitaxial material is doped in-situ by adding a dopant to a source material during the epitaxial growth process. In some embodiments, the epitaxial material is doped by an ion implantation process after performing the deposition process. In some embodiments, an annealing process is subsequently performed to activate the dopants in the S/D features 224.

Figures 1, 19B:
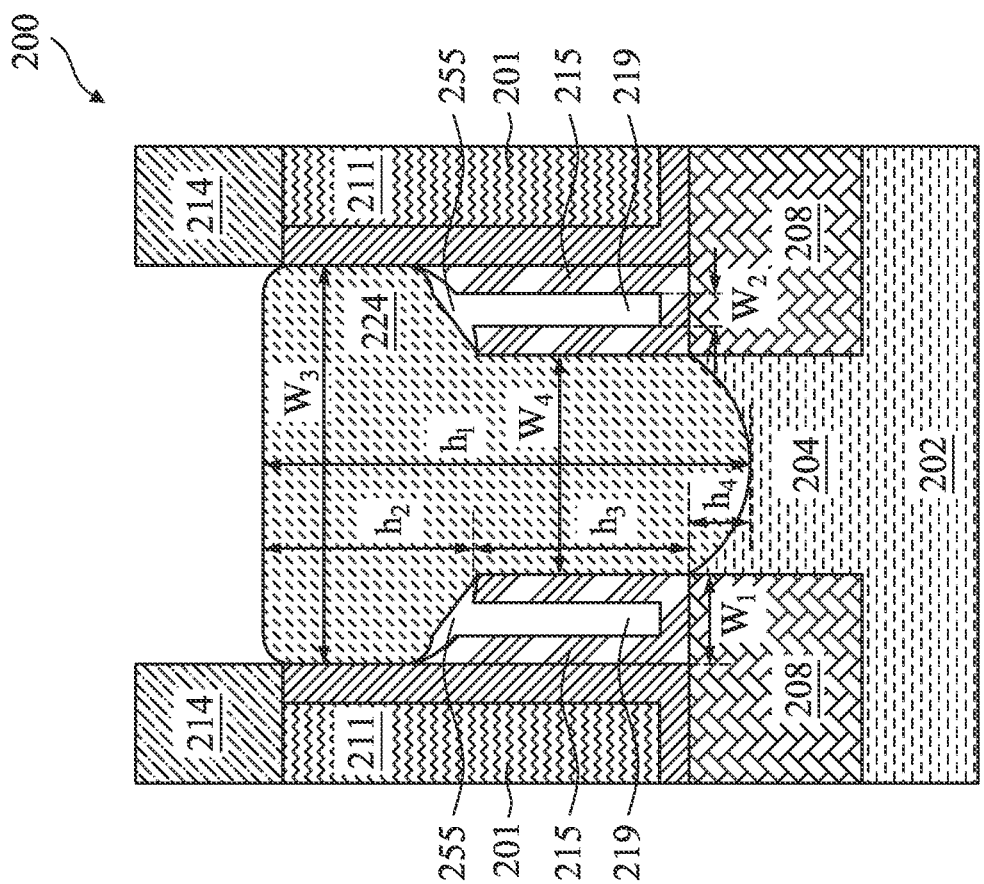

In some embodiments, the S/D feature 224 is epitaxially grown from the recessed fin 204 in the S/D region as depicted in FIGS. 19B and 19B-1. In some embodiments, the S/D feature 224 (defined by a height $h_1$) includes a top portion (defined by a height $h_2$ and a width $w_3$) disposed between the dielectric structures 211, a middle portion (defined by a height $h_3$ and a width $w_4$) disposed between S/D spacers 215, and a bottom portion (defined by a height $h_4$) disposed below the lowermost surface of the S/D spacer 215. In the present embodiments, the height $h_1$ is a sum of the height $h_2$, the height $h_3$ and the height $h_4$. In some embodiments, the height $h_1$ is about 55 nanometers to about 60 nanometers. In some embodiments, the height $h_4$ is about 5 nanometers to about 10 nanometers. In the present embodiments, the width $w_3$ is greater than the width $w_4$.

Figures 2, 19B:
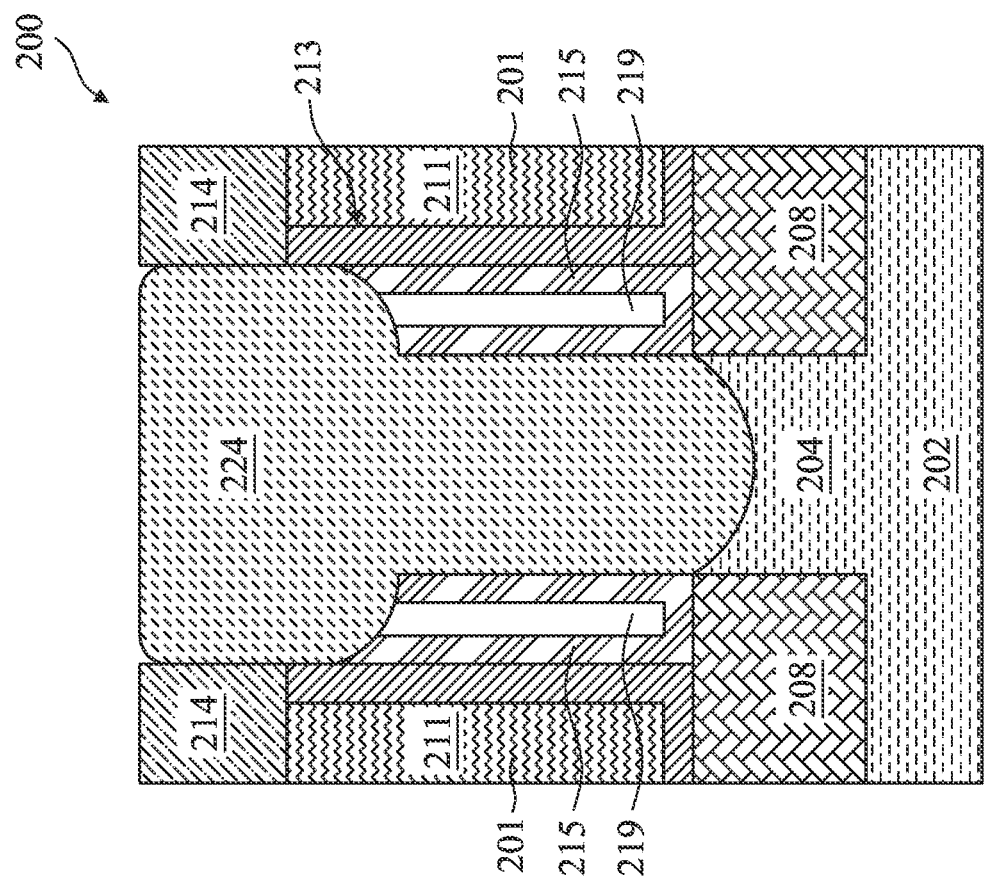
Figure 20B:
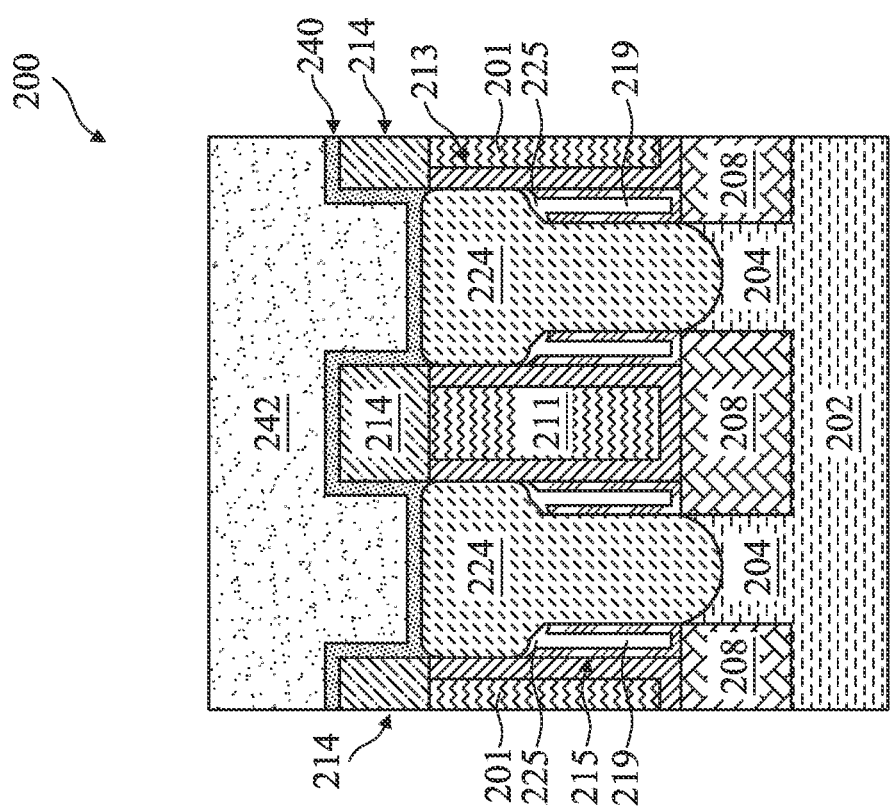
Figure 20A:
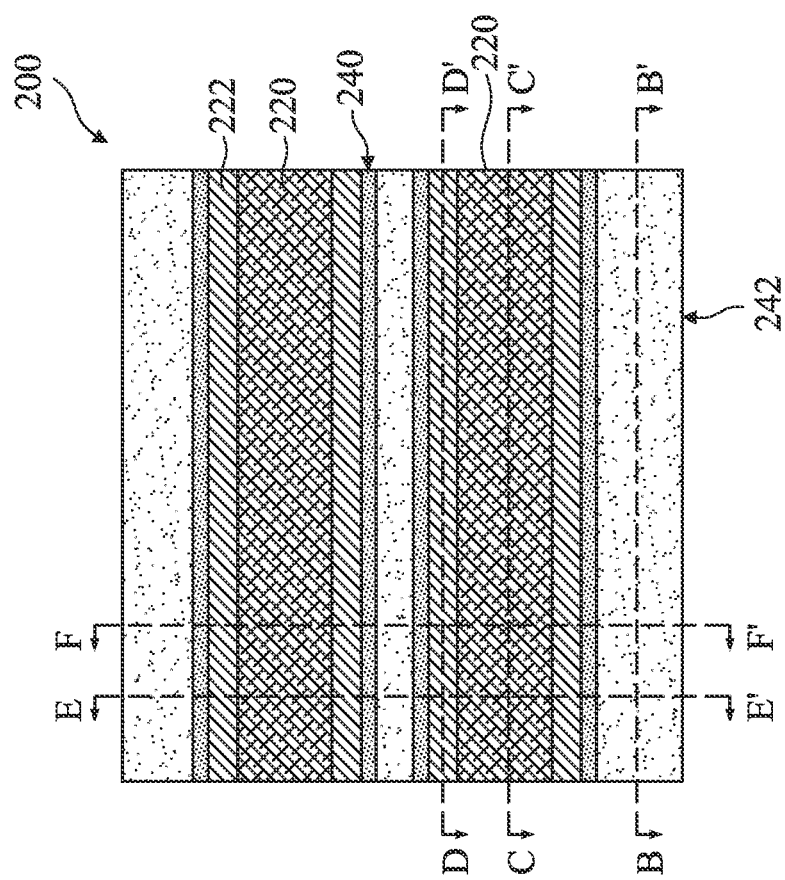
Figure 20D:
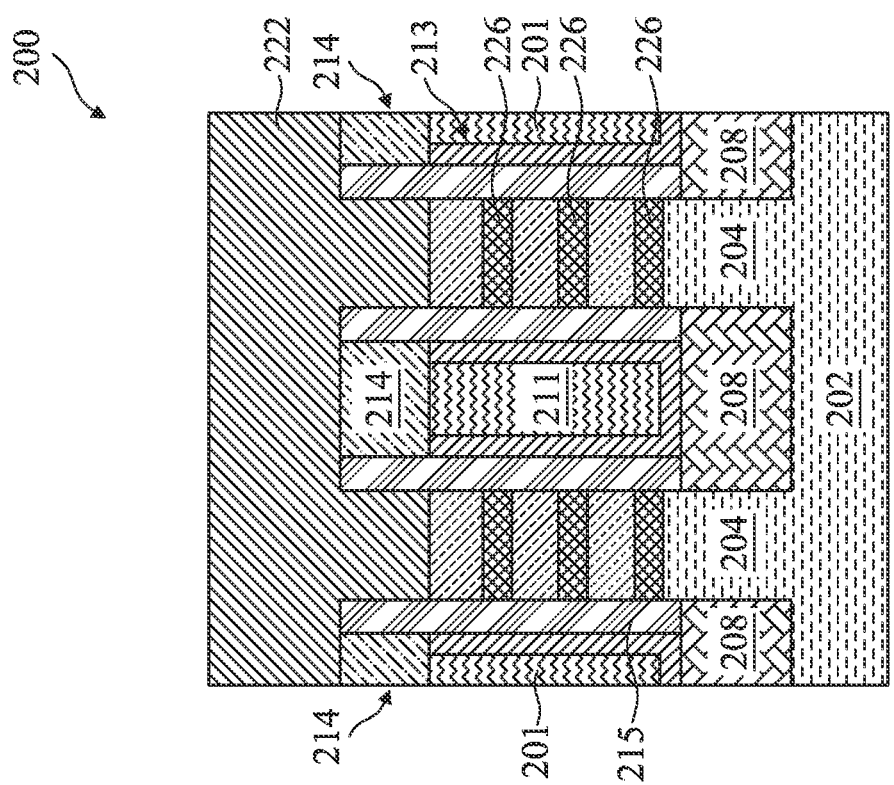
Figure 20C:
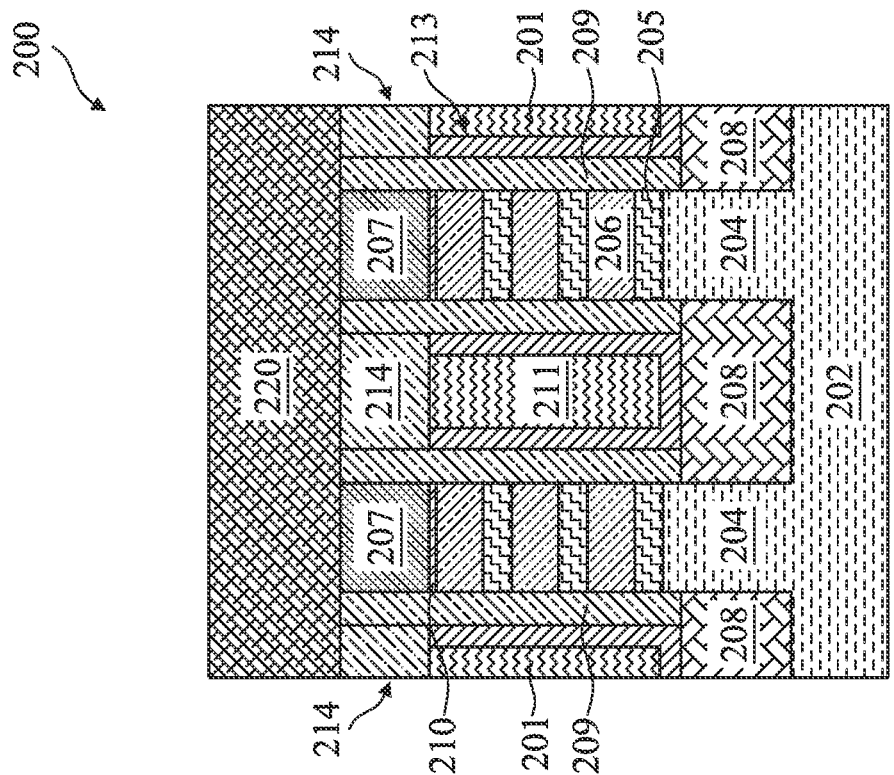
Figures 20E, 20F:
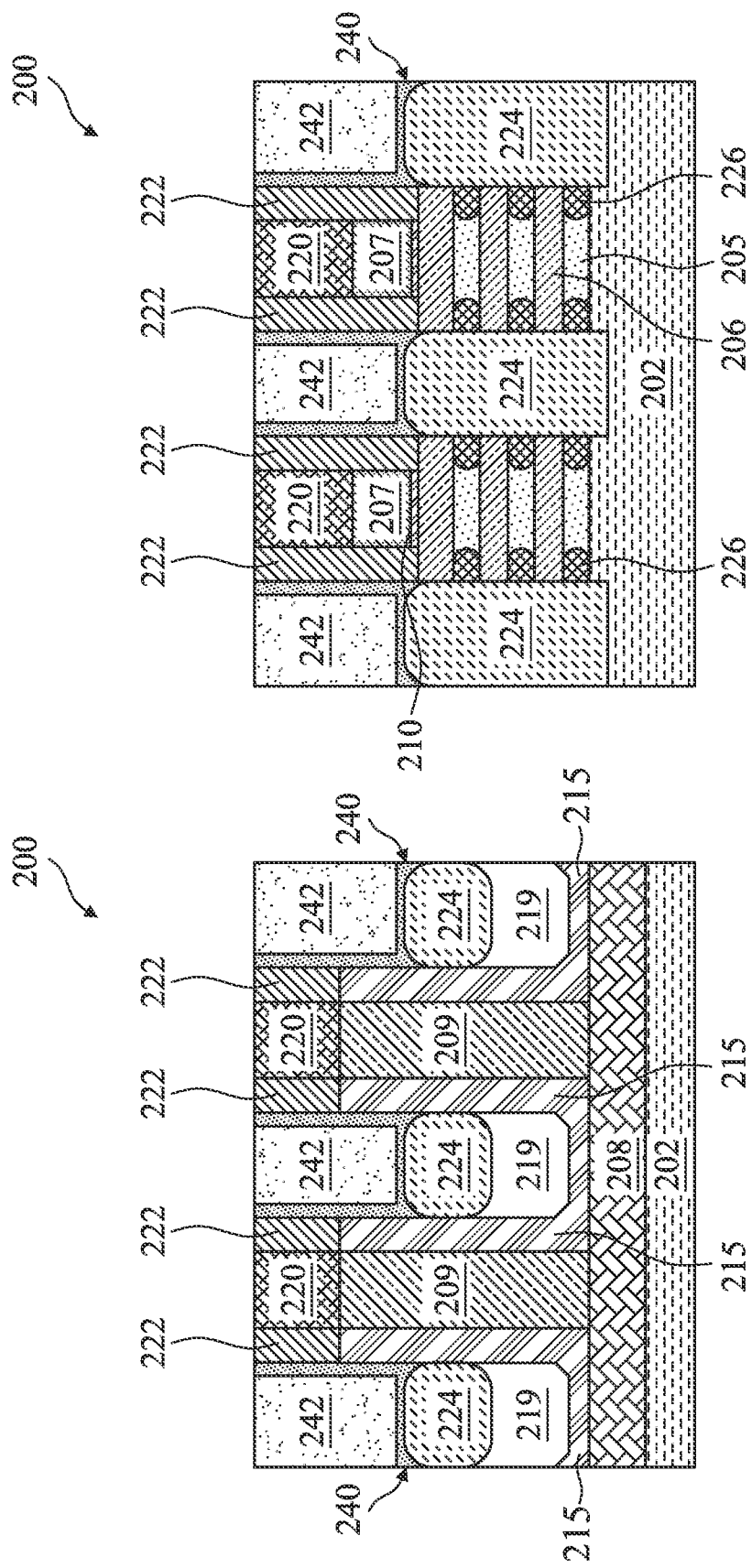

Still referring to FIGS. 19B and 19B-1, the top portion of the S/D feature 224 extends laterally beyond the bottom portion and over the S/D spacer 215 and the air gap 219. In the present embodiments, as depicted in FIG. 19B and FIG. 19B-1 (an enlarged image of portion 223 in FIG. 19B), the top portion of the S/D feature 224 forms an air gap 225 over the S/D spacer 215 and the air gap 219. In some embodiments, the air gap 225 is disposed between, and thereby being defined by, a top surface of the S/D spacer 215, a bottom surface of the top portion of the S/D feature 224 and the sidewall of the dielectric structures 211. In some embodiments, as shown in FIG. 19B-2, the bottom surface of the top portion of the S/D feature 224 directly contacts the top surface of the S/D spacer 215, thereby sealing the top of the air gap 219 without creating any additional air gap thereover. In other words, the top of the air gap 219 is defined by the bottom surface of the top portion of the S/D feature 224, while two side surfaces and a bottom surface of the air gap 219 are defined by the S/D spacer 215. In some embodiments, the presence of the air gap 225 is determined by morphology of the S/D feature 224, which is impacted by the type of dopant included therein. For example, the embodiment depicted in FIG. 19B-1 may be applicable when the S/D feature 224 is a p-type S/D feature, and the embodiment depicted in FIG. 19B-2 may be applicable when the S/D feature 224 is an n-type S/D feature. In some embodiments, the height $h_1$ of the S/D feature 224 is about 55 nanometers to about 60 nanometers.

Generally, the parasitic capacitance of an S/D feature is proportional to its cross-sectional area and the dielectric constant of the nearby components. The present embodiments are directed to methods of reducing the cross-sectional area of an S/D feature (along a direction perpendicular to a lengthwise direction of the S/D feature) to reduce its parasitic capacitance. For example, the cross-sectional area of the S/D feature can be reduced by narrowing a bottom portion of the S/D feature, while maintaining a width of a top portion of the S/D feature for adequate landing of the subsequently formed S/D contact thereon. The taller the bottom portion, the smaller the cross-sectional area of the S/D feature, and therefore the smaller the parasitic capacitance. However, as the height of the bottom portion increases, the resistance of the S/D feature increases due to the decreasing cross-sectional area (the resistance is inversely proportional to the cross-sectional area). It is noted that the taller the bottom portion, the more impact the surface area plays on increasing the resistance, since the current density at the top portion is higher than that at the bottom portion (the resistance is proportional to the current density). Therefore, for an S/D feature with a given height, the height of the bottom portion relative to a height of the top portion of the S/D feature need to be controlled to adjust cross-sectional area, such that the parasitic capacitance is reduced and the resistance remains reasonably low.

Referring to FIG. 19B-1, for a fixed height $h_1$, if the height $h_3$ increases (for example, by adjusting the first etching process 1702), the height $h_2$ of the top portion of the S/D feature 224 would decrease, thereby reducing the cross-sectional area of the S/D feature 224. In other words, increase in the height $h_3$ leads to reduction in the cross-sectional area of the S/D feature 224, and therefore, reduction in the parasitic capacitance. However, if the height $h_3$ is too large, the cross-sectional area of the top portion of the S/D feature 224 may not be large enough to accommodate the forming (or landing) of an S/D contact. In addition, if the height $h_3$ is too large, the cross-sectional area of the top portion of the S/D feature 224, where the current density is higher than the bottom portion, may be too small and may lead to increased resistance of the S/D feature 224. Therefore, the height $h_3$ is selected to be large enough to reduce the parasitic capacitance of the S/D feature, but not too large to significantly increase the resistance of the S/D feature or affect the forming of the S/D contact.

In the present embodiments, the height $h_3$ is about 10 nanometers to about 30 nanometers, and the height $h_2$ is about 15 nanometers to about 45 nanometers. In the present embodiments, the ratio of the height $h_2$ to the height $h_3$ is about 0.5 to about 4.5. In the present embodiments, the forming of the S/D spacer 215 reduces the cross-sectional area of the S/D feature 224. In some embodiments, such reduction is about 8% to about 40% with the insertion of the S/D spacer 215 to reduce the parasitic capacitance without significantly increasing the resistance of the S/D feature 224 or affecting the landing of the S/D contact.

Thereafter, referring to FIGS. 20A-20F, method 100 forms an etch-stop layer (ESL) 240 over the device 200 to protect the underlying components, such as the S/D features 224, during subsequent fabrication processes. The ESL 240 may include any suitable dielectric material, such as SiN, SiCN, other suitable materials, or combinations thereof, and may be formed by CVD, ALD, physical vapor deposition (PVD), other suitable methods, or combinations thereof. In the present embodiments, the ESL 240 provides etching selectivity with respect to its surrounding dielectric components to ensure protection against inadvertent damage to these components.

Subsequently, still referring to FIGS. 20A-20F, method 100 forms an interlayer dielectric (ILD) layer 242 over the ESL 240, thereby filling the space between adjacent dummy gate stacks 220. The ILD layer 242 may include silicon oxide, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate stacks 220.

Figure 21B:
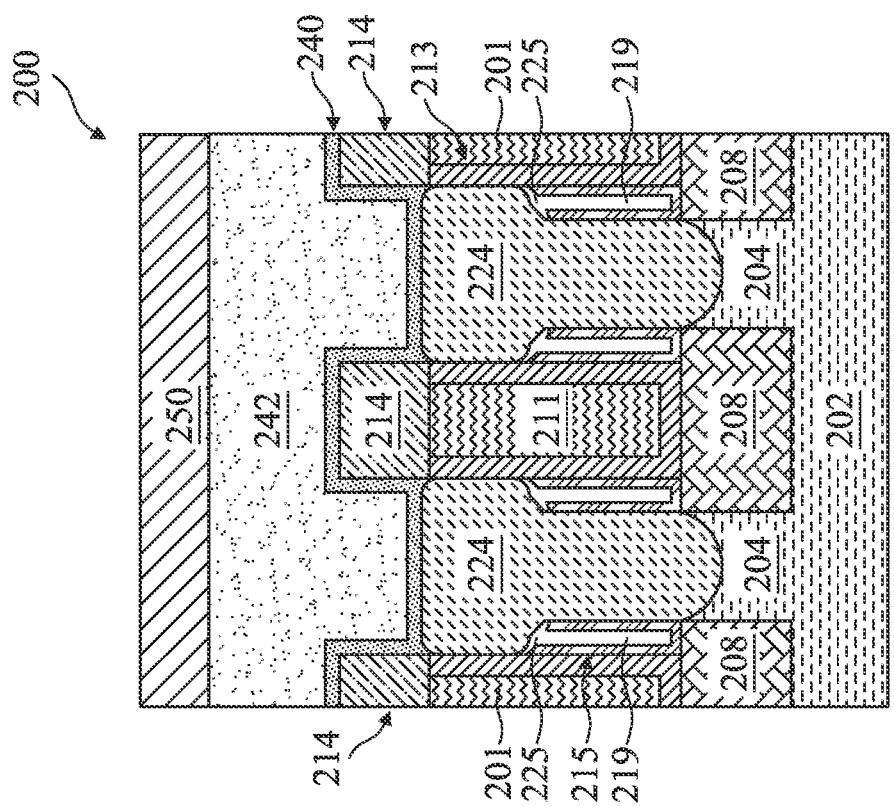
Figure 21A:
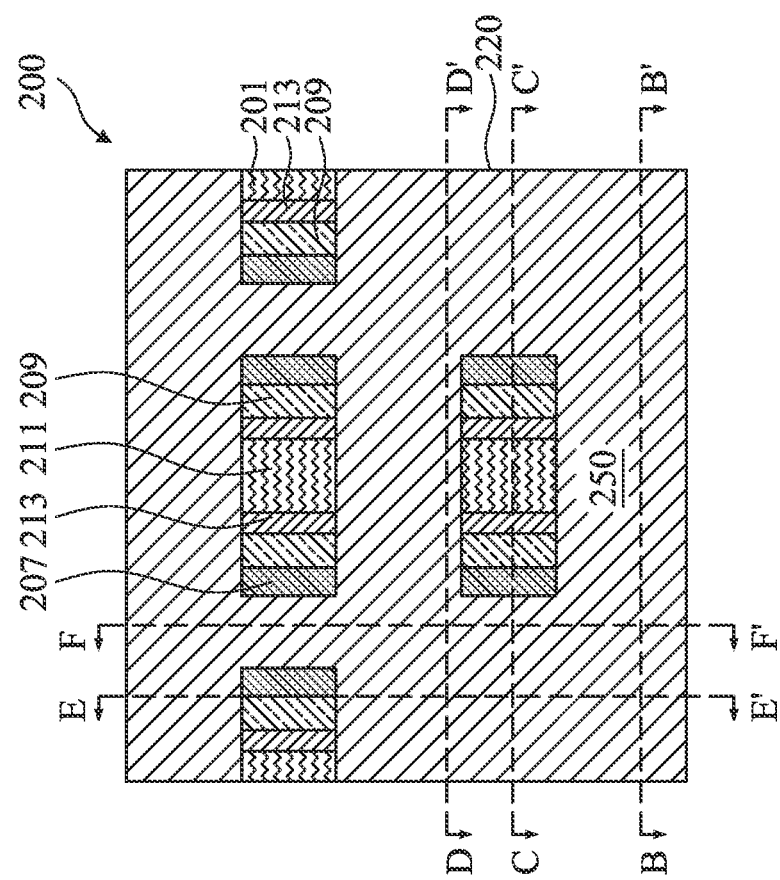
Figure 21C:
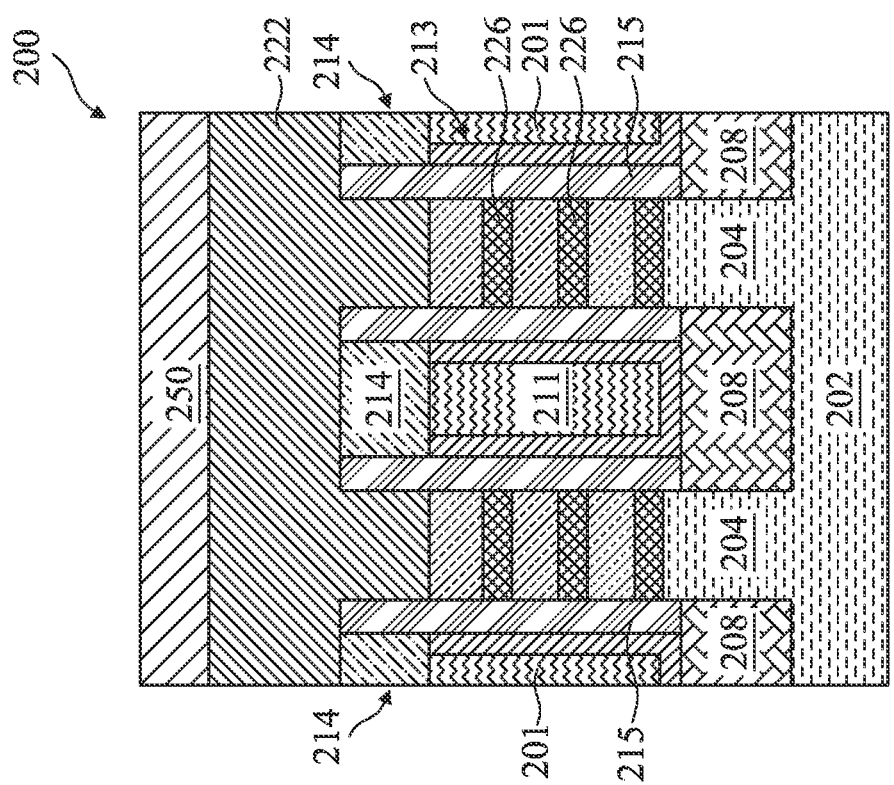
Figure 21D:
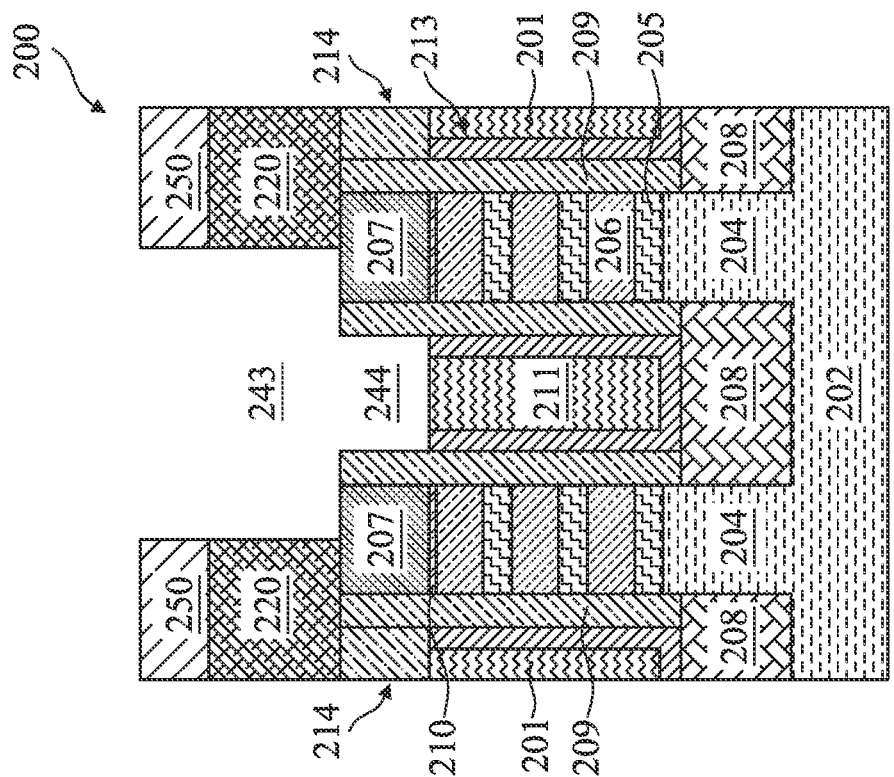

At operation 128, referring to FIGS. 21A to 21F, method 100 patterns the dielectric helmets 214 to form gate isolation features. The patterning of the dielectric helmets 214 includes performing a photolithography process to form a patterned masking element 250 over the dummy gate stacks 220, where portions of the dummy gate stacks 220 over portions of the dielectric helmets 214 to be removed are exposed in openings 243 of the patterned masking element 250. It is noted that the dielectric helmets 214 may have a dimension smaller than the line width limit of the photolithography process. In this regard, each of the openings 243 of the patterned masking element 250 is wider than each of the dielectric helmets 214 to accommodate the dimension of the dielectric helmets 214. The patterning of the dielectric helmets 214 then proceeds to removing the portions of the dummy gate stacks 220 exposed in the openings 243 and thereby extending the openings 243 to expose the portions of the dielectric helmets 214 to be removed. Remaining portions of the dummy gate stacks 220 are subsequently used as a mask for removing the portions of the dielectric helmets 214 exposed in the extended openings 243 to form trench 244. Portions of the cladding layer 209 and portions of the hard mask 207 exposed in the openings 243 remain substantially intact due to their etching selectivity relative to the dielectric helmets 214. The patterned dielectric helmets 214 (e.g., the dielectric helmets 214 as depicted in FIG. 21C) may then serve as the gate isolation features (or gate cut features) in subsequent metal gate formation process. After patterning the dielectric helmets 214, the patterned masking element 250 is removed from the device 200 by any suitable method, such as plasma ashing and/or resist stripping.

Figure 22D:
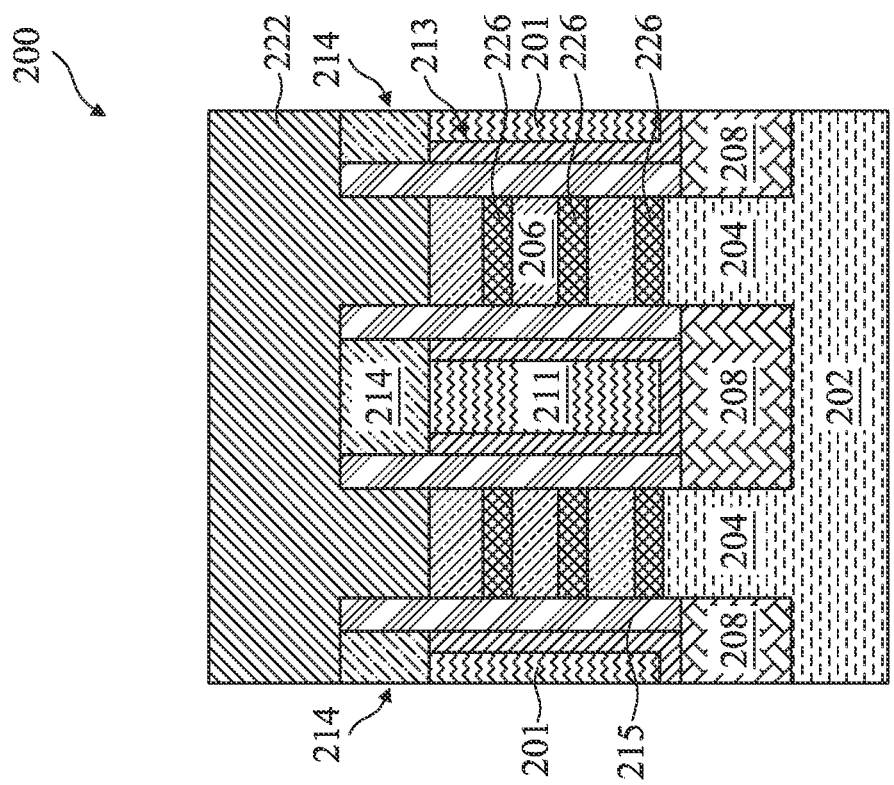
Figure 22C:
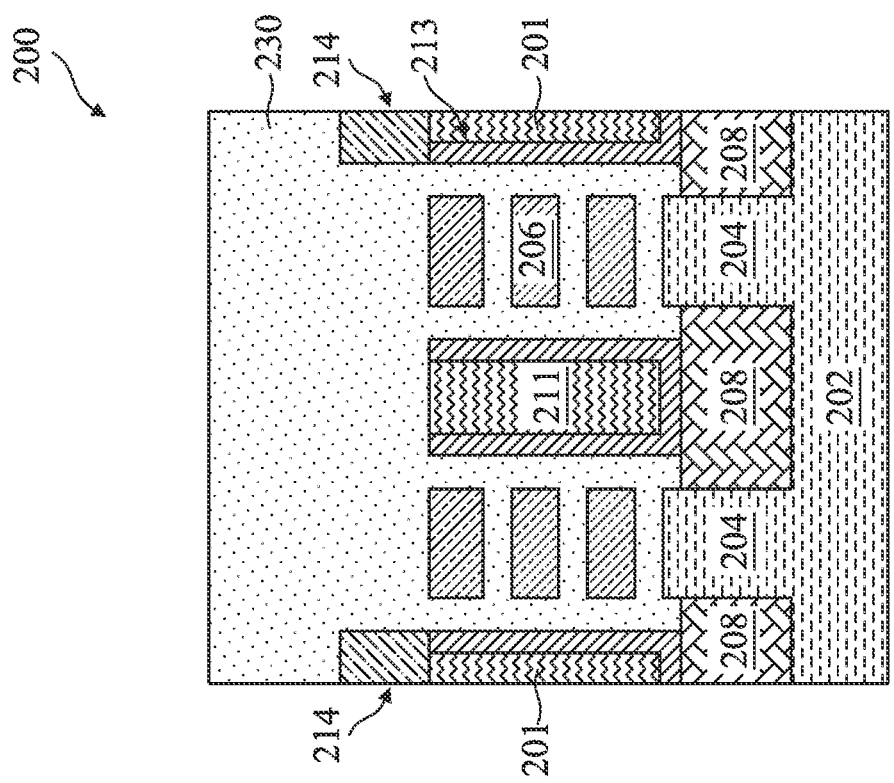
Figure 22F:
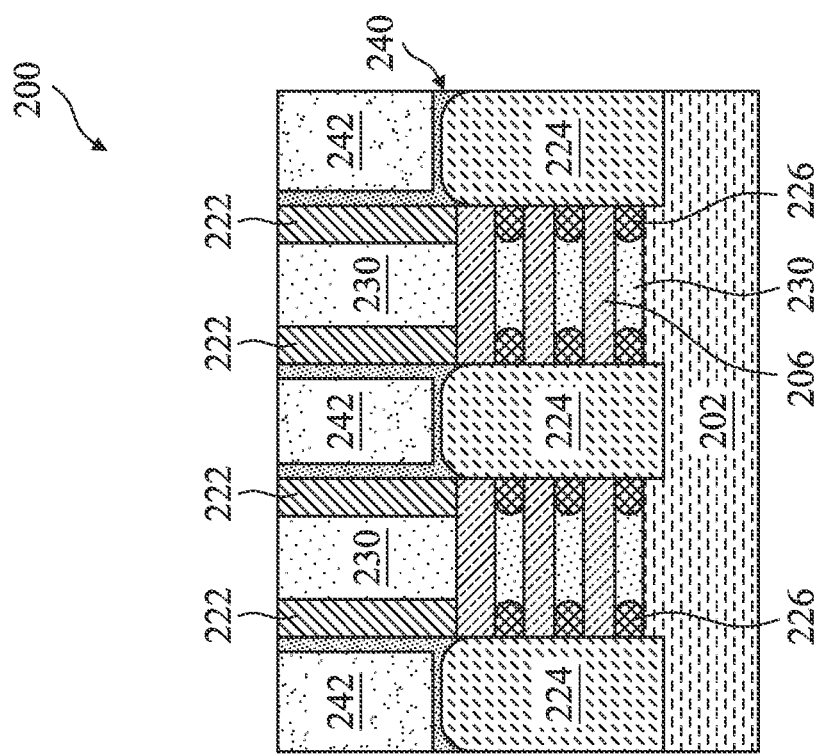
Figure 22E:
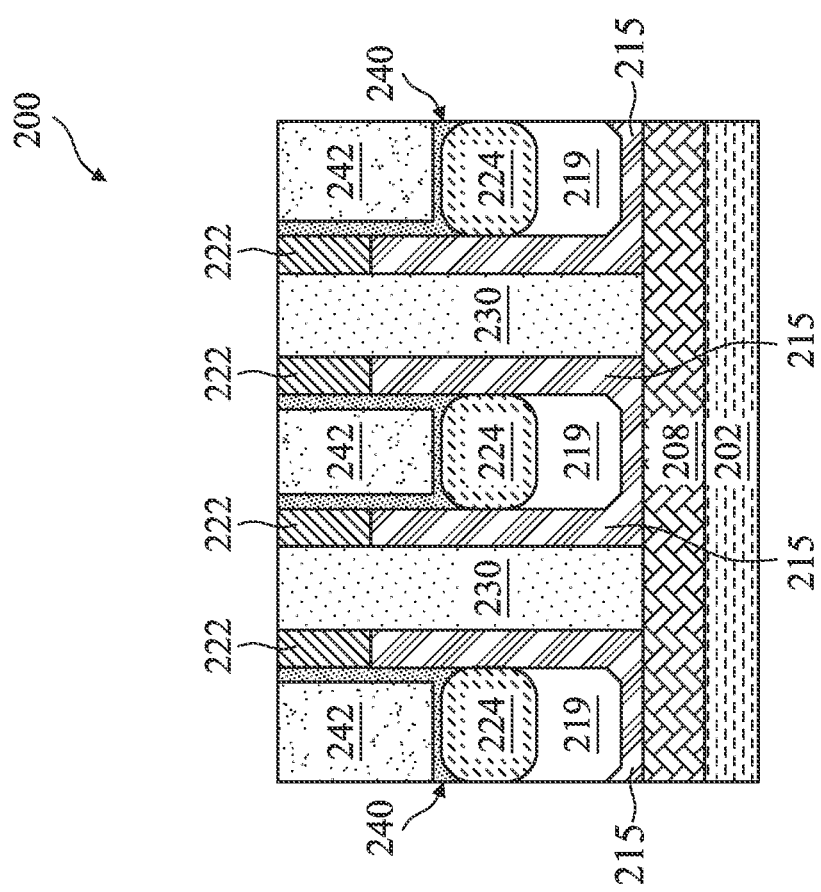

At operation 130, referring to FIGS. 22A and 22F, method 100 replaces the dummy gate stacks 220 and the non-channel layers 205 with metal gate stacks 230, where the metal gate stacks 230 are separated by the patterned dielectric helmets (or gate isolation features) 214. Prior to the operation 130, the remaining hard mask 207 and the oxide layer 210 thereunder are removed in one or more etching processes. The operation 130 includes removing the remaining portions of the dummy gate stacks 220 to form gate trenches (not depicted); removing the non-channel layers 205 from the ML to form openings (not depicted) between the channel layers 206 in a sheet formation, or sheet release, process, where the cladding layer 209 (e.g., having the same elements as the non-channel layers 205 as explained above) on sidewalls of the ML may be removed together with the non-channel layers 205 using an etchant different from that used in the process 1002; and forming metal gate stacks 230 in the gate trenches and the openings, such that each metal gate stack 230 wraps around (or is interleaved with) each channel layer 206 as depicted in FIGS. 22C and 22F.

In the present embodiments, the metal gate stack 230 includes a gate dielectric layer (not depicted separately) and a metal gate electrode (not depicted separately) over the gate dielectric layer. The gate dielectric layer may include a high-k dielectric material, such as $HfO_2$, $La_2O_3$, other suitable materials, or combinations thereof. The metal gate electrode includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The metal gate stack 260 may further include other material layers (not depicted), such as an interfacial layer disposed on surfaces of the channel layers 206, a capping layer, a barrier layer, other suitable layers, or combinations thereof. Various layers of the metal gate stack 260 may be formed by various methods, including ALD, CVD, PVD, plating, other suitable methods, or combinations thereof. After forming the bulk conductive layer, one or more CMP processes are performed to remove excessive material formed on top surface of the ILD layer 242, thereby planarizing the device 200.

Figure 23B:
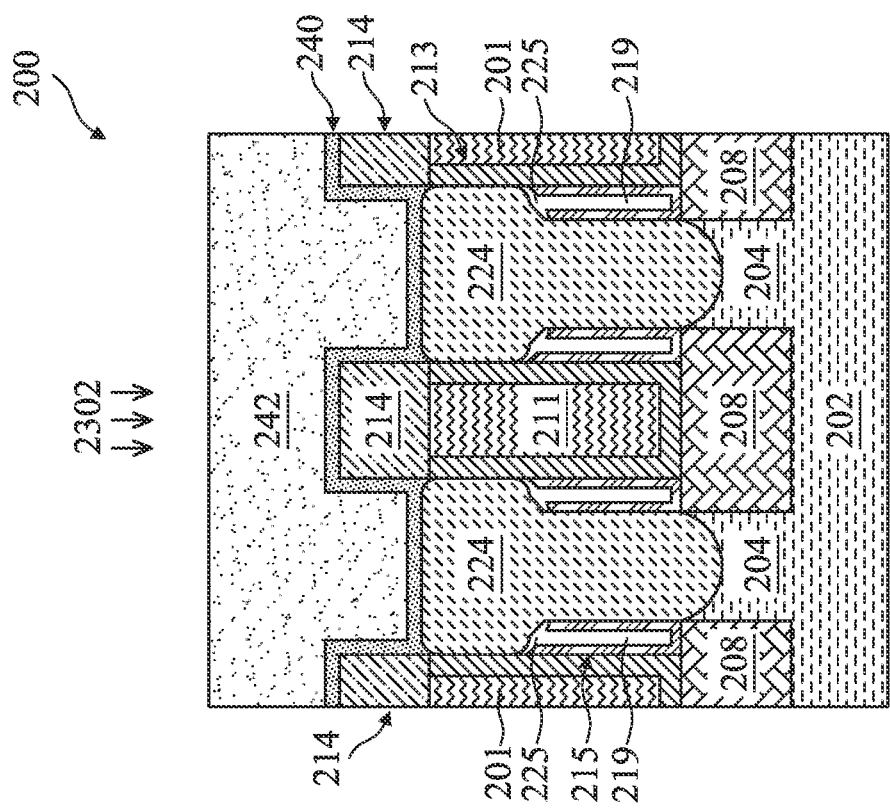
Figure 23A:
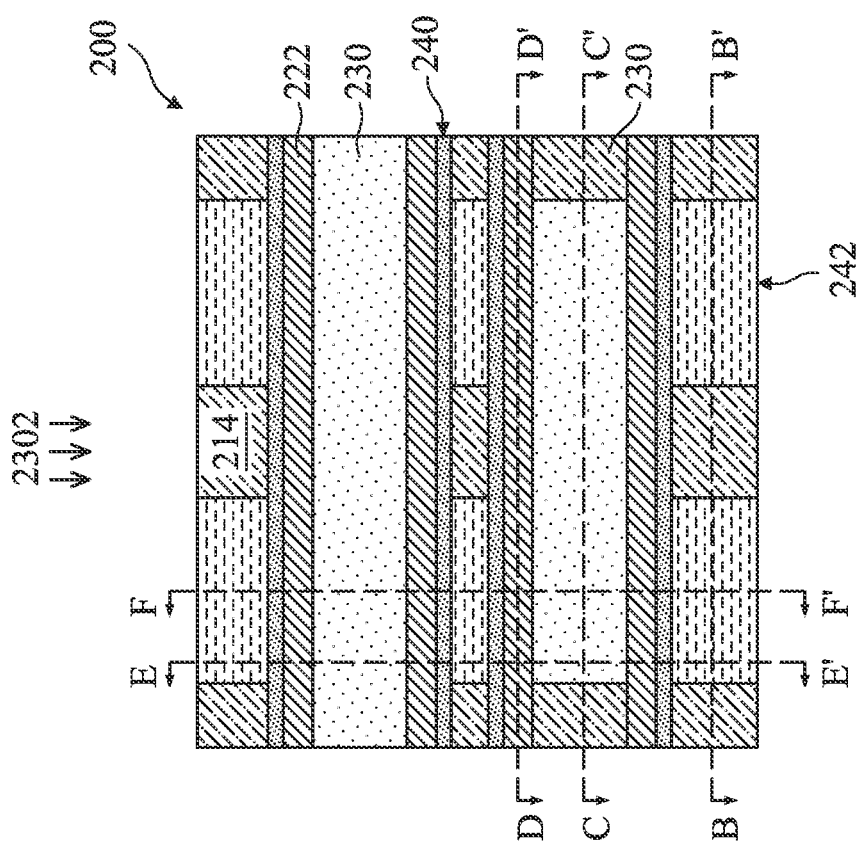
Figure 23D:
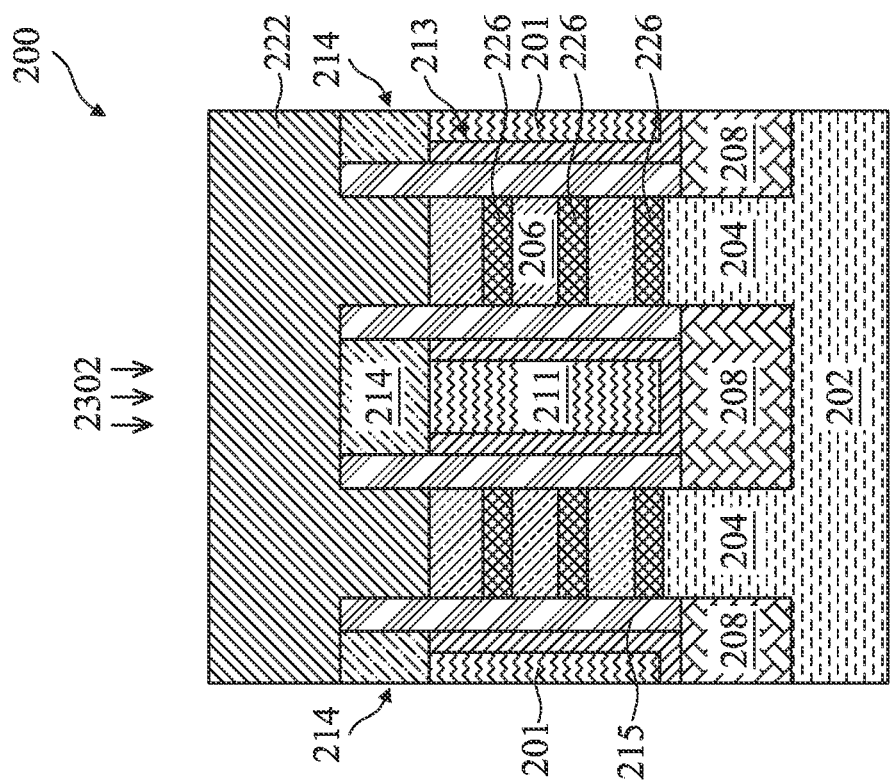
Figure 23C:
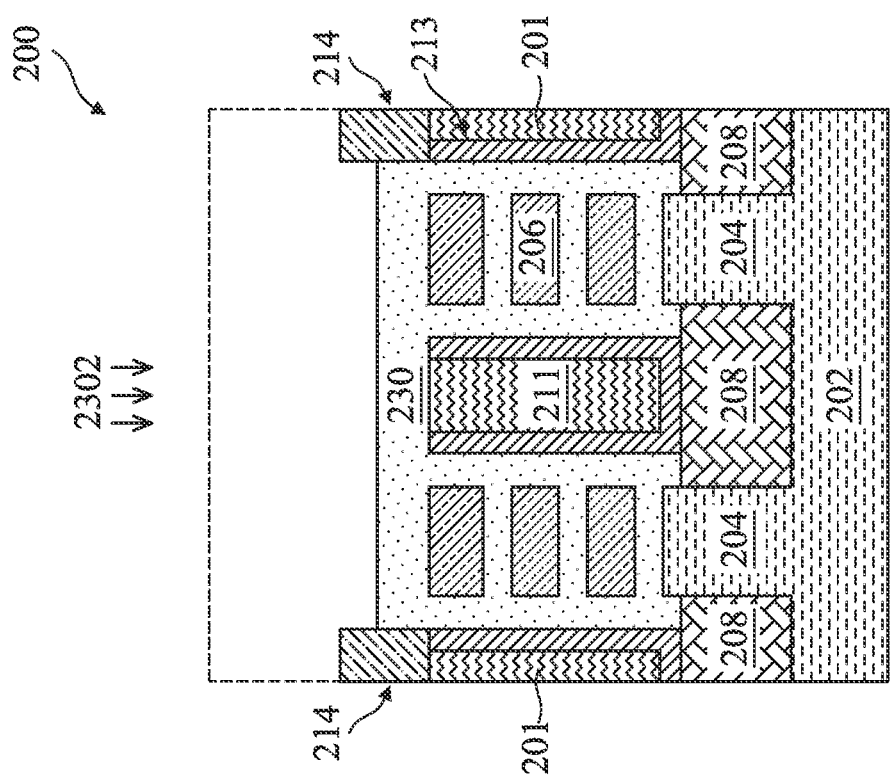
Figure 23F:
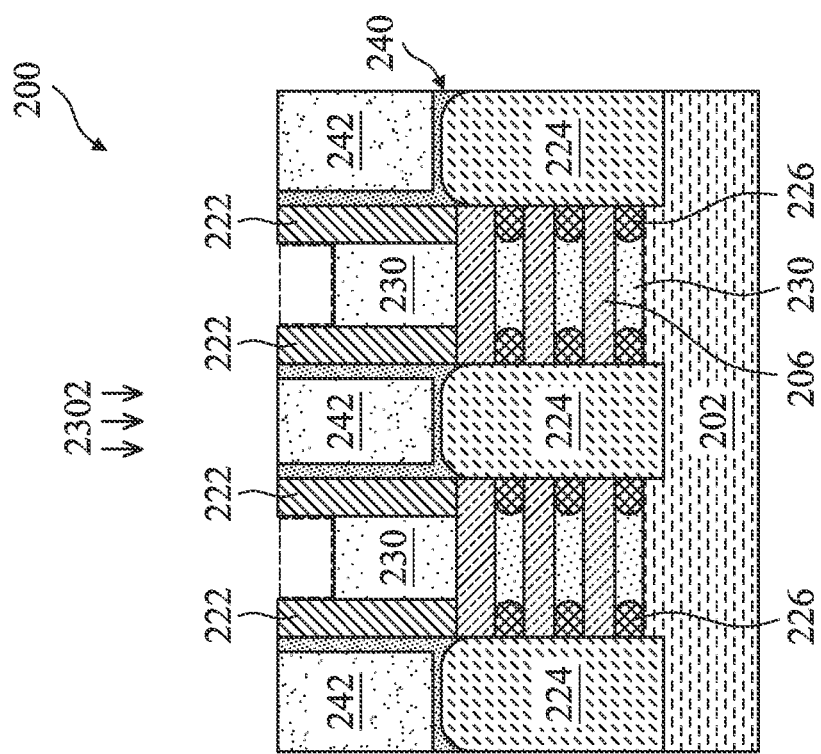
Figure 23E:
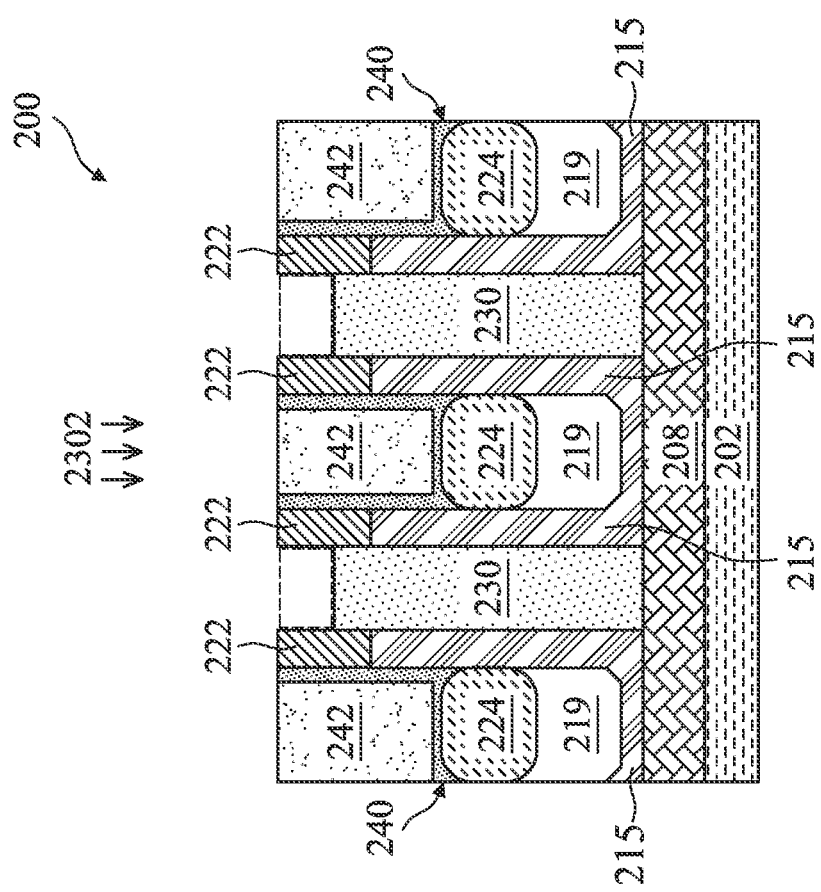
Figure 24B:
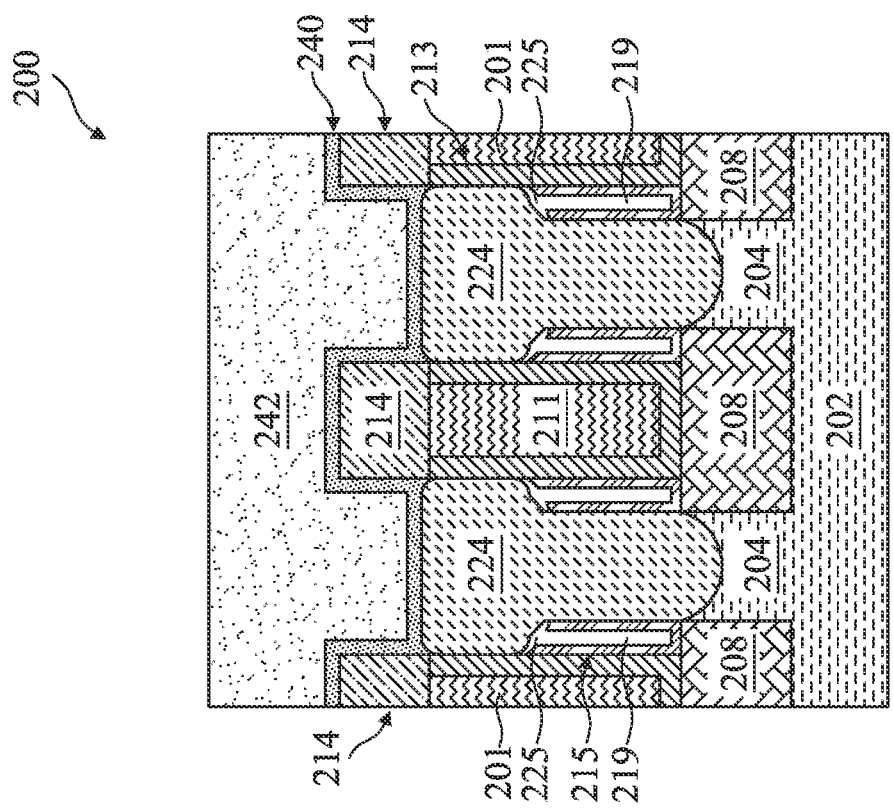
Figure 24A:
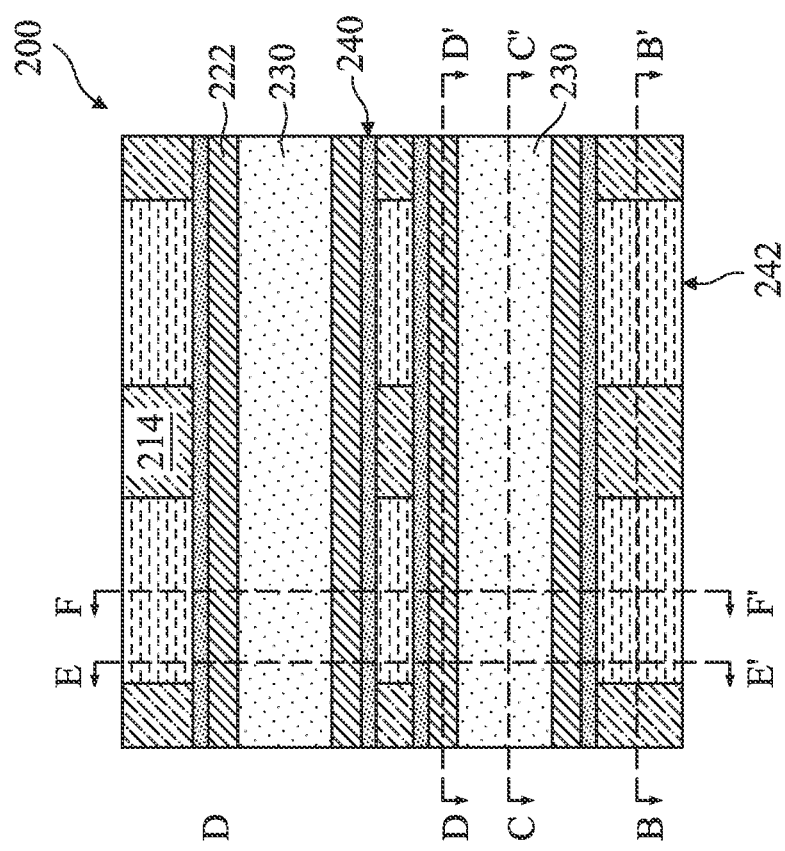
Figure 24D:
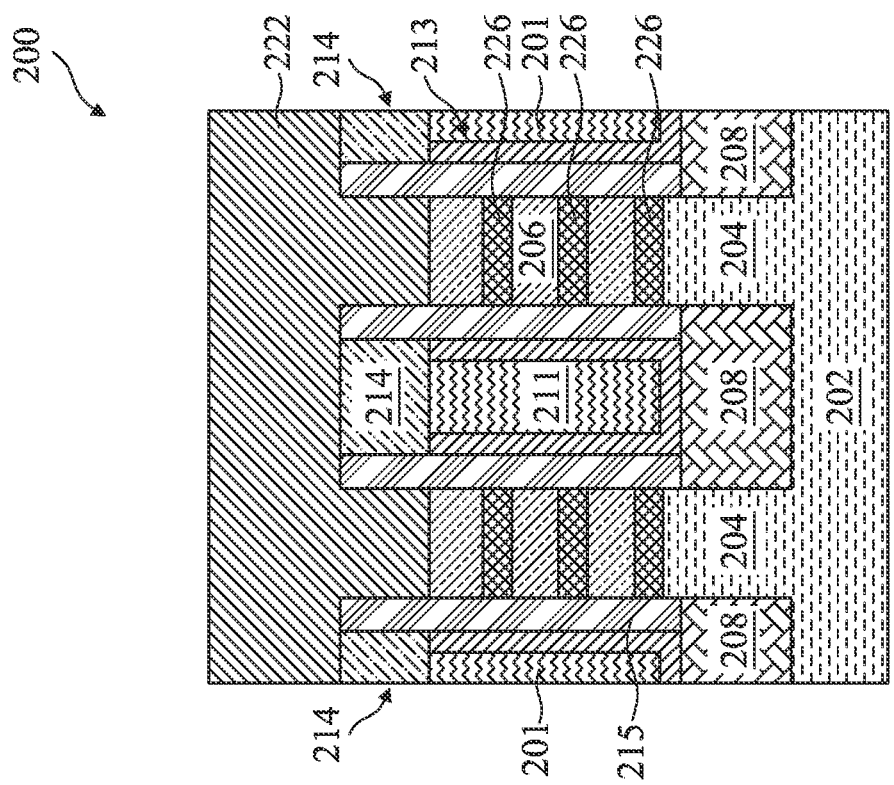
Figure 24C:
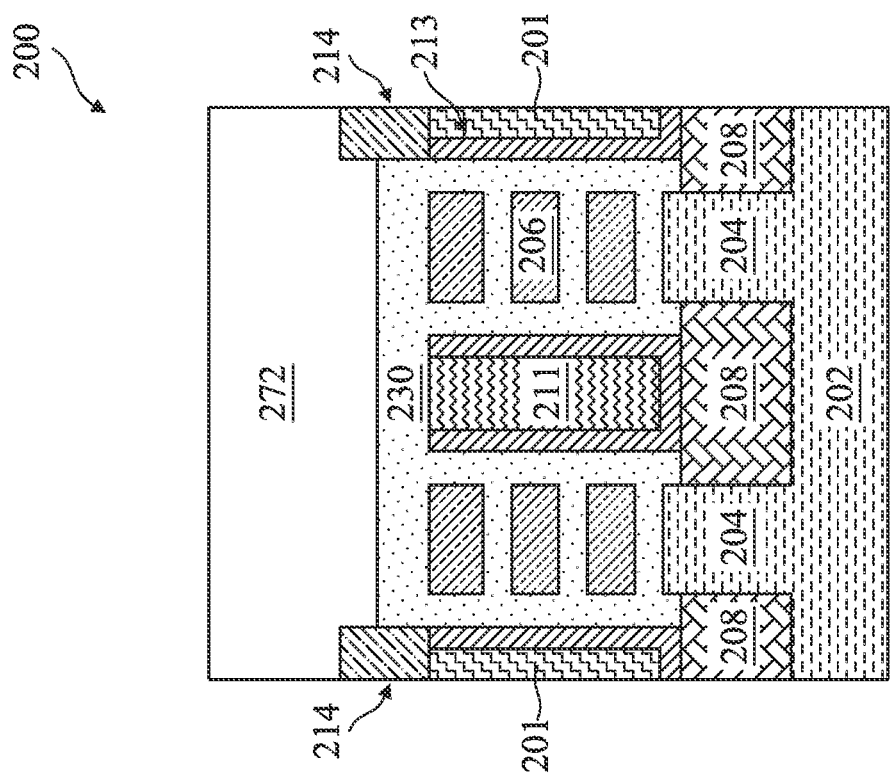
Figure 24F:
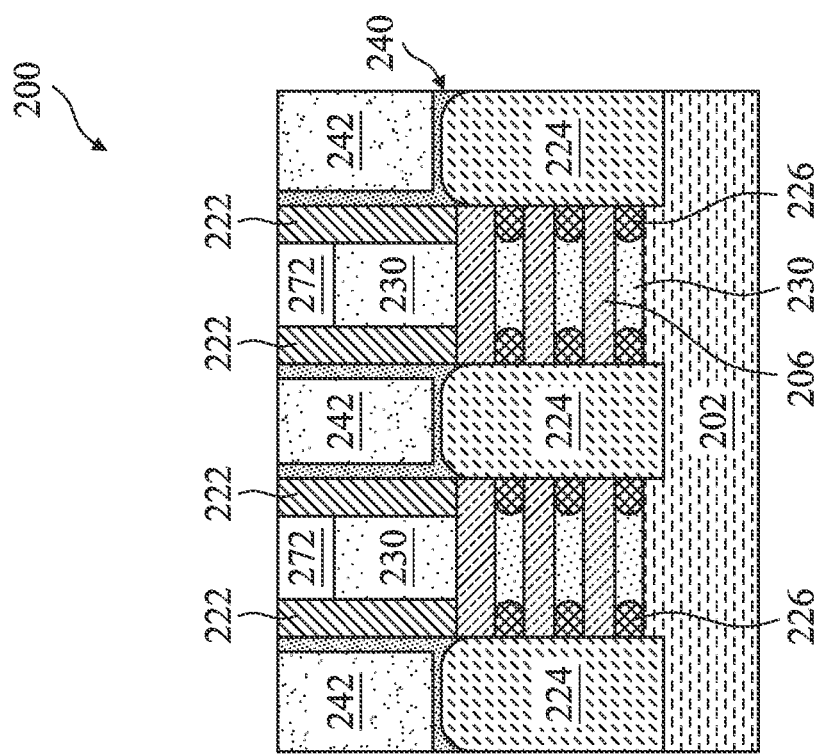
Figure 24E:
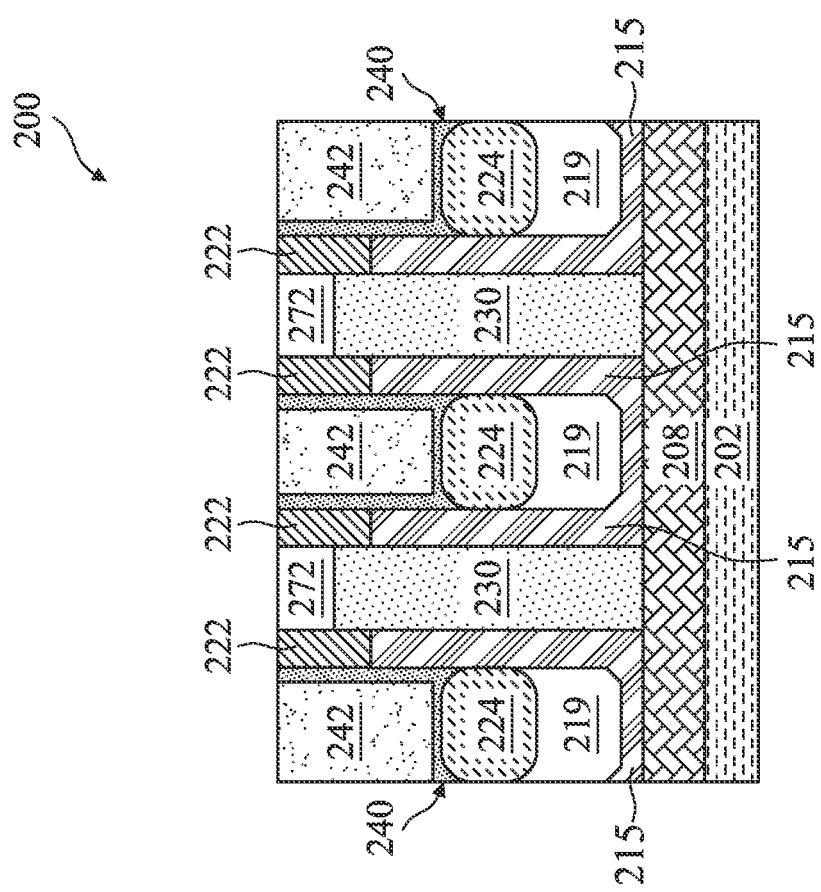
Figure 25B:
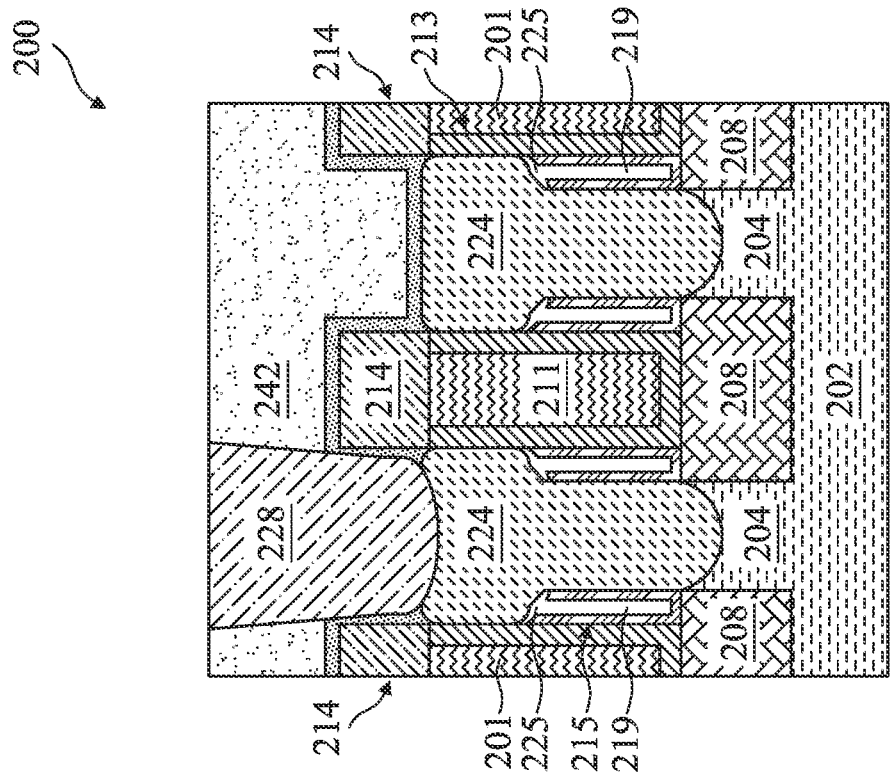
Figure 25A:
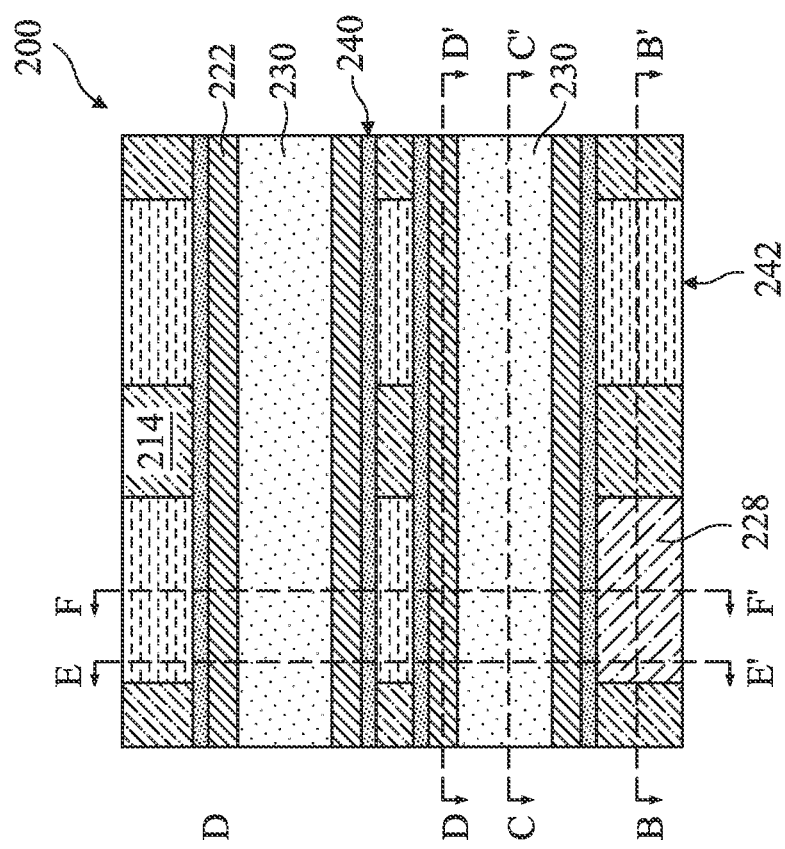
Figure 25D:
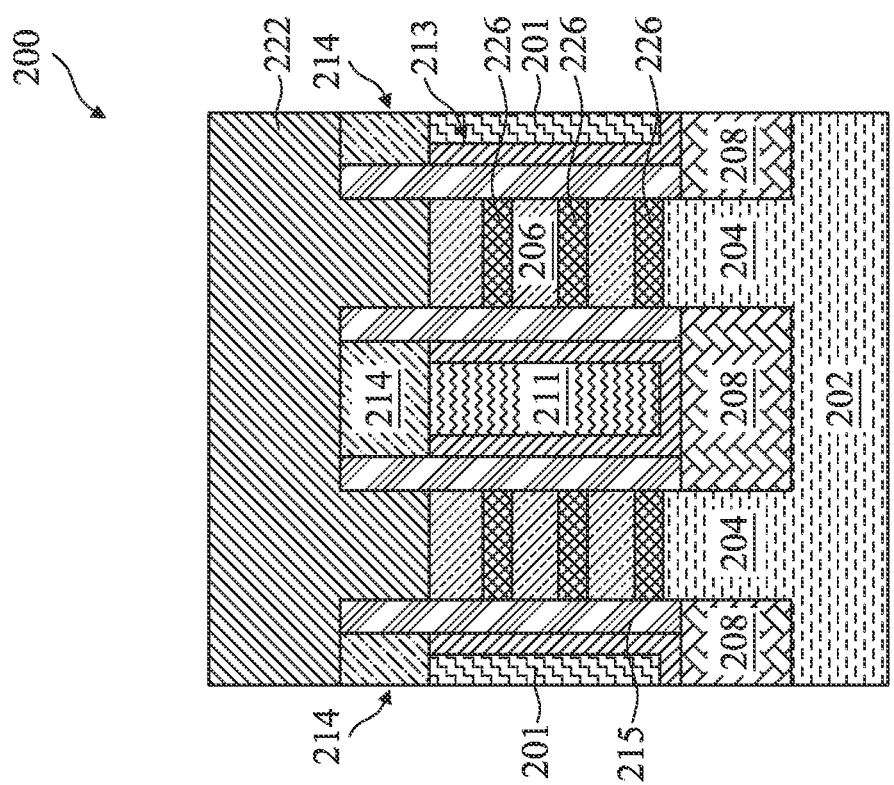
Figure 25C:
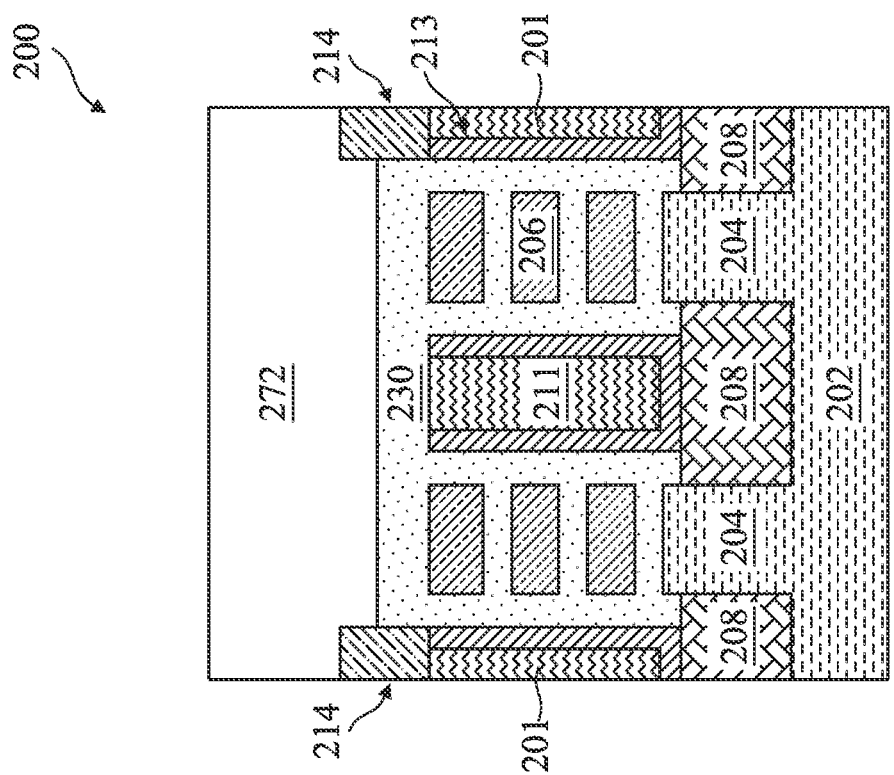
Figure 25F:
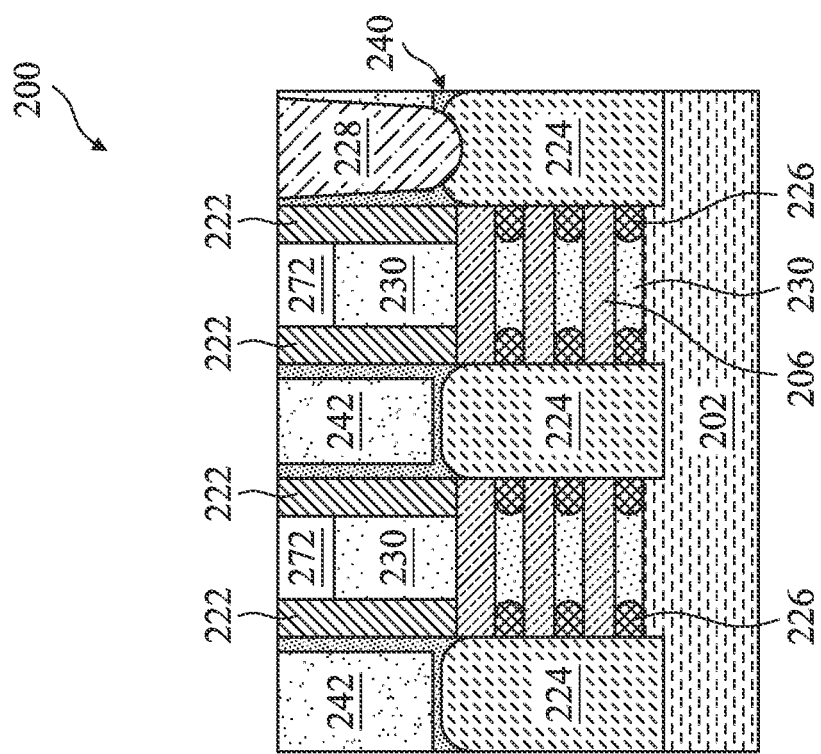
Figure 25E:
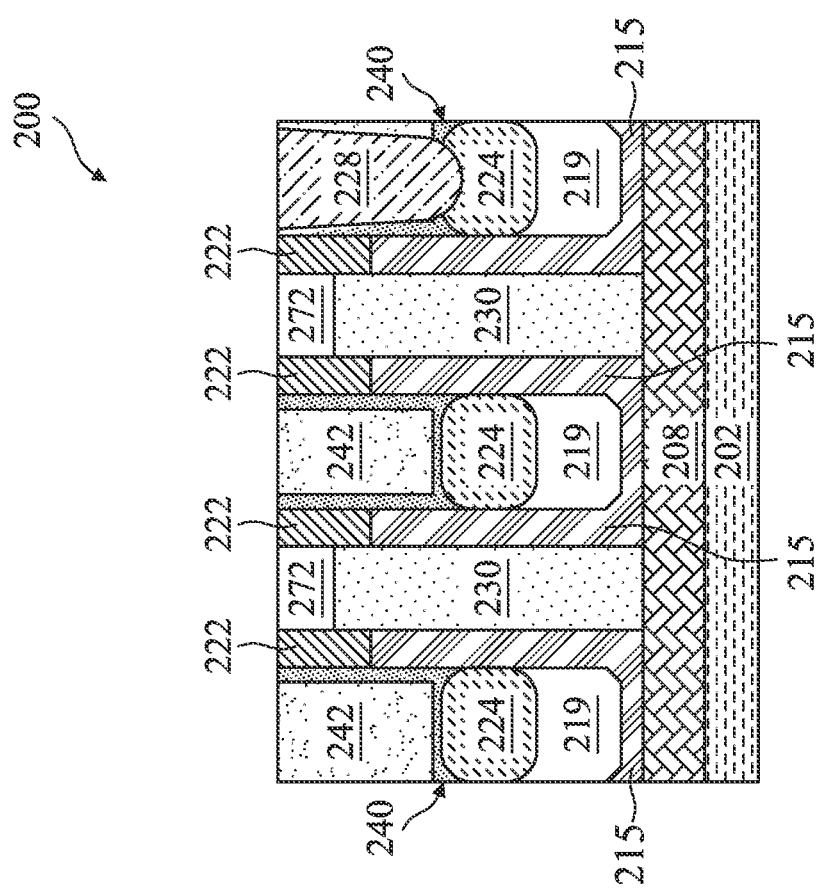

Thereafter, referring to FIG. 23A to 23F, method 100 recesses the metal gate stack 230 in an etching process 2302, such that a top surface of the recessed metal gate stack 230 is below a top surface of the remaining dielectric helmets 214. The dotted profile outlines the portions of the metal gate stacks 230 that are recessed in the etching process 2302. The remaining dielectric helmets 214 (e.g., the dielectric helmets 214 in FIG. 23C) truncate (or separate) the recessed metal gate stacks 230 into suitable lengths as depicted in FIGS. 23A and 23C. In some embodiments, the etching process includes any suitable method, such as ALD, CVD, PVD, other suitable methods, or combinations thereof. Thereafter, referring to FIGS. 24A-24F, method 100 at operation 132 forms a dielectric layer 272 over device 200, thereby filling the gaps between the top gate spacers 222. In some embodiments, the dielectric layer 272 is configured to provide etching selectivity during subsequent fabrication processes including, for example, patterning the ILD layer 242 to form S/D contact openings over the S/D features 224. Accordingly, the dielectric layer 272 has a composition different from that of the ILD layer 242. In some embodiments, the dielectric layer 272 includes SiN, SiCN, SiOC, SiON, SiOCN, other suitable materials, or combinations thereof. The dielectric layer 272 may be deposited by any suitable method, such as ALD, CVD, PVD, other suitable methods, or combinations thereof. Subsequently, method 100 removes portions of the dielectric layer 272 formed over the ILD layer 242 in one or more CMP process, thereby planarizing the top surface of the device 200.

Thereafter, referring to FIGS. 25A-25F, method 100 at operation 132 performs additional processing steps to the device 200. For example, method 100 may form S/D contact 228 over the S/D features 224. Each S/D contact 228 may include any suitable conductive material, such as Co, W, Ru, Cu, Al, Ti, Ni, Au, Pt, Pd, and/or other suitable conductive materials. Method 100 may form an S/D contact opening (or trench) in the ILD layer 242 via a series of patterning and etching processes and subsequently deposit a conductive material in the S/D contact opening using any suitable method, such as CVD, ALD, PVD, plating, and/or other suitable processes. In some embodiments, a silicide layer (not depicted) is formed between the S/D features 224 and the S/D contact 228. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the S/D feature 224 by a series of deposition, thermal, and etching processes. In the present embodiments, a bottom portion of the S/D contact 228 penetrate into the top portion of the S/D features 224.

The additional fabrication process 132 to device 200 may also include forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as an S/D contact (not depicted) or a gate contact (not depicted), with a conductive line, or interconnect different conductive lines, which are horizontal interconnect features. The ESLs and the ILD layers of the MLI may have substantially the same compositions as those discussed above with respect to the ESL 240 and the ILD layer 242, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, the present disclosure provides a S/D spacer, and methods of forming the same, disposed along sidewalls of the S/D feature and configured to reduce the cross-sectional area of the S/D feature, such that the parasitic capacitance of the S/D features are reduced without substantially affecting other aspects of the device (e.g., without increasing the resistance of the S/D features). The S/D spacer includes an air gap which further reduces its dielectric constant, thereby further reducing the parasitic capacitance. Embodiments of the disclosed methods can be readily integrated into existing processes and technologies for manufacturing NS FETs, FinFETs, and/or other suitable devices.

In one aspect, the present disclosure provides a semiconductor structure that includes a semiconductor fin protruding from a substrate, a dielectric fin disposed adjacent and substantially parallel to the semiconductor fin, an epitaxial S/D feature disposed in the semiconductor fin, a dielectric layer disposed between a sidewall of the epitaxial S/D feature and a sidewall of the dielectric fin, and an air gap disposed in the dielectric layer.

In another aspect, the present disclosure provides a semiconductor structure that includes a semiconductor substrate, a first dielectric fin disposed over the semiconductor substrate and having a first sidewall, a second dielectric fin disposed over the semiconductor substrate and having a second sidewall facing the first sidewall, a first spacer disposed over the first sidewall, a second spacer disposed over the second sidewall, an air gap disposed within each of the first spacer and the second spacer, and an epitaxial S/D feature disposed in a semiconductor fin protruding from the semiconductor substrate, where a top portion of the epitaxial S/D feature fills in a gap between the first sidewall and the second sidewall, and where a bottom portion of the epitaxial S/D feature fills in the gap between the first spacer and the second spacer.

In yet another aspect, the present disclosure provides a method includes forming a fin protruding from a substrate, forming cladding layers on sidewalls of the fin, forming isolation features over the substrate along sidewalls of the cladding layers, forming a dummy gate stack over the fin and the isolation features, removing portions of the cladding layers to form trenches, forming a spacer layer in each of the trenches, forming a sacrificial layer over the spacer layer, where the sacrificial layer includes a material different from that of the spacer layer, forming an S/D recess in the fin adjacent to the spacer layer, performing a first etching process to recess both the spacer layer and the sacrificial layer, performing a second etching process to selectively recess the sacrificial layer with respect to the spacer layer, thereby forming an air gap within the spacer layer, forming an S/D feature in the S/D recess over the air gap, and replacing the dummy gate stack with a metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor fin protruding from a substrate;
a dielectric fin disposed adjacent and substantially parallel to the semiconductor fin;
an epitaxial source/drain (S/D) feature disposed in the semiconductor fin;
a dielectric layer disposed between a sidewall of the epitaxial S/D feature and a sidewall of the dielectric fin; and
an air gap disposed in the dielectric layer, the air gap vertically spanning from a bottom portion of the dielectric layer to a bottom surface of the epitaxial S/D feature,
wherein the air gap is a first air gap, wherein the semiconductor structure further comprises a second air gap over the first air gap, and wherein the second air gap is defined by the epitaxial S/D feature, the dielectric fin and the dielectric layer.

2. The semiconductor structure of claim 1, wherein a cross-sectional area of the epitaxial S/D feature decreases with an increase of a height of the air gap.

3. The semiconductor structure of claim 1, wherein the dielectric layer is defined by a U-shape with the air gap disposed between sidewalls of the U-shape.

4. The semiconductor structure of claim 3, wherein a width of the air gap is about the same as a thickness of one of the sidewalls of the dielectric layer.

5. The semiconductor structure of claim 1, wherein the epitaxial S/D feature seals the air gap.

6. The semiconductor structure of claim 1, further comprising:
a metal gate stack over the semiconductor fin and adjacent to the epitaxial S/D feature; and
a gate spacer over a sidewall of the metal gate stack, wherein a portion of the dielectric layer is disposed under the gate spacer, and wherein the portion of the dielectric layer is free of the air gap.

7. The semiconductor structure of claim 1, wherein the bottom portion of the dielectric layer has a surface exposed in the air gap.

8. A semiconductor structure, comprising:
a semiconductor substrate;
a first dielectric fin disposed over the semiconductor substrate and having a first sidewall;
a second dielectric fin disposed over the semiconductor substrate and having a second sidewall facing the first sidewall;
a first spacer disposed over the first sidewall;
a second spacer disposed over the second sidewall;
an air gap disposed within each of the first spacer and the second spacer; and
an epitaxial source/drain (S/D) feature disposed in a semiconductor fin protruding from the semiconductor substrate, wherein a top portion of the epitaxial S/D feature directly interfaces the first sidewall and the second sidewall, and wherein a bottom portion of the epitaxial S/D feature directly interfaces the first spacer and the second spacer, and wherein the top portion is wider than the bottom portion.

9. The semiconductor structure of claim 8, wherein the top portion of the epitaxial S/D feature extends over and is separated from the air gap.

10. The semiconductor structure of claim 8, wherein a height of the air gap defines a height of the bottom portion of the epitaxial S/D feature.

11. The semiconductor structure of claim 8, wherein the air gap is a first air gap, the semiconductor structure further comprising a second air gap over the first air gap, and wherein the second air gap is defined by the first dielectric fin, the first spacer, and the epitaxial S/D feature.

12. The semiconductor structure of claim 8, further comprising a metal gate stack over the semiconductor fin, the first dielectric fin and the second dielectric fin, wherein the metal gate stack is separated by at least one of the first dielectric fin or the second dielectric fin.

13. The semiconductor structure of claim 8, wherein the first spacer and the second spacer are each U-shaped with the air gap disposed between sidewalls of the U-shape.

14. The semiconductor structure of claim 8, wherein the top portion of the epitaxial S/D feature spans between the first sidewall and the second sidewall, and the bottom portion of the epitaxial S/D feature spans between the first spacer and the second spacer.

15. A semiconductor structure, comprising:
a substrate;
an isolation feature over the substrate;
a semiconductor fin protruding from the substrate and sandwiched between portions of the isolation feature, the semiconductor fin extending along a lengthwise direction;
a dielectric fin disposed directly on the isolation feature and disposed adjacent to the semiconductor fin, the dielectric fin extending along the lengthwise direction;
an epitaxial source/drain (S/D) feature disposed on top of the semiconductor fin, the epitaxial S/D feature having a wider portion and a narrower portion; and
a U-shaped spacer feature disposed laterally between a sidewall of the narrower portion of the epitaxial S/D feature and a sidewall of the dielectric fin,
wherein an air gap is defined by surfaces of the U-shaped spacer feature and a bottom exposed surface of the epitaxial S/D feature.

16. The semiconductor structure of claim 15, wherein the dielectric fin further comprises a lining layer and a filling layer, and the lining layer defines the sidewall of the dielectric fin.

17. The semiconductor structure of claim 16, wherein the lining layer is in direct contact with the epitaxial S/D feature and the U-shaped spacer feature.

18. The semiconductor structure of claim 15, wherein the U-shaped spacer feature has a first sidewall and a second sidewall, and the first sidewall has a greater height than the second sidewall along a vertical direction.

19. The semiconductor structure of claim 18, wherein a lower portion of the epitaxial S/D feature is in direct contact with the second sidewall, and an upper portion of the epitaxial S/D feature includes the bottom exposed surface.

20. The semiconductor structure of claim 19, wherein the upper portion has a greater width than the lower portion along a widthwise direction perpendicular to the lengthwise direction.

* * * * *